(12) United States Patent
Bemanian et al.

(10) Patent No.: US 9,035,443 B2
(45) Date of Patent: **\*May 19, 2015**

(54) MASSIVELY PARALLEL INTERCONNECT FABRIC FOR COMPLEX SEMICONDUCTOR DEVICES

(76) Inventors: Majid Bemanian, Pleasanton, CA (US); Farhang Yazdani, Bellevue, WA (US)

( \* ) Notice: Subject to any disclaimer, the term of this patent is extended or adjusted under 35 U.S.C. 154(b) by 263 days.

This patent is subject to a terminal disclaimer.

(21) Appl. No.: 13/304,681

(22) Filed: Nov. 27, 2011

(65) Prior Publication Data

US 2012/0068229 A1 Mar. 22, 2012

Related U.S. Application Data

(63) Continuation-in-part of application No. 12/436,235, filed on May 6, 2009, now Pat. No. 8,390,035.

(51) Int. Cl.
| | |
|---|---|
| H01L 23/02 | (2006.01) |
| H01L 25/065 | (2006.01) |
| H01L 25/18 | (2006.01) |
| G11C 5/04 | (2006.01) |
| H01L 23/31 | (2006.01) |
| H01L 23/525 | (2006.01) |
| H01L 25/10 | (2006.01) |

(52) U.S. Cl.
CPC ......... *H01L 25/0652* (2013.01); *H01L 23/3121* (2013.01); *H01L 23/525* (2013.01); *H01L 25/0655* (2013.01); *H01L 25/0657* (2013.01); *H01L 25/105* (2013.01); *H01L 25/18* (2013.01); *H01L 2223/6677* (2013.01); *H01L 2224/0401* (2013.01); *H01L 2224/0612* (2013.01); *H01L 2224/06135* (2013.01); *H01L 2224/0615* (2013.01); *H01L 2224/1403* (2013.01); *H01L 2224/16145* (2013.01); *H01L 2224/16225* (2013.01); *H01L 2224/48145* (2013.01); *H01L 2225/06513* (2013.01); *H01L 2225/06517* (2013.01); *H01L 2225/0652* (2013.01); *H01L 2225/06527* (2013.01); *H01L 2225/06541* (2013.01); *H01L 2225/06548* (2013.01); *H01L 2225/06572* (2013.01); *H01L 2225/06589* (2013.01); *H01L 2924/1433* (2013.01); *H01L 2924/15151* (2013.01); *H01L 2924/15153* (2013.01); *H01L 2924/15311* (2013.01); *H01L 2924/19041* (2013.01); *H01L 2924/19042* (2013.01); *H01L 2924/19043* (2013.01); *H01L 2924/19101* (2013.01); *H01L 2924/01019* (2013.01); *H01L 2924/01087* (2013.01); *G11C 5/04* (2013.01); *H01L 2924/30107* (2013.01)

(58) Field of Classification Search
USPC ......... 257/686–778, 111; 326/38; 324/754.07
See application file for complete search history.

(56) References Cited

U.S. PATENT DOCUMENTS

| | | | | |
|---|---|---|---|---|
| 5,493,133 | A * | 2/1996 | Duvvury et al. | 257/111 |
| 6,452,259 | B2 * | 9/2002 | Akiyama | 257/686 |
| 7,129,584 | B2 * | 10/2006 | Lee | 257/778 |

(Continued)

*Primary Examiner* — Eugene Lee
*Assistant Examiner* — Fang-Xing Jiang
(74) *Attorney, Agent, or Firm* — Maxvalueip LLC

(57) ABSTRACT

An embodiment of this invention uses a massive parallel interconnect fabric (MPIF) at the flipped interface of a core die substrate (having the core logic blocks) and a context die (used for in circuit programming/context/customization of the core die substrate), to produce ASIC-like density and FPGA-like flexibility/programmability, while reducing the time and cost for development and going from prototyping to production, reducing cost per die, reducing or eliminating NRE, and increasing performance. Other embodiments of this invention enable debugging complex SoC through large contact points provided through the MPIF, provide for multi-platform functionality, and enable incorporating FGPA core in ASIC platform through the MPIF. Various examples are also given for different implementations.

19 Claims, 68 Drawing Sheets

(56) References Cited

U.S. PATENT DOCUMENTS

| | | | |
|---|---|---|---|
| 2002/0079568 A1* | 6/2002 | Degani et al. | 257/686 |
| 2005/0184399 A1* | 8/2005 | Damberg et al. | 257/777 |
| 2008/0309370 A1* | 12/2008 | Spangaro | 326/38 |
| 2011/0012633 A1* | 1/2011 | Rahman et al. | 324/754.07 |

* cited by examiner

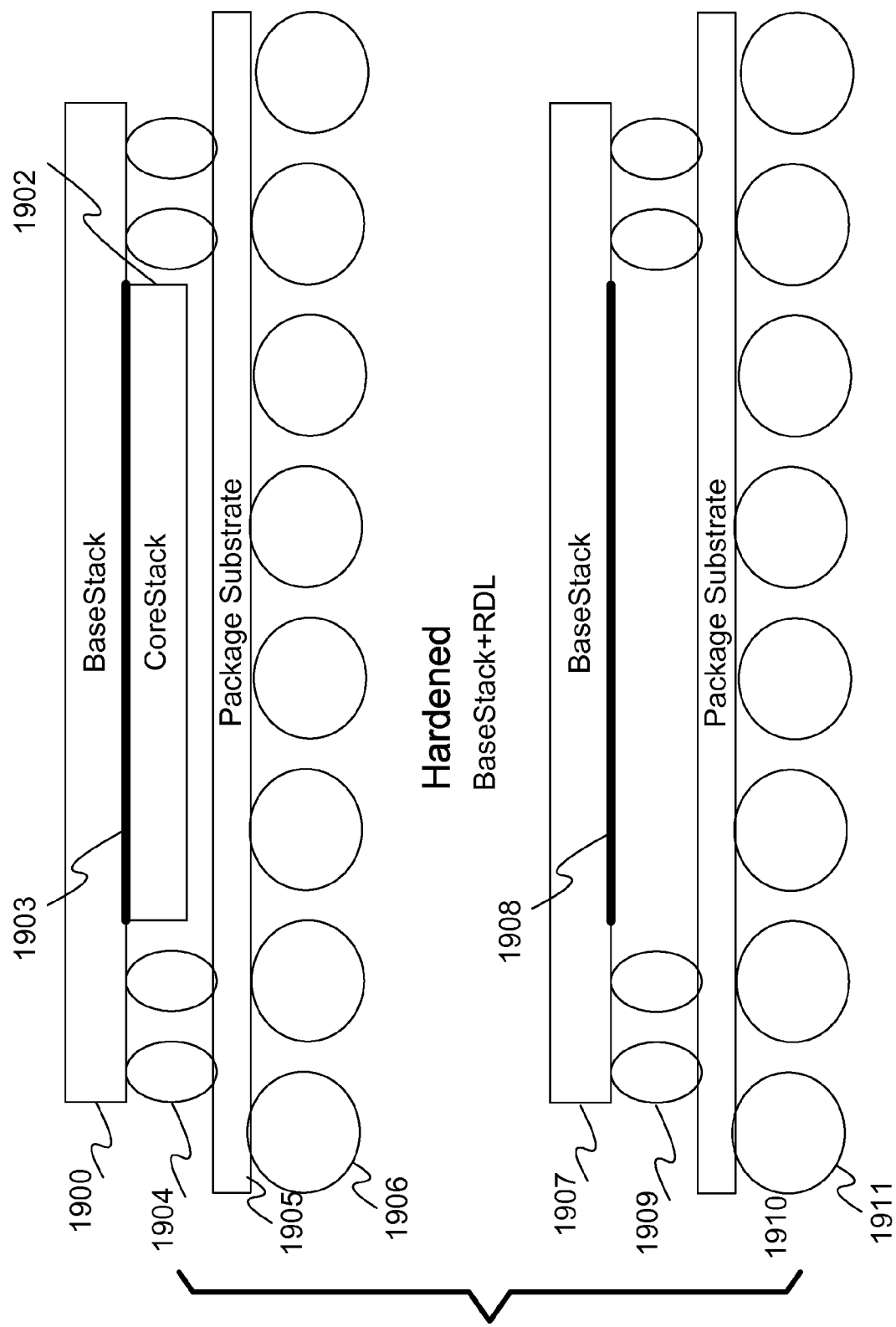

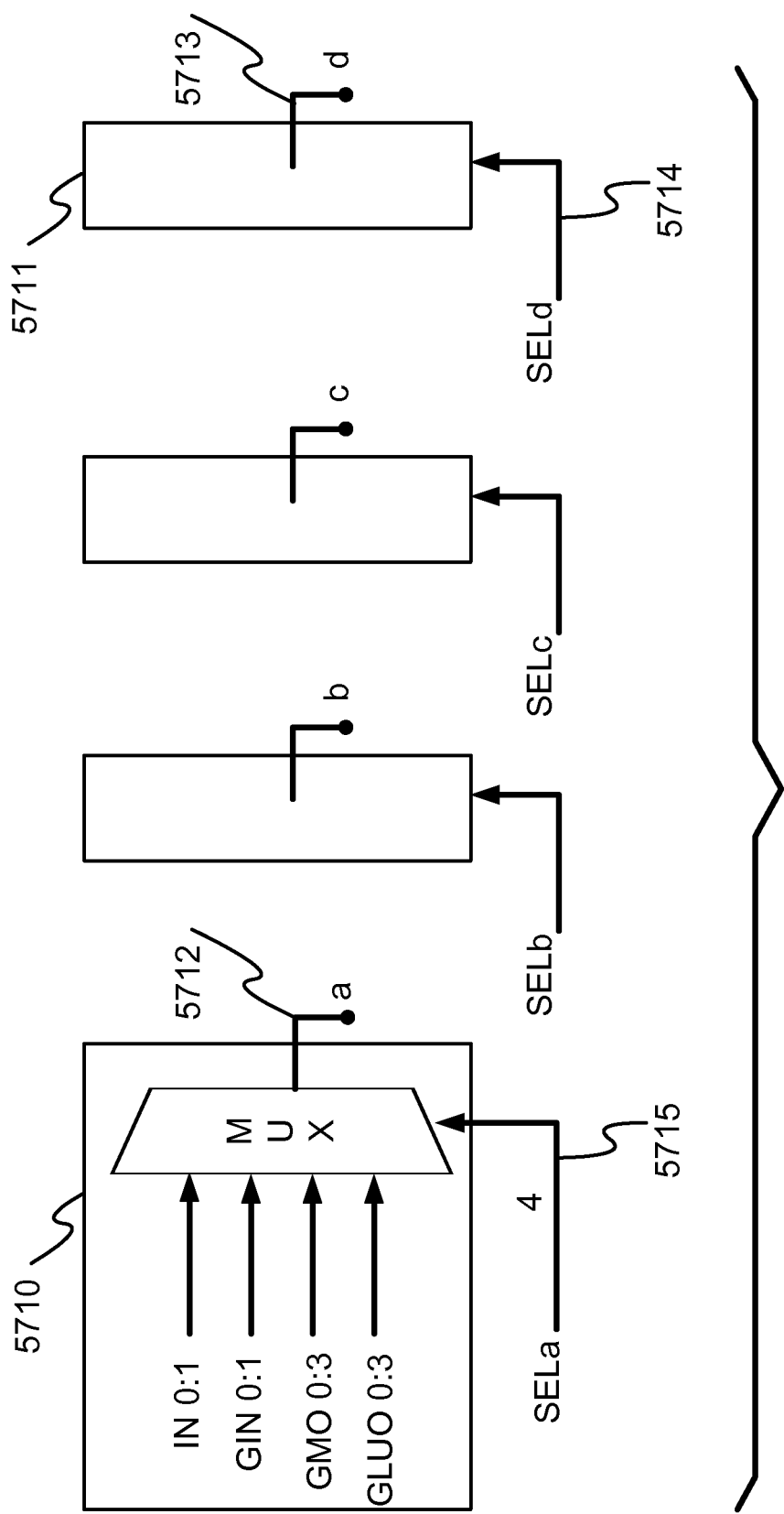

MASSIVELY PARALLEL INTERCONNECT FABRIC FOR COMPLEX SEMICONDUCTOR DEVICES

RELATED APPLICATION

This application is a CIP of another application, with the same inventors, assignee, and title, filed May 6, 2009, Ser. No. 12/436,235 now U.S. Pat. No. 8,390,035. This application claims benefit from the priority date of the parent application Ser. No. 12/436,235, and incorporates all of the parent's teaching and specification, by reference.

BACKGROUND OF THE INVENTION

Two prevalent approaches for building complex custom semiconductor devices are based on field-programmable gate array (FPGA) or application-specific integrated circuit (ASIC).

A FPGA is a semiconductor device that can be configured by the customer or designer after manufacturing, using a logic circuit diagram or a source code in a hardware description language (HDL) describing how the chip functions. FPGAs contain programmable logic components (logic blocks), and a hierarchy of reconfigurable interconnects that allow the blocks to be wired together. Logic blocks can be configured to perform complex combinational functions as well as simple logic gates through combinational logic and/or lookup table(s). In FPGAs, the logic blocks may include memory elements in form of simple flip-flops or even more complete blocks of memory.

An ASIC is an integrated circuit (IC) customized for a particular use, rather than intended for general-purpose use. The complexity/functionality of ASIC has grown significantly. Typically, an ASIC may contain few hundred to over 100 million gates. A System-on-a-chip (SoC) type ASICs may include processors, memory blocks (e.g., ROM, RAM, and Flash) and other large building blocks. An HDL, such as Verilog or VHDL, is used to describe the functionality of ASICs during the design phase. There have been several approaches to design and implement ASIC devices, such as gate array (requiring customization at the metallization layers), standard cell, full custom design, and structured/platform design. In structured ASIC approach, the ASIC vendor typically predefines the logic mask-layers of a device; however, the customization is done by creating custom metal layers to create custom connections between predefined lower-layer logic elements. Structured ASIC approach fits between FPGAs and Standard-Cell ASIC designs. Because only a small number of chip layers must be custom-produced, "structured ASIC" designs have much smaller non-recurring expenditures (NRE) than "standard-cell" or "full-custom" chips, which require that a full mask set be produced for every design.

An advantage of FPGA over ASIC is that FPGA can be used to implement any logical function that an ASIC could perform, but offers the ability to reconfigure the logic during the development phase as well as update the functionality after shipping without altering the physical construction of the device. However, the tradeoff is the larger die size, more power consumption, less performance, and higher per die cost (not including NRE).

FPGAs are the modern-day technology for building a breadboard or prototype from standard parts; programmable logic blocks and programmable interconnects allow the same FPGA to be used in many different applications. For smaller designs and/or lower production volumes, FPGAs may be more cost effective than an ASIC design even in production. The non-recurring engineering cost and implementation of an ASIC can run into the millions of dollars.

The many programmable interconnects and associated storage elements in FPGA reside on the same die as its logical blocks require large die size and high power consumption, making FPGA not a viable option for production for certain applications requiring low power consumption or low cost per die.

SUMMARY OF THE INVENTION

In an embodiment of this invention, a three dimensional staking of a die is done by flipping a programming/context die on a core IC/die substrate having logic blocks, to electrically connect the logic blocks through a massive parallel interconnect fabric (MPIF) formed by direct pad-pad signal (and/or power) connection at the flipped interface. The examples of types of pad-pad connections include metal-metal, oxide bonding, capacitive bonding, conducting polymer to conducting polymer, and conducting semiconductor to conducting semiconductor. The MPIF allows for connectivity at transistor/gate level on the core die substrate to the context die, leading to high density, high performance, and low cost (NRE and Unit Price) programmable platform ASIC. This approach reduces the cost of development, physical design (PD), and manufacturing. In addition, the time/cost of conversion to high volume production is reduced with having limited or no system level re-qualification.

An embodiment of this invention incorporates rich IP (e.g., SerDes, processors, memory(s)) in application oriented structured ASIC and high performance multi-function platform e.g., for consumer, storage, and telecom/wireless markets.

In an embodiment of this invention, system on chip (SOC) macro blocks are separated and used as building blocks for SOC construction via MPIF, with e.g., processors (general and custom), memory, analog functions, specialty I/O, digital signal processing (DSP). The decoupling of core and context of SOC architecture and implementation, in an embodiment of this invention, reduces the cost of IC development drastically, due to reduction of integration of the building blocks (context), reduction in associated resources and skill set for coding (R&D), verification, and test. In one embodiment, the production cost is reduced, for example, due to increase in overall yield. In one embodiment, the area, power consumption is reduced due to core stacking at the gate level through MPIF. In one embodiment, the performance is increased compared to FPGA, due to reduction in delays or parasitic.

In an embodiment of this invention, the in-circuit programming functions are separated from the system logic to reduce the overhead associated with area and power consumption. For example, in the case of FPGA, since the interconnects and storage elements are separated from the core LE (logic elements), it results in production parts with less area and power consumption on the core die substrate.

In one embodiment, mixed technology MPIF is used to leverage existing building blocks and avoid costly porting of technology.

In one embodiment, a full-chip debug and trace capability is enabled without the huge and costly overhead.

An MPIF embodiment is presented which serves as an alternative to current industry FPGA architectures. The solution separates the fundamental blocks of FPGA for the purpose/sake of the design.

A key value behind the invention (HPLA) is the elimination of programmability and hardening the logic to the final image. However, not to carry the overhead with massive cross-connect inside the FPGA, or the programmability (SRAM, LUTs, Registers, etc), translates to significant area and power reduction and shall enhance the performance.

As shown in our various figures, multiple logic blocks of programmable semiconductor die substrate is connected to itself, at transistor or gate level, with micro-bump, wirebondless and bumpless electrical connections, via the context die substrate, through pads of the multiple parallel interconnect fabric.

Here are some of our main features in this disclosure, as examples:

Separation of programming component of FPGA from User Logic, placed in CoreStack, not limited to:
a. CoreStack Storage cells for holding state of the User Logic
b. CoreStack Interconnect switch fabric that provides User Logic Interconnect across the Base Stack
c. CoreStack Look up table representing logical behavior of User Logic
d. Configuration logic and signaling resident in CoreStack for User Input/Output I/O, Mixed Signal cells, high speeds interfaces (Serdes) and other BaseStack interface logic Insertion of cells in BaseStack for the purpose of buffering and distribution of large fanout signals, such as Reset, Clock, Control signals, and the like Manufacturing of BaseStack, by exclusion of CoreStack and Inclusion of metal layers, to represent logical behavior of CoreStack Directly metalizing and manufacturing the BaseStack with additional metal layers Manufacturing of combined BaseStack and CoreStack Hardening BaseStack modifying/adding to any layers of BaseStack (Metal, Via, or the like)

Programming and Reprogramming of CoreStack

Inclusion of multiple CoreStack over the same BaseStack

BRIEF DESCRIPTION OF THE DRAWINGS

(FIG. 33 (a) relates to Prototype to production.) (FIG. 33 (b) relates to 3D Construction, BaseStack+CoreStack.) (FIG. 33 (c) relates to CoreStack I/O interface.)

FIGS. 33 (d), 33 (e), and 33(f) show hardening corestack I/O mapping, HPLA CoreStack match BaseStack, and HPLA with Bump Step, respectively.

FIG. 56(b) shows a CoreStack Logic Unit Mux routing elements. (4-bit Counter-Decoder Fabric Architecture, Logic-Unit 1-4 MUX Logic Detail)

DETAILED DESCRIPTION OF THE PREFERRED EMBODIMENTS

Flip-chip or wire bonding techniques are commonly used in semiconductor packaging of semiconductor devices (on die) to package substrate. However, these techniques are typically used at SOC/chip/I/O level (i.e., higher hierarchical interconnect level) given the size and other physical and design requirements/constraints, instead of gate/logic block level (i.e., lower hierarchical interconnect level). In such an interconnect hierarchy, the inter-gate level connections tend to be localized at micro level; inter-micro level connections tend to be localized at macro level; and the inter-macro level connections tend to be localized at chip/SOC level. Therefore, even though there may be millions of gate level connections, e.g., in a SOC, there are much fewer chip-chip interconnects.

Figure 1A:
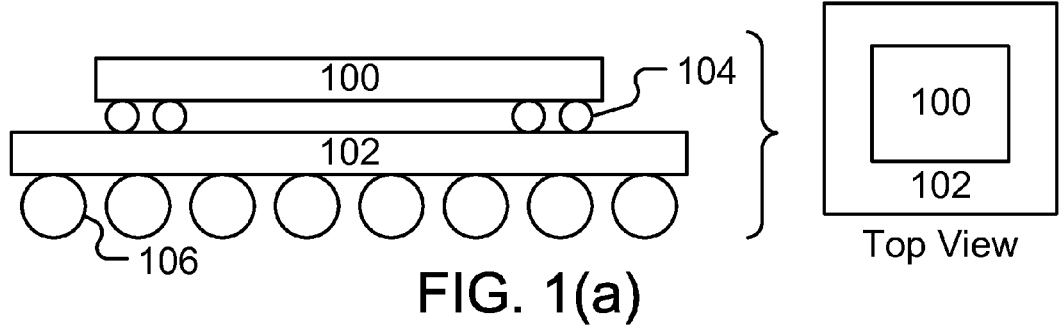
FIG. 1(a) depicts electrically connecting a die on a package substrate using bumps, as in prior art.

For example, FIG. 1(a) illustrates a prior art the flip-chip placement of a die (100) on a package substrate (102) using die bumps (104) placed on the die for electrical connection between the die and the package substrate. The electrical connection to the package substrate from the outside is provided via the package balls (106). Typically, the empty space between the die (100) and the package substrate (102) is filled by an underfill dielectric material, joining and locking the die to the package substrate, protecting the bumps from moisture or other environmental hazards, providing additional mechanical strength to the assembly, as well as compensating for any thermal expansion difference between the die chip and the package substrate. Flip-chip provides the direct connection from die pad to package substrate, with capability of, for example, about few hundred to about few thousands (e.g., less than 4000 to 6000) I/O through die bumps. However, the process requires an additional wafer-level processing (bumping) and it may require wafer-level redistribution routing. Such processing may result in a very expensive substrate (e.g., with 14 layers). In many situations, the package cost becomes more than the device cost.

Figure 1B:
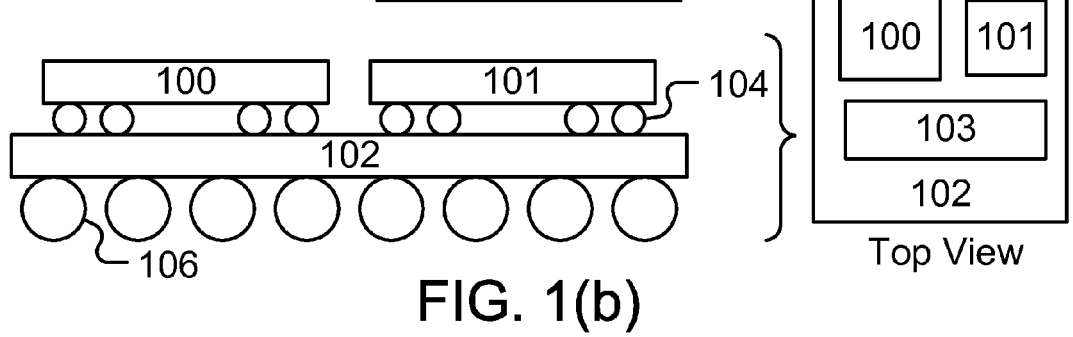
FIG. 1(b) depicts electrically connecting multiple dice to a package substrate using bumps, as in prior art.
Figure 1C:
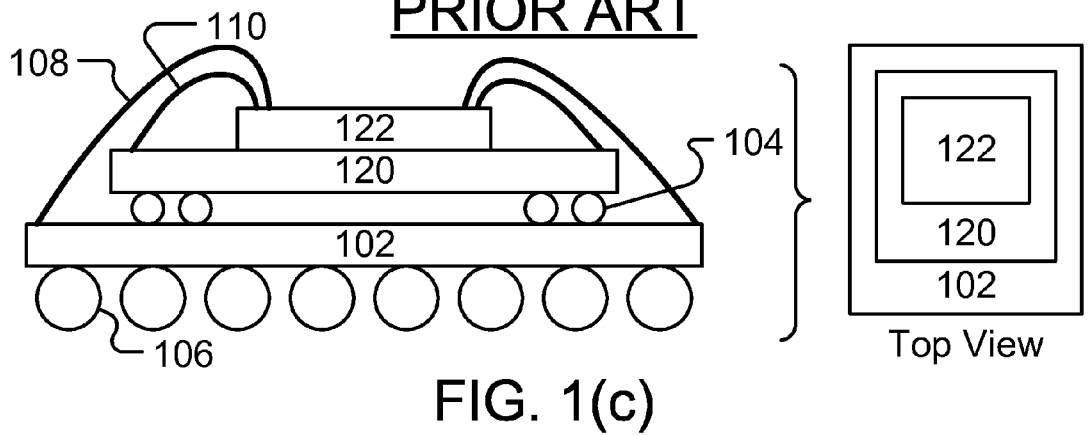
FIG. 1(c) depicts electrically connecting dies to a package substrate using bumps and wire bonds, as in prior art.

In prior art, the flip-chip technique has also been applied to multiple chips/dice. As illustrated in FIG. 1(b), the chips (100, 101, and 103) are flipped and electrically connected to the package substrate via the bumps (104). FIG. 1(c) illustrates both wire bonding and flip-chip for connecting the chips (122 and 120) to the package substrate, as in prior art. For example, wire bonds 108 and 119 electrically connect the top die (122) to the package substrate (102) and the supporting die (120), respectively. Wire-bond technology can support relatively low number (e.g., 1000) I/O with about 50 μm pitch. In comparison, flip-chip allows for more connections through die bumps, less inductance (compared with wire bond), and higher performing and denser circuits.

Figure 1D:
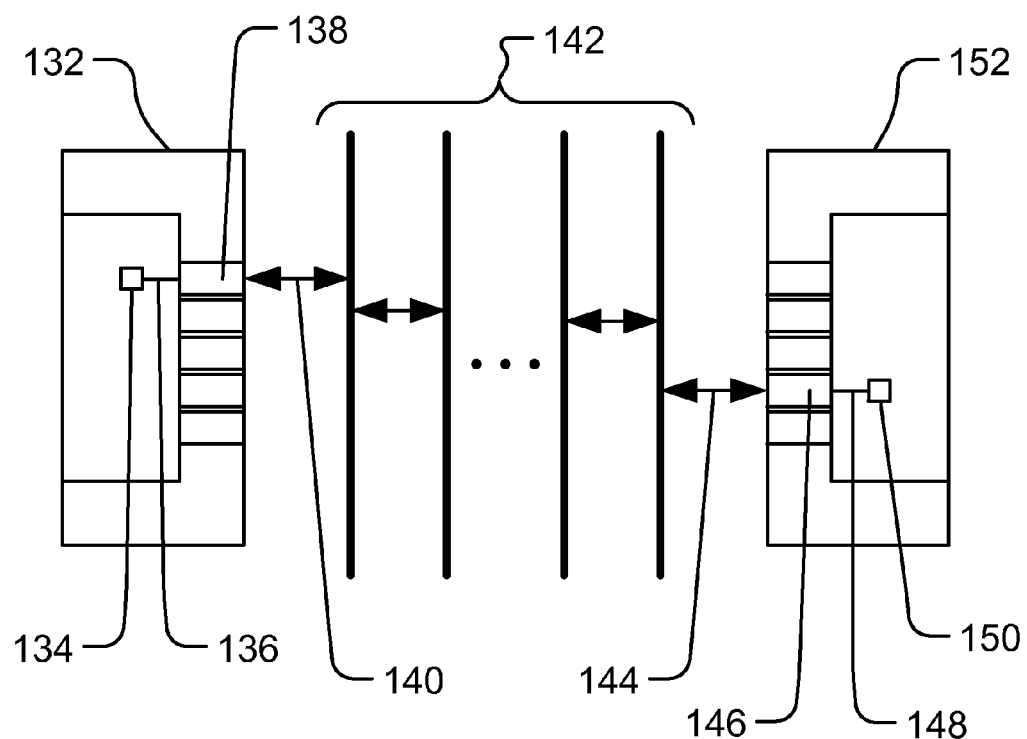
FIG. 1(d) depicts interconnection of logic elements between two (e.g., ASIC) devices through I/O rings, PCB layers and package substrate, as in prior art.

FIG. 1(d) illustrates the interconnect approach between two integrated circuits (such as ASICs) through packaging, as used in prior art. For example, the electrical path is shown from a logic block (134) on the first ASIC (132) to a logic block (150) on the second ASIC (152), through the first chip's metallization layers (136) to the I/O ring (138) of the first ASIC, to the packaging of the first ASIC (140), through the hierarchy of package substrates and the printed circuit board (PCB) connectors (142), through the packaging of the second ASIC (144), to the I/O ring (146) of the second ASIC and the second chip's metallization layers (148). One consequence of such approach in prior art is that the electrical connections between logic blocks or components from such dice (e.g., 132, 152) are limited by the die bumps (and PBC connectors); and therefore, in complex structures, these connections tend to be at the higher component/module levels, instead of transistor/gate levels.

Figure 2:
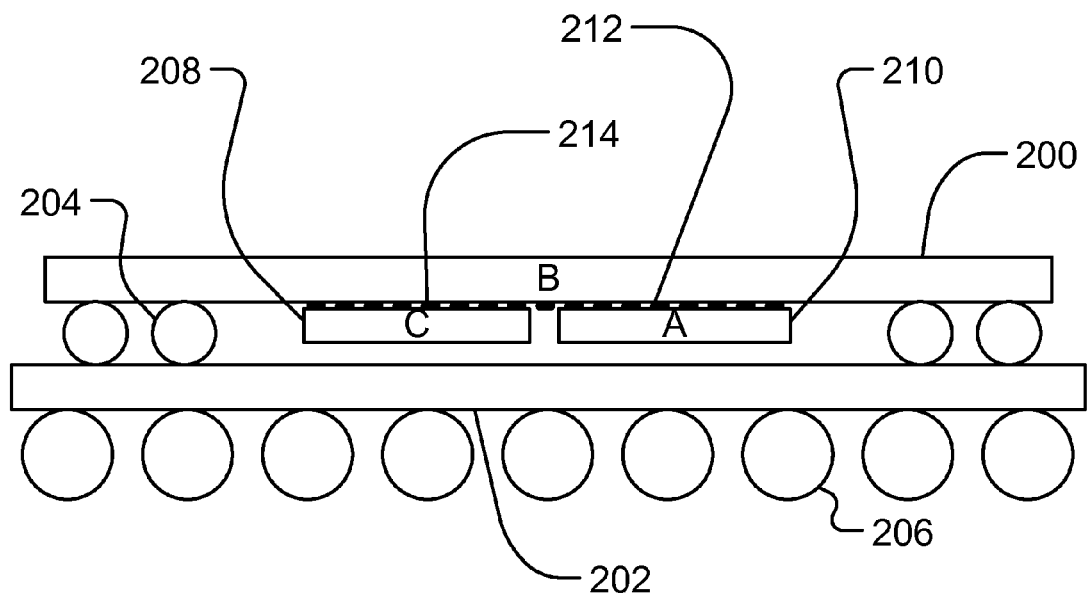
FIG. 2 depicts electrically connecting one or more IC devices to a core die substrate using MPIF with core die substrate connected to a package substrate using bumps, in an embodiment of this invention.

The bumps in prior art (e.g., 104 between 100 and 102) are typically formed by solder ball attachment, wire-bond cuts, conventional sputter/print solder paste, or electroless plating techniques. In an embodiment of this invention, instead of using bumps for electrical connections between two ICs, a fabric of parallel interconnects is used to connect the ICs through a flip-chip configuration. As illustrated in FIG. 2, dice A (210) and C (212) are flipped on die B (200) (using a flip-chip technology) and they are electrically connected to die B through a massively parallel interconnect fabric (MPIF) (212, 214). A large number of connections within the fabric provide the capability to connect the ICs (e.g., IC A and die B) at the transistor/gate level, allowing for a higher integration level permitted by die bumps. For example, in one embodiment, the number of connections in the fabric is in range ten thousand to millions. MPIF provides for a high density of connections which is not currently achievable by bumping or wire-bonding. In an embodiment of this invention, MPIF is used to achieve high density of connections at concentrated/small area(s) on the dies connected via a flip-chip technology.

In an embodiment, illustrated in FIG. 2, die B substrate (200) is placed on the package substrate (202) via bumps (204), and the external electrical connection to the package is provided via the package balls (206).

In an embodiment, e.g., as illustrated in FIG. 2, die B substrate (200) comprises core modules, e.g., logic blocks as in FGPA. The customization of these logic blocks, i.e., configuring interconnects to allow the blocks to be wired together, is achieved through the context die (e.g., 210, 208) via MPIF (e.g., 212, 214). This 3D stacking along with the separation of the logic blocks from the programming/context allows the increase in the density of the logic gates/blocks on the core die substrate (200) by having the programming interconnects allocated to the context die(s)/IC(s) (e.g., 210, 214). Having the customization/context provided by the context die allows the core die substrate to be configurable for multiple applications.

Figure 3:
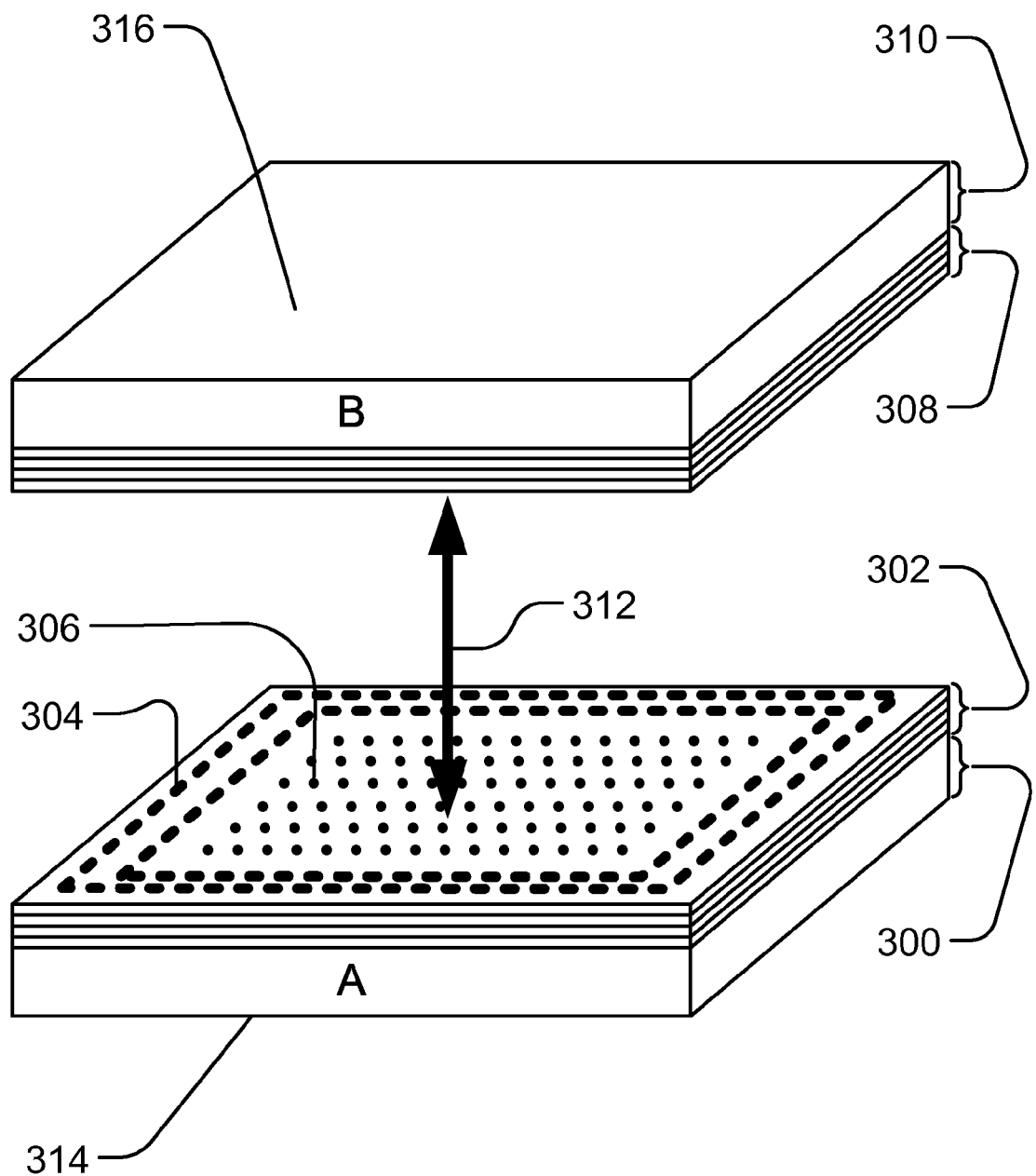
FIG. 3 depicts die to die connection through MPIF, in an embodiment of this invention.

FIG. 3 illustrates a die/die connection (312) through MPIF (306), in an embodiment of this invention. In this example, dice A (314) and B (316) each comprises base layer(s) (300, 310) and metallization/conducting layer(s) (302, 308), respectively. In one embodiment, the dice have standard I/O (304), e.g., at their periphery, which are electrically connected together, as the interconnects are in MPIF. The metallization/conducting layers (e.g., 302 or 308) which are separated by dielectric layers are patterned to route the electrical signals/power across the die. Multiple layers are used to let the designers route electrical signals cross over each other. The conducting layers are also electrically connected, e.g., through vias.

Figure 4:
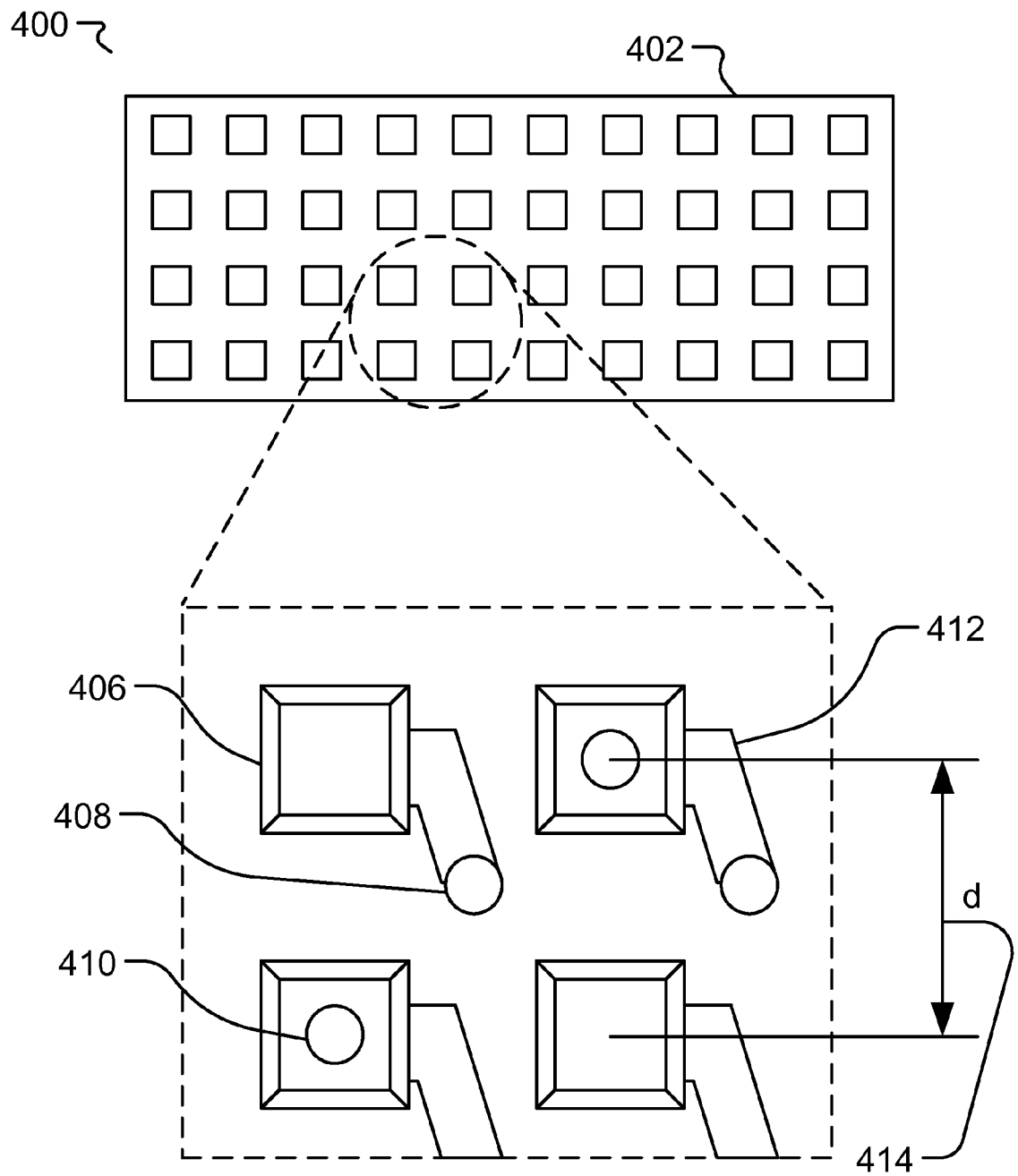
FIG. 4 depicts MPIF vias used in die to die connection in an embodiment of this invention.

In one embodiment, as illustrated in FIG. 4, the MPIF (400) on a die (402) is formed by a series of die-die MPIF pads (406). The MPIF vias (e.g., 408 and 410) provide the electrical connection between the pads and the transistors/gates on the die. In one embodiment, the inter-pad spacing in MPIF is typically about 10-50 μm. In one embodiment, the pads are regularly spaced in both horizontal and vertical direction, e.g., having a fixed distance d (414). In another embodiment, the pads are distributed in non-uniformly. In one embodiment, MPIF on a die supports millions of pads per cm$^2$, for die-die connection. The Re-Distribution Layer (RDL) (412) provides the electrical connectivity between the pads and the lower metallization layers, while reducing the interdependency between the package and die integration.

Figure 5:
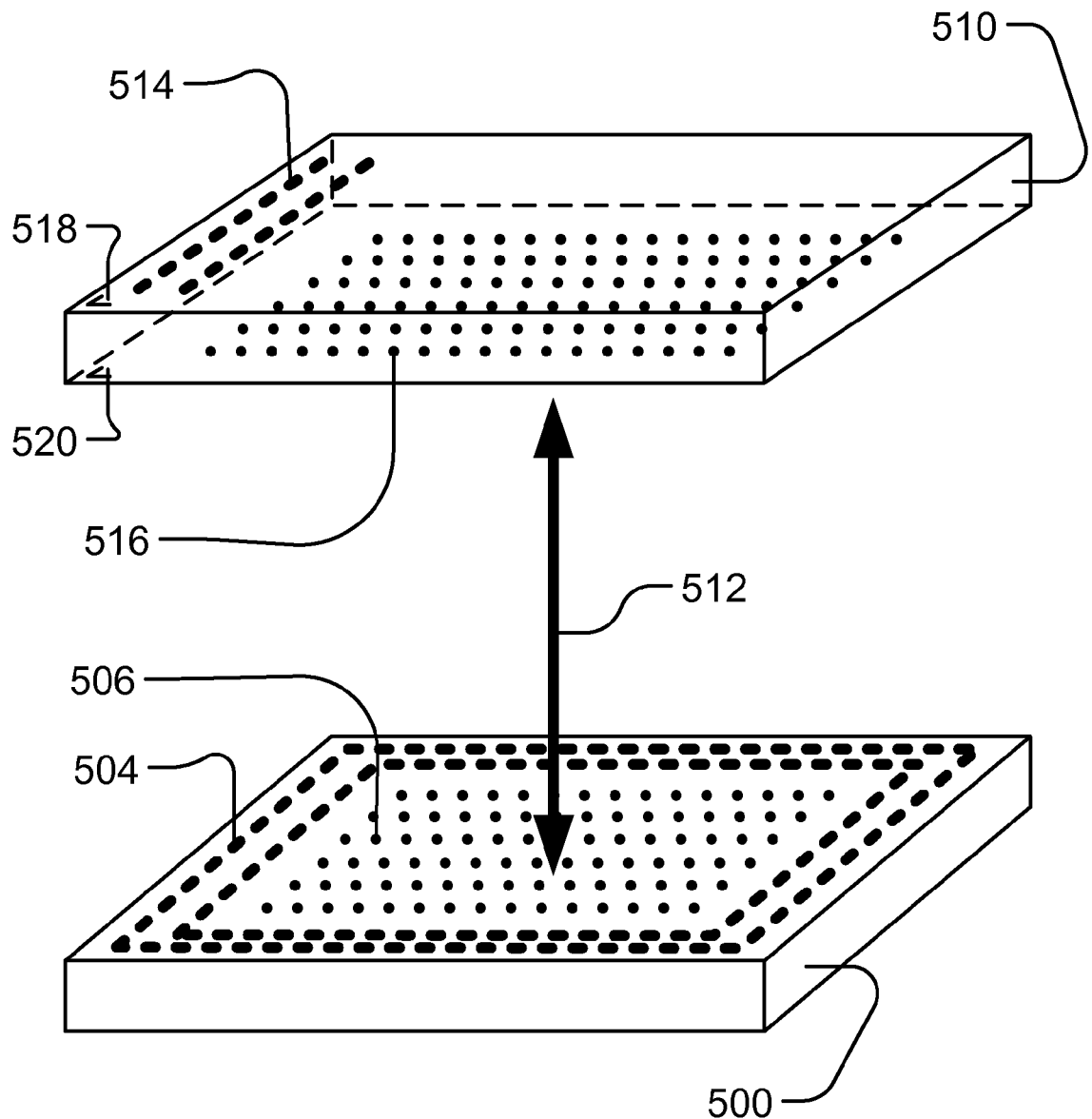
FIG. 5 depicts MPIF contact patterns on both dice in an embodiment of this invention.

In an embodiment of invention, as illustrated in FIG. 5, a programmable platform die (500), e.g., an ASIC, is electronically connected (512) to a programming/context die (510) through MPIF by flipping the context die (510) on its surface (520) containing the MPIF pad patterns (516) to the MPIF patterns (506) on the programmable die (500). In one embodiment, the context die (510) includes a programming interface (514). In one embodiment, the programming interface is located on the opposite surface (518) from the flipped surface (520) of the context die (510), so that after MPIF connection between the dice, the context die is programmed through the programming interface (514). In one embodiment, the context die includes programmable switches that electrically connect the MPIF (516) pads on the context die (510), causing electrical connection between the gates/transistors, e.g., in logic blocks, on the programmable die (500) having associated MPIF (506) pads. In one embodiment, the programmable die (500) includes a platform fabric I/O (504). In one embodiment, the platform fabric I/O provides I/O for specific purpose function, e.g., Serializer/Deserializer (SerDes) functional blocks used to convert data between serial data and parallel interfaces in each direction in high speed communications. In one embodiment, the platform fabric I/O provides input/output for generic purpose. In one embodiment, the customization/programming is provided in a system configuration output file which is implemented in the context die (510) through the programming interface (514).

Figure 6:
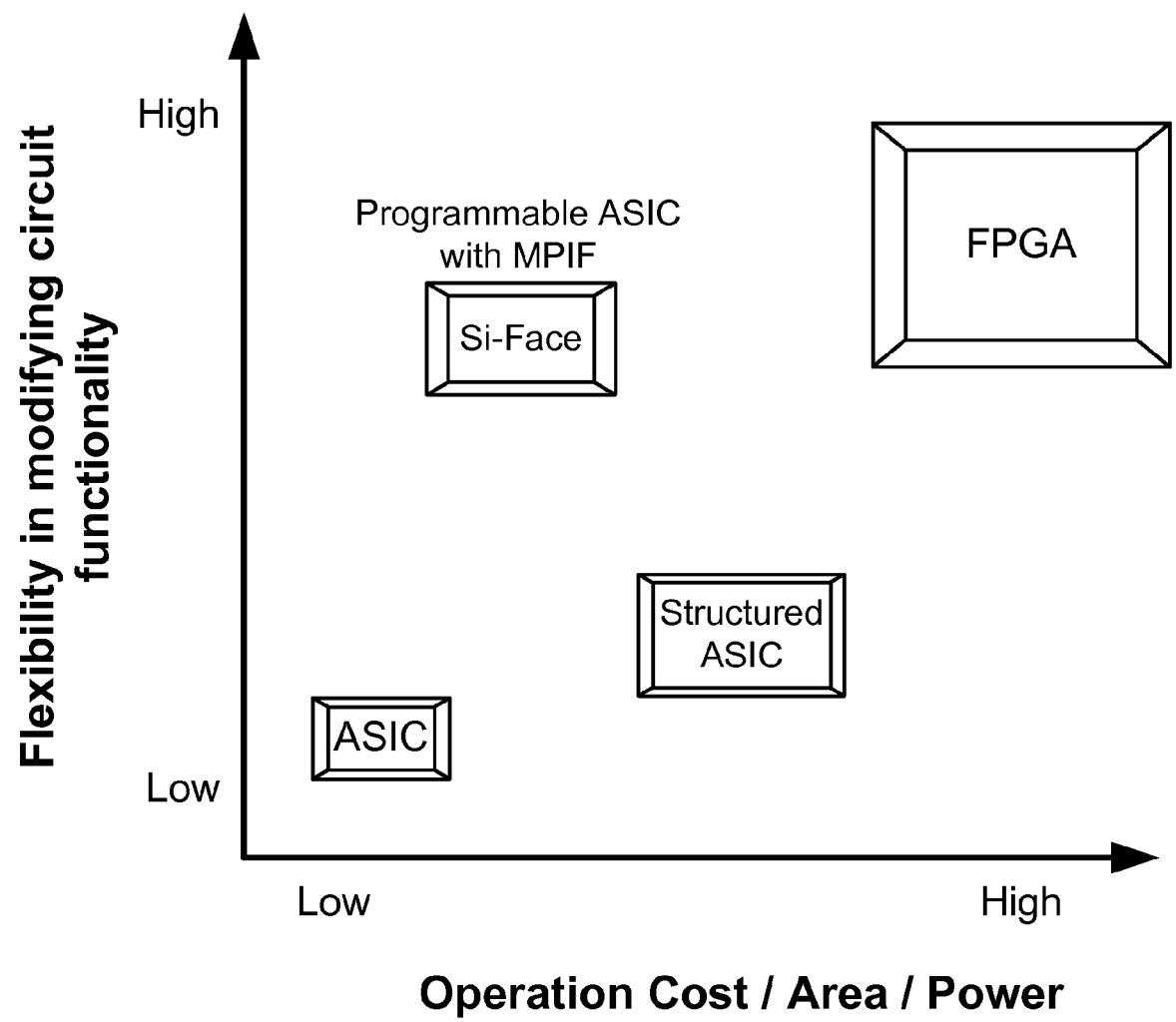
FIG. 6 qualitatively illustrates the flexibility in modifying circuit functionality and cost/area/power in an embodiment of this invention (labeled as Si-Face) and ASIC, Structured ASIC, and FPGA technologies.

FIG. 6 qualitatively illustrates the flexibility in changing circuit functionality (e.g., by programming) versus operation cost/area/power consumption for SoC solution space including ASIC, Structured ASIC, FPGA, and an embodiment of this invention, labeled Si-Face (e.g., with a context programming die stack on a core programmable die through flip-chip and electrically connected via MPIF). Note that this operation cost does not include the Non Recurring Engineering (NRE) costs. Traditional ASIC has the lowest cost/area/power consumption, but it offers the least flexibility in modifications to the circuit functionality. For example, the changes in the circuit often results in redoing the mask set and time consuming re-qualification of the design. Structured ASIC provides more such flexibility than traditional ASIC, by letting the last metallization layers (with vias) to be customized (i.e., hard-programmed) on a core of the logic blocks/modules. The changes to the design is reflected in the changes to those metallization layers and not necessarily all the mask set. As the result the size of the die is increased to allow for this flexibility. FPGA provides even more flexibility than Structured ASIC by letting the programming be performed at the field without using irreversible processing steps by the manufacturer. This represents no or little upfront NRE. Because of programmable switches in FPGA, the area requirement and the power consumption is the highest, while FPGA performance is typically inferior. In contrast, due to the 3D core stacking of an embodiment of this invention, the area requirement (e.g., for interconnects) for the programmable ASIC is reduced, while the flexibility in circuit programming is provided on the context die connected to the programmable ASIC through MPIF. For example, this allows the reconfigurability iterations to be performed on context die without affecting the core programmable die.

Figure 7A:
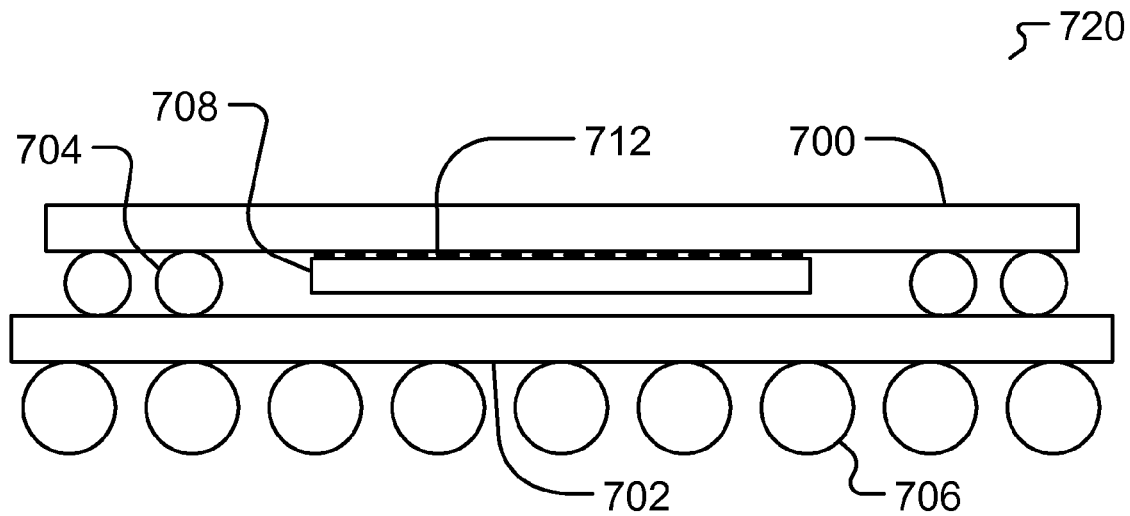
FIG. 7(a) illustrates the preproduction/prototyping of context/programming a core IC using a context IC through MPIF in an embodiment.
Figure 7B:
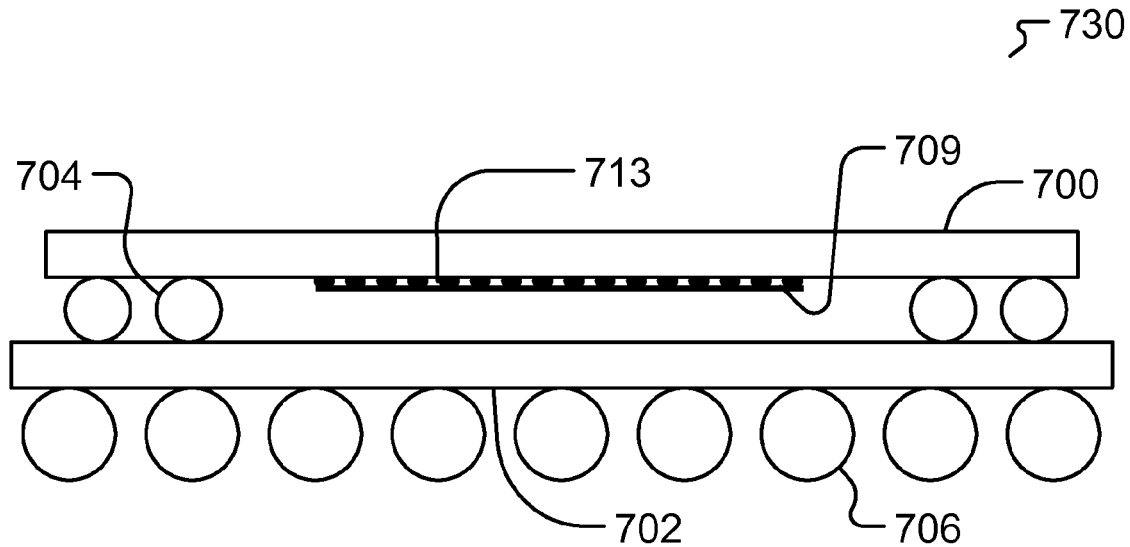
FIG. 7(b) illustrates the programming of a production version by fusing conducting (e.g., metal pads on the core IC in an embodiment.

Even though the NRE cost of FPGA approach is low compared to ASIC, there is still a significant conversion time and re-qualification involved to move the design from FPGA to ASIC, in order to reduce the operational cost and power consumption and/or increase the performance. Such a conversion may involve creating a logical configuration of the system from the already qualified FPGA and physically re-implementing it in an ASIC. Another approach may replace the FPGA programmable switches with permanent ones (e.g., by fusing) without drastic change in the form factor; however, this approach would not result in a saving in area or a significant enhancement in performance. In contrast, in an embodiment of this invention, as illustrated in FIG. 7(a), the preproduction or prototyping is done by using a context die (708) flipped and electrically connected to a core programmable die (700) through MPIF (712). In one embodiment, the pre-production (720) testing is performed by flipping the core die substrate (700) on a package substrate (702) after bumping (704) the core die substrate (700). In one embodiment, the programming of the circuit is done through the package balls (706), package substrate (702), die bumps (704), a set of circuits and/or interconnects on the core die substrate (700) (e.g., dedicated for passing/processing the programming signals to the context die (708) though MPIF (712)). In such configuration, the base platform of the core programmable die (700) retains an ASIC like density of gates/transistors given that the switches for interconnects are pushed to the context die (708) and the many interconnects/high density interconnects in the MPIF (712) provide the flexibility to customize the circuit at the gate/transistor level on the core IC (700). In one embodiment, the testing and debugging iterations are performed by reprogramming the context die (708). In one embodiment, the context die connected through MPIF with the core die substrate is used in production. In another embodiment, as illustrated in FIG. 7(b), the conversion to cost-reduction or production version (730) includes creating a set of metallization mask from the qualified and tested configuration used in context die (708), using the metallization masks to permanently fuse (709) the MPIF pads (713) of the core die substrate (700) before bumping the core die substrate and placing it in the package. In this approach, the re-qualification of the production version (730) is minimized as the core die substrate and the package substrate remain the same. The operation cost is reduced as the few metallization steps much less impact the cost per die. In one embodiment, the yield increases as the metallization steps replace the connections via a flip-chip technology. In one embodiment, the performance increases as the permanent connections on the MPIF pads (instead of programmable switches) require less power, and present less delay. In addition, the time required to get to production is significantly reduced, because the development/prototyping cycle is relatively short due to in field programmability through MPIF and the context die, and the conversion cycle is short given that the form factors (die and package) and configurations are essentially unchanged.

Figure 8:
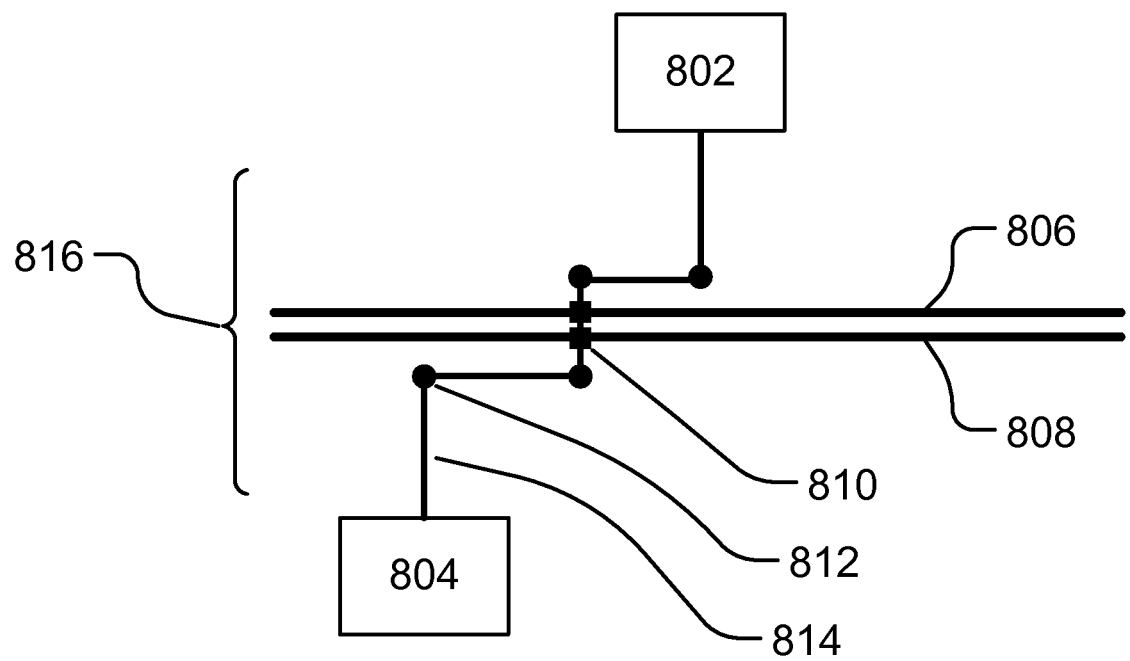
FIG. 8 depicts the construction of MPIF in an embodiment of this invention.

FIG. 8 schematically illustrates the electrical connection, in one embodiment, between circuits (802 and 804) (e.g., transistor/gates/flip-flops/switches) on the dice connected through an MPIF (816) construction. The connection from the circuits (e.g., 804) is through the metallization/conducting layers (e.g., copper trace) (814), via (812), RDL (808) for the bottom die, and the MPIF die-die pads (810), and RDL (806) and via and metallization layers of the top die. In one embodiment, protection circuits are also provided (not shown) on one or both dies within the circuits (e.g., 802 or 804) or in parallel to the circuits to protect MPIF pads against electrostatic discharge (ESD). For example, such protection circuits include shut diodes to substrate.

Figure 9A:
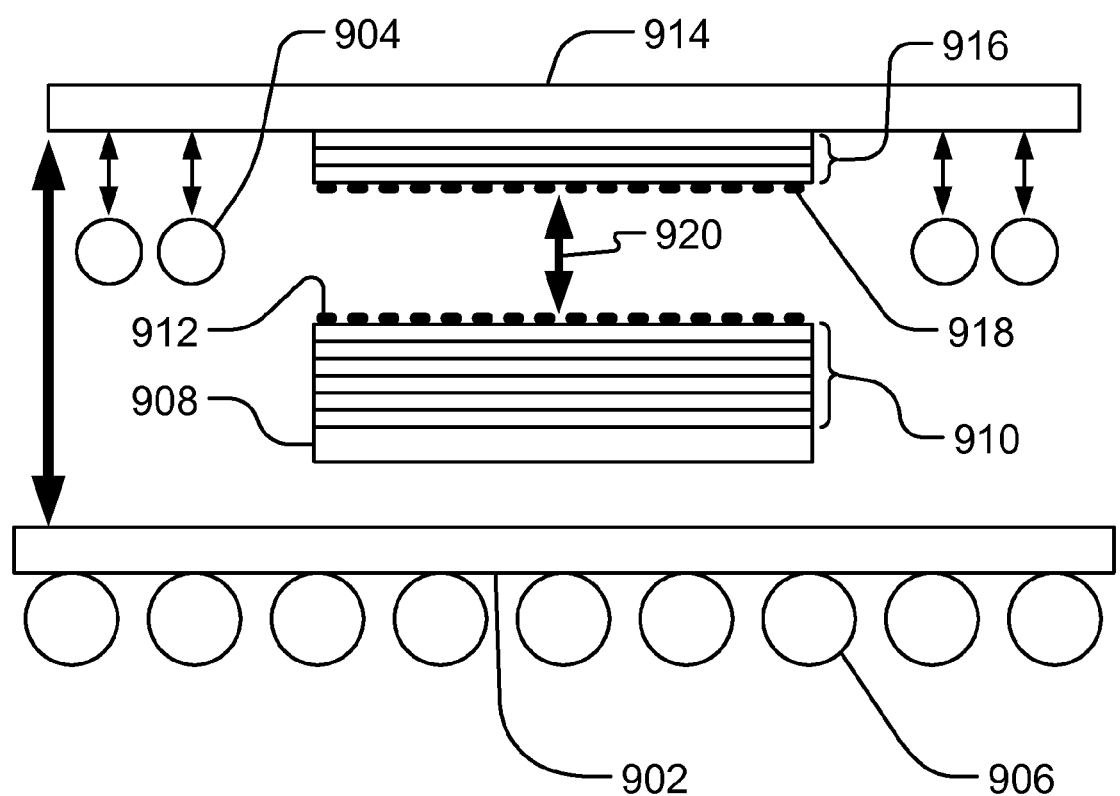
FIGS. 9(a)-9(c) depict cross sections of a programming IC connecting through MPIF to a core IC die which is connecting to a package substrate through bumps, in an embodiment of this invention.

FIG. 9(a) illustrates (900) an embodiment of this invention (not to scale) including a core die substrate (914) (e.g., a Silicon or die substrate with structured gates, memory, and I/O), with core metallization/conducting layers (916) (e.g., comprising of three metallization layers: metal 1 and 2 used for basic gate construction on the core die substrate (914), and metal 3 used for fabric interconnect) and MPIF (918) pads. In an embodiment, the programming device/die (908) (e.g., a die substrate) includes interconnect routing fabric (910) (e.g., with 6-9 layers of metallization/conducting layers), and MPIF (912) pads. In an embodiment, the programming device (908) is flipped (920) on the core IC/die substrate (914). In one embodiment, the core die substrate is bumped (904) and placed in a package substrate (902) having package balls (906) for external connection. In one embodiment, the bumping of the core die substrate is done prior to flipping the programming device (908) on to the core die substrate (914), while in another embodiment, the bumping occurs afterwards.

Figure 9B:
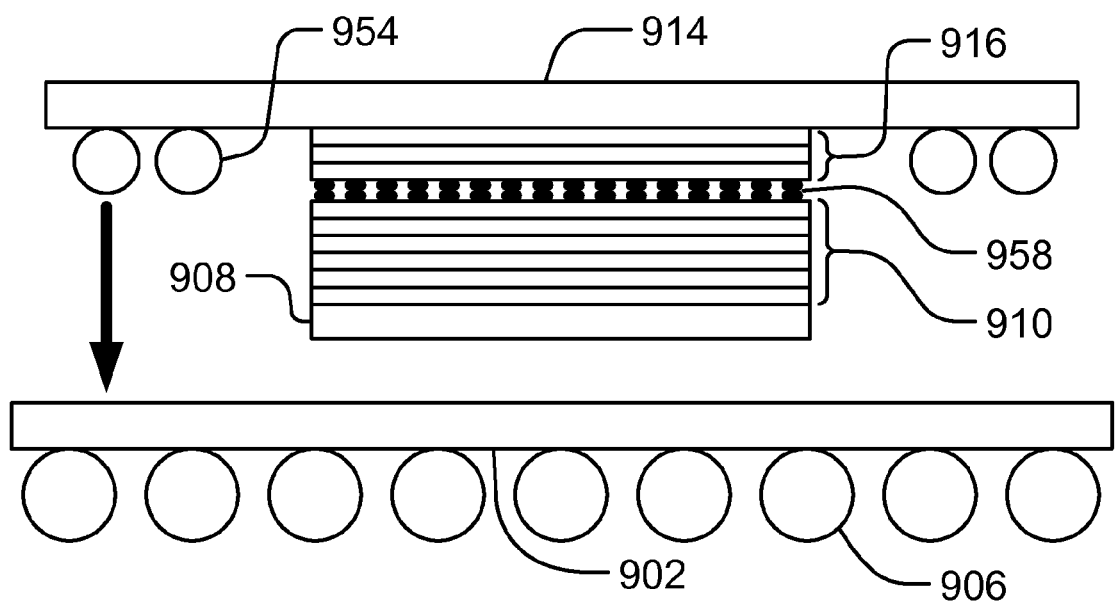
Figure 9C:
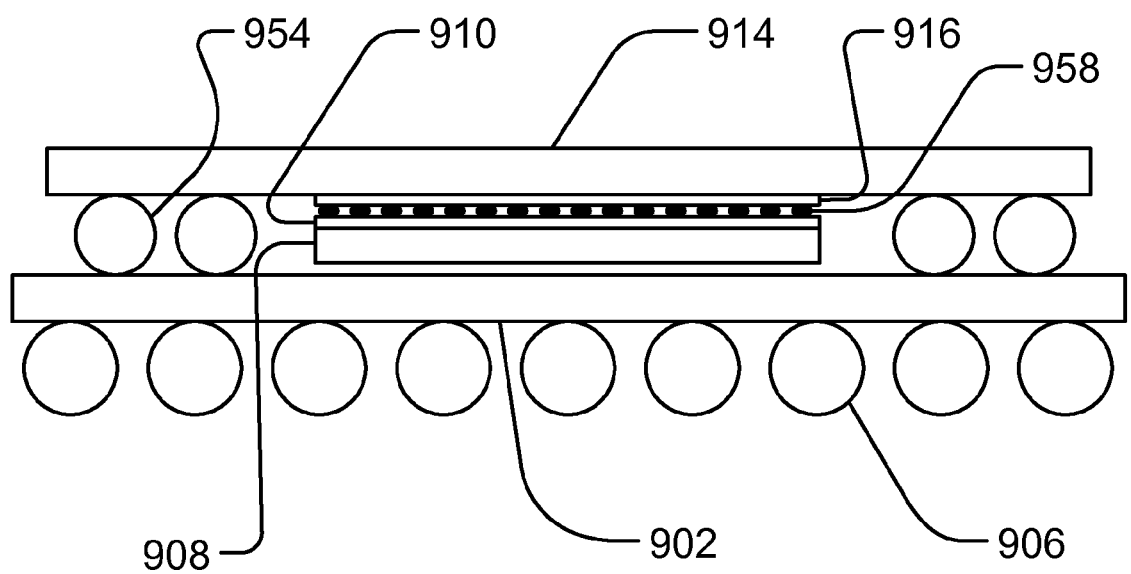

FIG. 9(b) illustrates (950) an embodiment of this invention (not to scale) having the programming device (908) flipped-on the core die substrate (914), and the MPIF (958) formed by the connection of the MPIF pads from the core die substrate (914) and the programming device (908). After flipping the programming device and bumping the core die substrate (954), the core die substrate is placed in the package substrate (902). FIG. 9(c) illustrates (980) an embodiment of this invention with the core die substrate placed in the package substrate in flip-chip configuration using the die bumps (954) for electrical connection.

Figure 10:
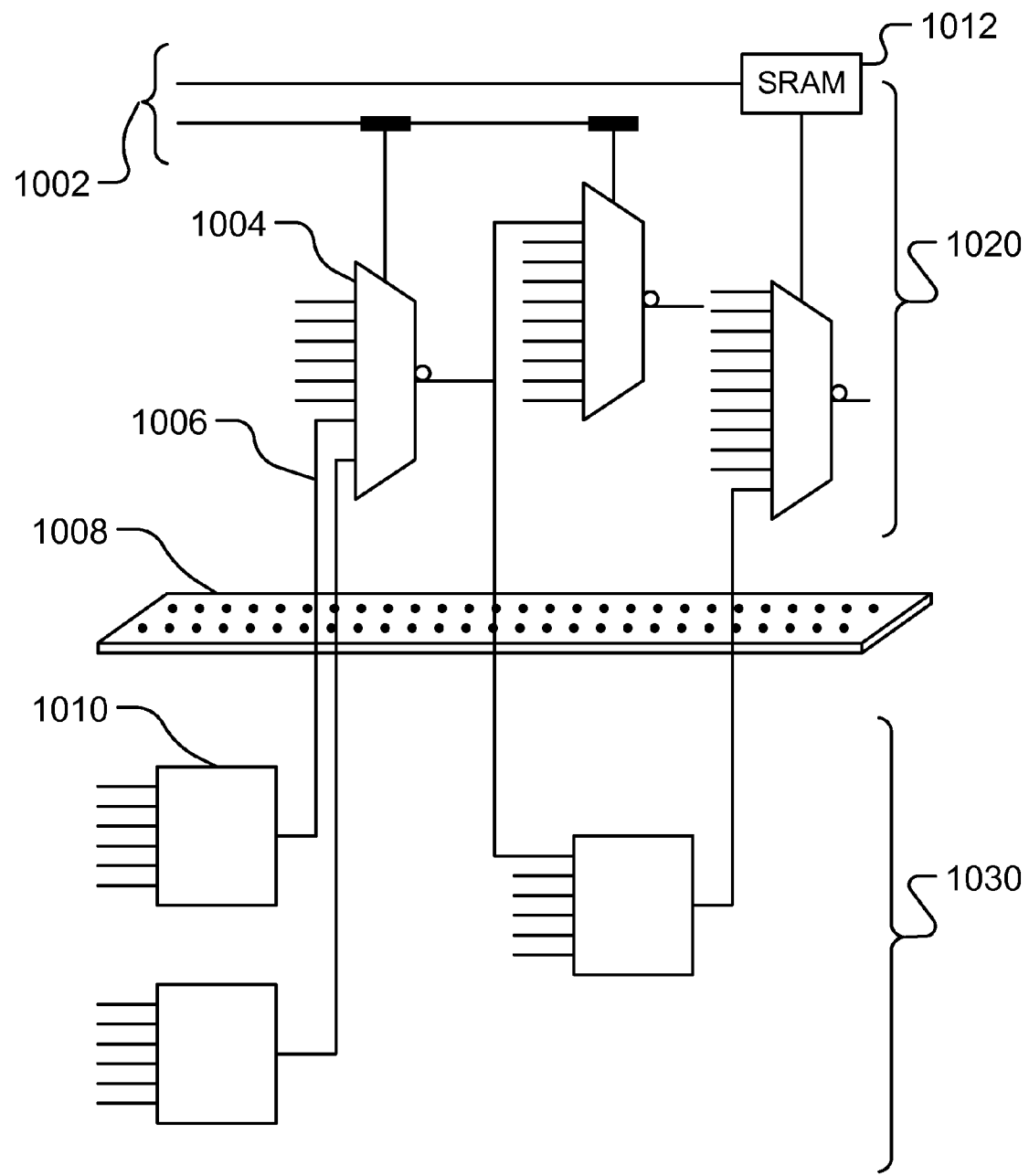
FIG. 10 illustrates an example of using MPIF for connecting the logic blocks and programming elements residing on two dice, in an embodiment of this invention.

FIG. 10 is a schematic of an embodiment of this invention, where the logic blocks/elements (1010) in the core die substrate (represented by 1030) are connected through MPIF (represented by 1008) to a programming die (represented by 1020) which provides the electrical connectivity between the ports/gates of the logic elements (1010) using metallization/conducting layers and vias (represented by 1006) and controlled switches/selectors (1004) (e.g., MUX) driven by the programming devices' (1020) programming interface (1002) as well as the logic blocks/gates from the core die substrate and the programming device. In one embodiment, transistor switches (not shown) are used as controlled switches. In one embodiment, the programming interface feeds into a memory, e.g., SRAM (1012), which drives the controlled switches/selectors (e.g., MUX and transistors).

In one embodiment, a "hard" programming is done in the context die by making permanent electrical connection between MPIF pads on the context die, e.g., by explicit routing mask set using the metallization/conducting layers and vias, or using fuse or antifuse technology to implement the configuration file. In this approach, the core die substrate remains the same (i.e., no redesign), but the adjustment/debugging is implemented on the context die without having to repeat all the processing steps of the core die substrate. In this approach the density of gates/transistors is further increased by reducing/eliminating circuit elements needed for reprogramming the context die.

Figure 11:
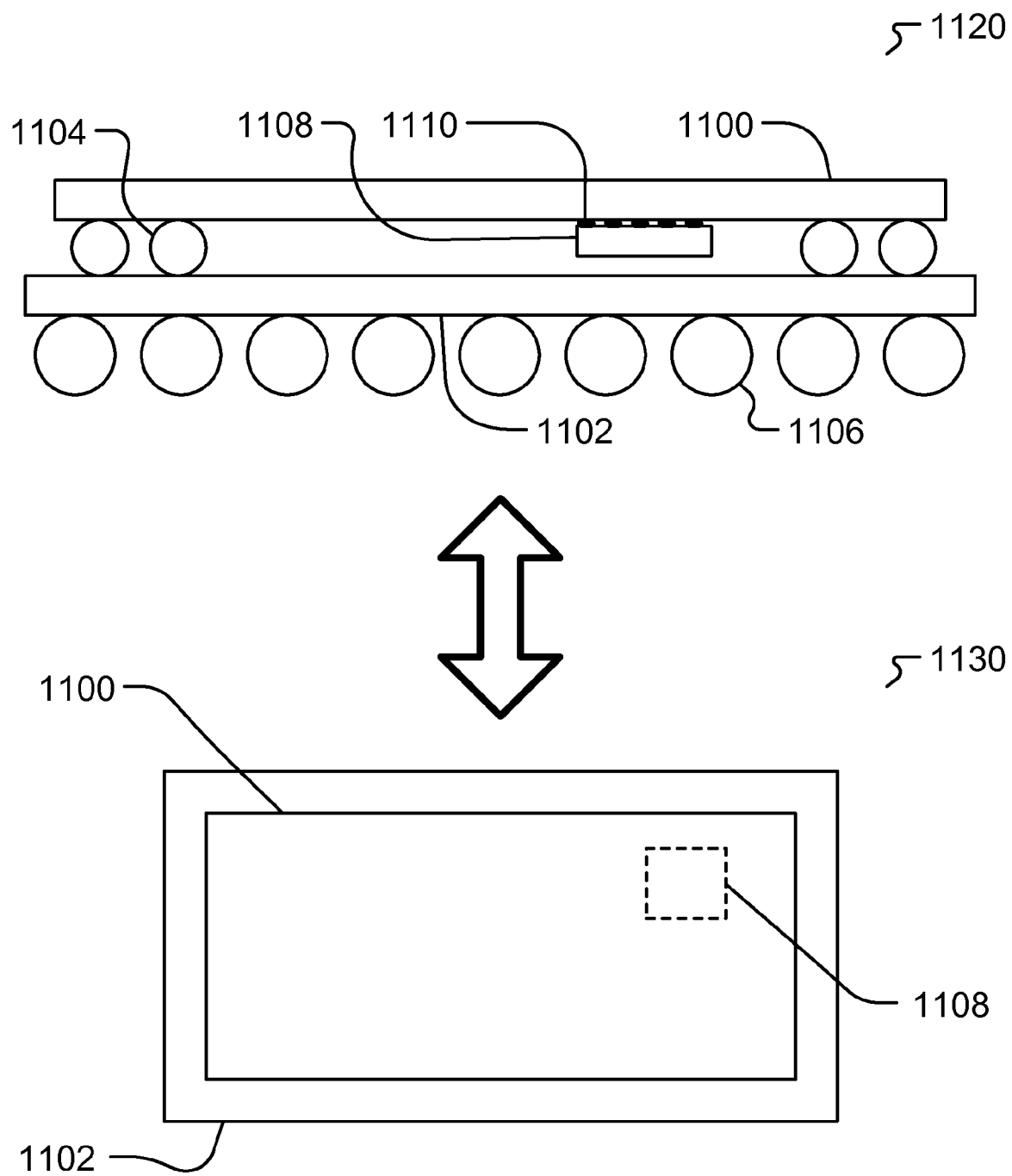
FIG. 11 depicts connecting an FPGA to a core die substrate through MPIF.

FIG. 11 illustrates an embodiment of this invention (1120), where an FPGA core (1108) provides its functionality to the main device IC/die (1100) through the MPIF (1110). Such embodiment provides a platform for emerging applications requiring partial programmability. In an embodiment, the FPGA core die (1108) is flipped on the main device die (1100) with MPIF providing the signal and power to the FPGA core. In one embodiment, the main device die substrate (1100) is bumped (1104) and flipped on a package substrate (1120) having package balls (1106) for external connectivity. FIG. 11 also depicts the top view (1130) of such an embodiment. The examples of FPGA core functionality include custom applications such as signal processing, hardware implementation of Java Virtual machine (JVM), and graphics.

Figure 12:
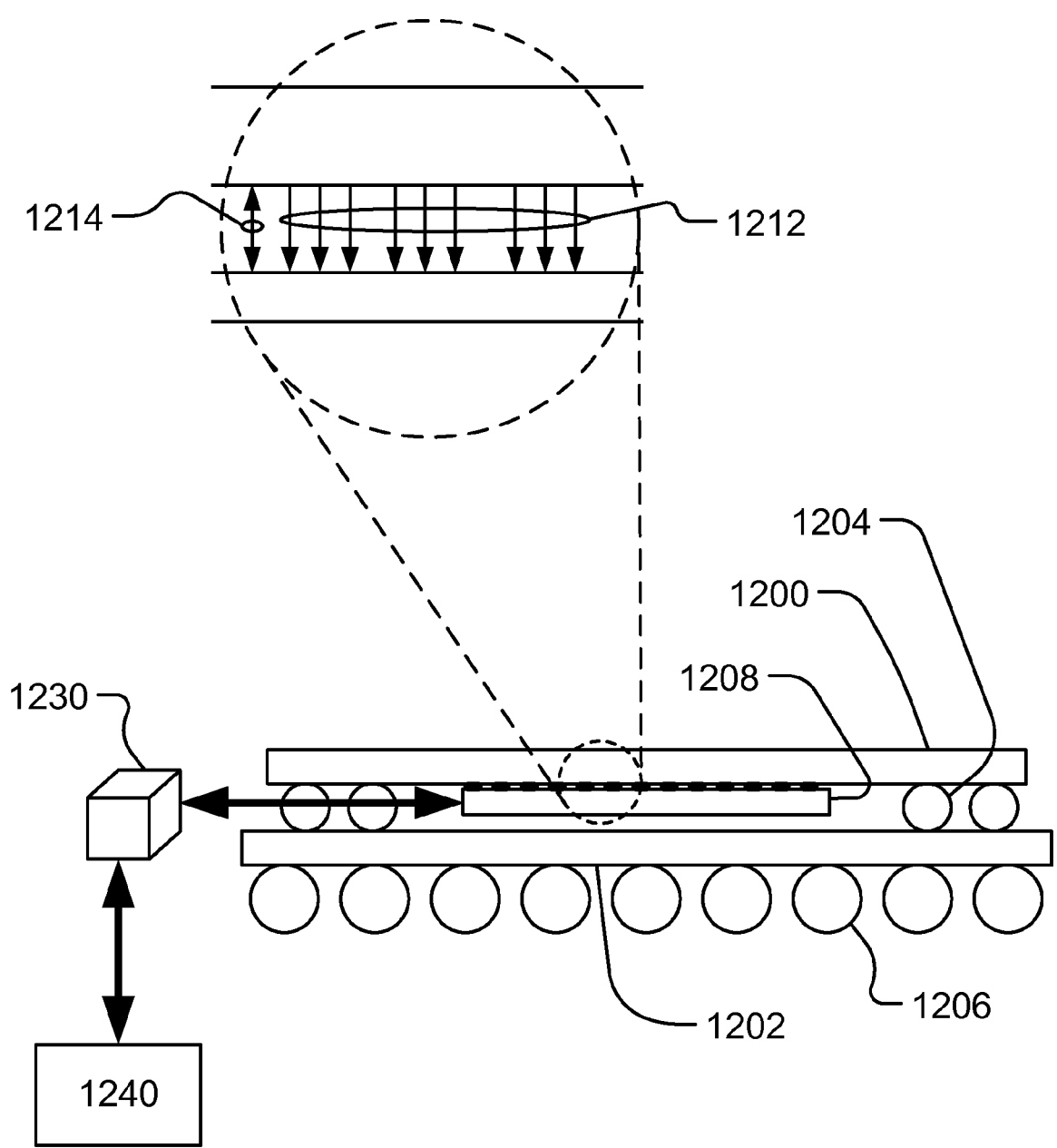
FIG. 12 illustrates Lab-On-Chip using MPIF.

In an embodiment of this invention, e.g., as depicted in FIG. 12, MPIF is placed strategically a die substrate (1208) (here referred to as on Lab-on-Chip (LoC)) to provide datapath/signal-path connectivity/probing (1212) to the prototyping or the production device (1200). In one embodiment, these connections are configured to be triggered on series of events and the data-path to be captured, e.g., into large memory buffers, e.g., available on the LOC substrate (1208). In an embodiment, the data in the LOC memory is examined by a logic analyzer or a computing device (1240) via a probe card (1230). For example, the probe card reads the memory content through LOC substrate (1208), MPIF (1214), the production substrate RDL, the bumps (1204) placed on the production device (1200), the package substrate (1202), and the package balls (1206). In one embodiment, the large number of pads on MPIF allows sampling many ports on logic blocks, gates, or transistors on the production device, which would otherwise be inaccessible or only indirectly accessible. In one embodiment, the circuitry on the LOC substrate selects a set of MPIF pads to sample, and programmatically switches the signal from those MPIF pads to the LOC's memory. In one embodiment, the selection of the MPIF pads (to sample) is driven by the programming signal from the logic analyzer/computing device (1240). In one embodiment, the selection is driven by the signal from the production substrate and/or the logic blocks on LOC substrate.

In one embodiment, LoC is used for debugging a complex IC or SoC, which for example do not have effective means of debugging on-chip circuitry. In such an embodiment, LOC allows seamless interface to on-chip signals and buses to trap and capture events for real-time debugging. In one embodiment, using a simple low cost RDL after debugging the SOC or IC, removes the debugging feature for production runs. Using MPIF to capture the signals from the chip under test significantly increases the capture rate as well as the number of signals captured compared to other approaches. For example, in one embodiment, the capture rate on the LoC is in order of (but not limited to) 500 MHz. Other capture rates are also part of the scope of this invention.

Figure 13:
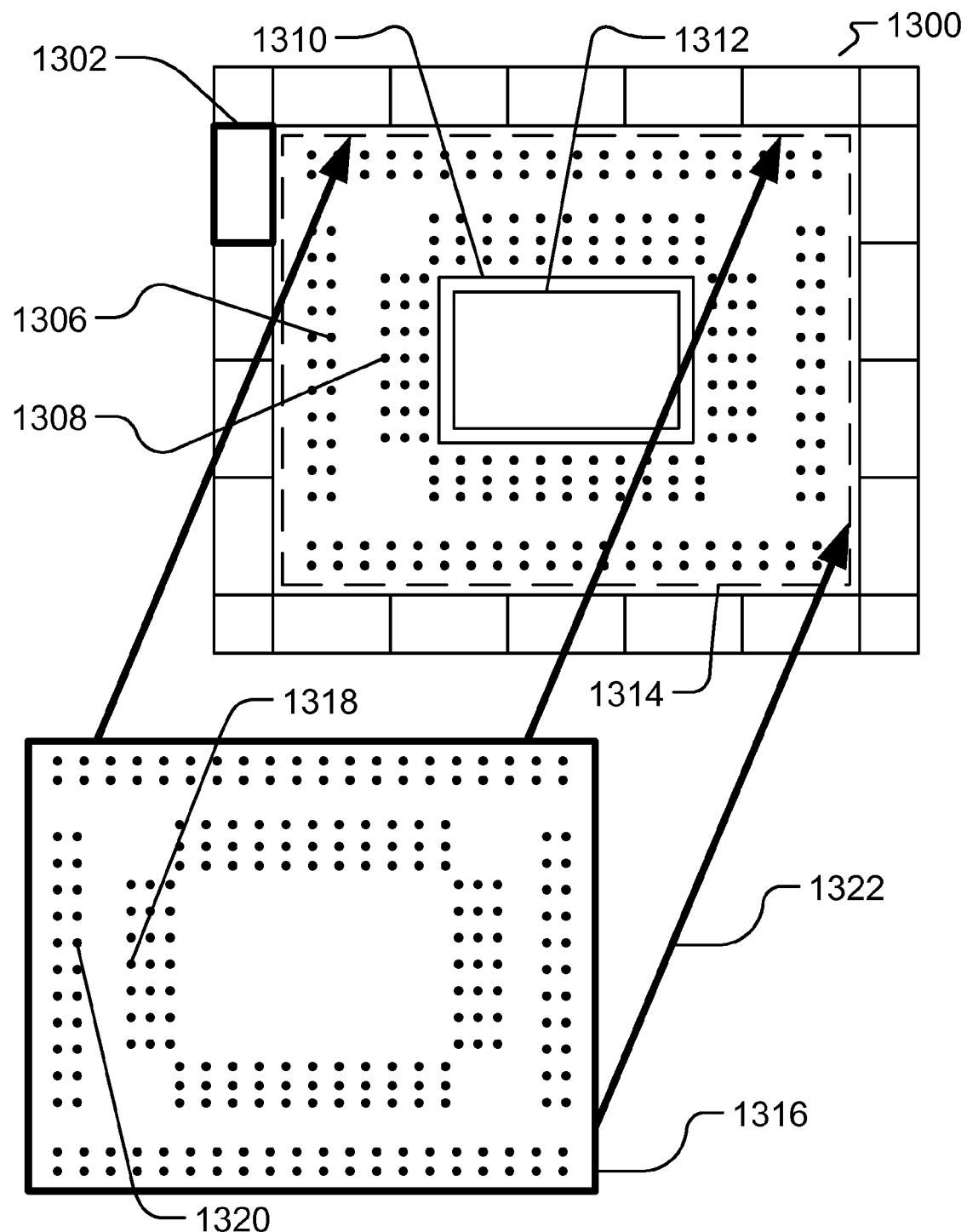
FIG. 13 illustrates programming a base platform (e.g., multi-function SerDes platform) substrate using an overlaying die through MPIF.

In an embodiment of this invention, as illustrated in FIG. 13, the core die substrate (1300) provides a multi-function platform, e.g., multi-function SerDes platform (MFSP) and/or other MXS macro blocks such as USB, ADC, and DAC. As an example, the SerDes platform provides functionality for XAUI, PCIe Gen 1 and 2, SATA 1 and 2, and Interlaken, having one or more SerDes blocks (e.g., 1302) located at the periphery of the core die substrate (1300) and a memory management circuit (1310) and a memory module (1312) placed in the middle of the substrate. In one embodiment, the MPIF is placed on the core die substrate with a set of MPIF pads (e.g., 1308) electrically connected to, for example, the memory management/module and a set of MPIF pads (e.g., 1306) electrically connected to, for example, a SerDes block. In one embodiment, the custom design includes custom logic (1316) that is attached (1322) to the MFSP platform allowing different applications via MPIF to benefit from the same set of base functionality. This would allow reduction in resources and time associated with the development of the final product. In one embodiment, the custom design die/chip (1316) having the MPIF pads (e.g., 1318 and 1320) is flipped (1322) on the core die substrate (1300), and through MPIF, the custom design chip provides the custom application functionality by, for example, enabling electrical connectivity between an element in a SerDes block and the memory management/module through MPIF (e.g., through MPIF pads from 1306, 1320, 1318, to 1308). In one embodiment, the MFSP has a Quad SerDes block (1302).

Figure 14:
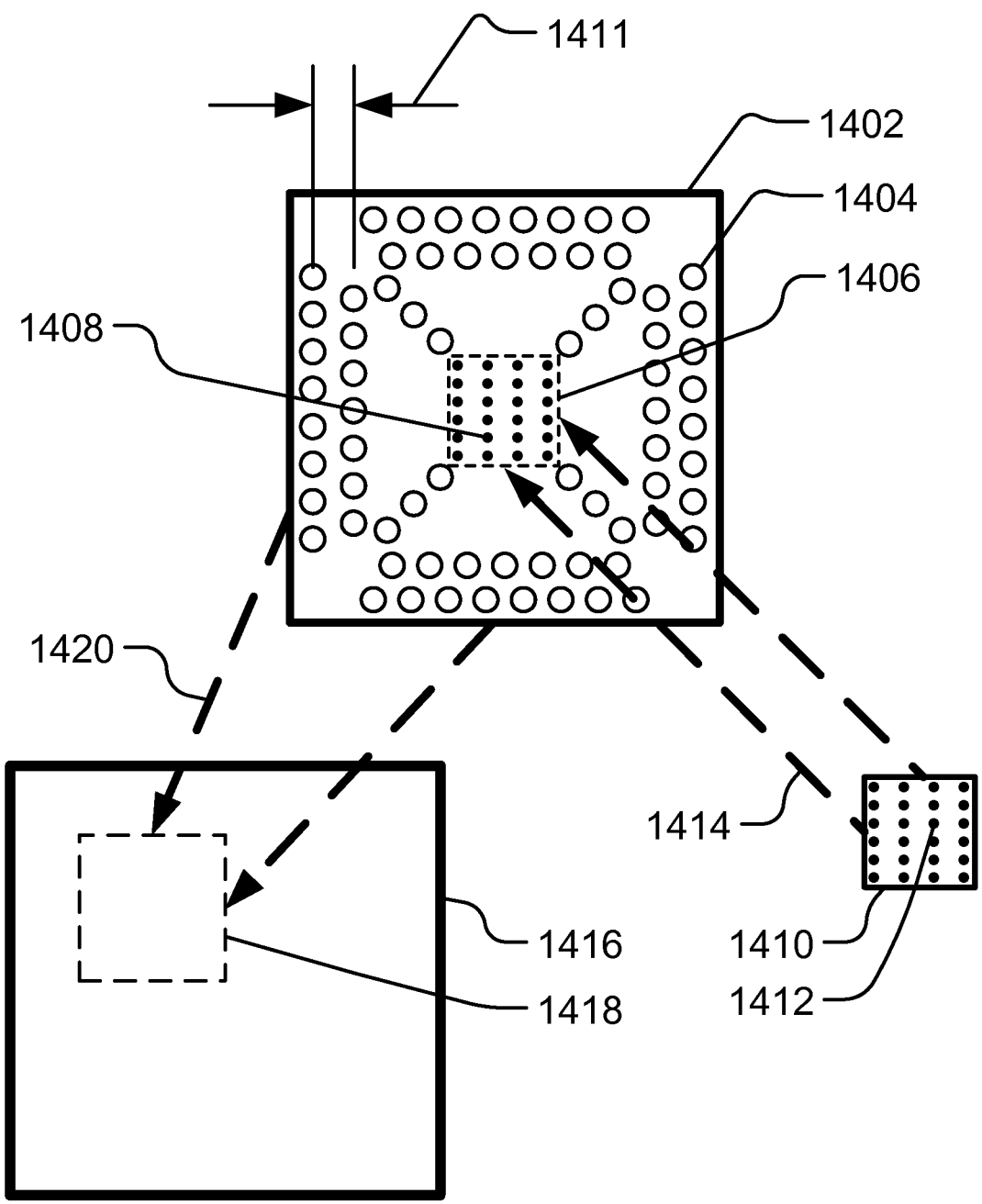
FIG. 14 illustrates an example of MPIF foot print (keep-out area) on a main die substrate for an embodiment of this invention.
Figure 15:
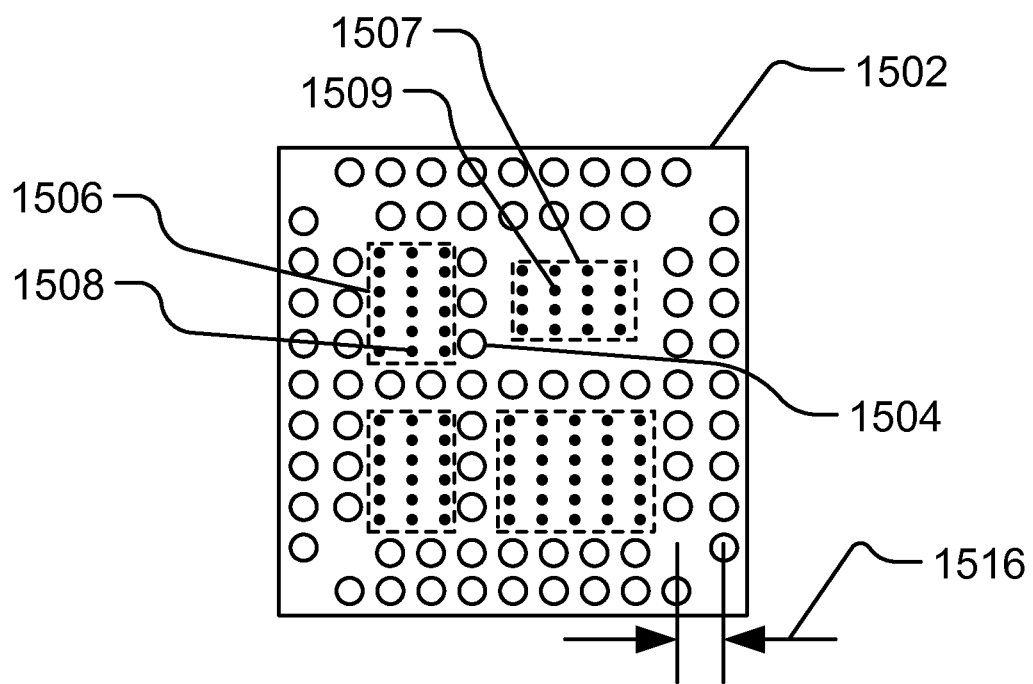
FIG. 15 illustrates an inner bump pattern for additional standard connectivity, in an embodiment of this invention.

In an embodiment of this invention, as illustrated in FIG. 14, an MPIF footprint (1406) is used as keep-out-area for I/O ring placement on a core die substrate (1402). In an embodiment, the MPIF footprint is used to flip-chip (1414) a context die (1410) with MPIF (1412) pads on to the core die substrate (1402), to provide the electrical connectivity between the context die and the core die substrate through MPIF (e.g., 1408 and 1412) pads. In an embodiment, the core die substrate is bumped (1404) and flipped (1420) on to the package substrate (1416) at a predefined location (1418). In one embodiment, a set of bumps (1404) are set in one or more columns (1411), rows, or diagonally. In one embodiment, the bumping occurs prior to flipping the context die; while in another embodiment, the bumping occurs after the flipping the context die. As illustrated in FIG. 15, in one embodiment, the core die substrate (1502) has multiple MPIF footprints (e.g., 1506 and 1507) having a set of MPIF pads (e.g., 1508 and 1509) located in each MPIF footprint. The bumps on the core die substrate are set in various patterns (e.g., one or more rows or columns (1516)). In one embodiment, some inner bumps (e.g., 1504) are placed in areas between the MPIF footprints to provide additional standard connectivity to the package substrate.

Figure 16:
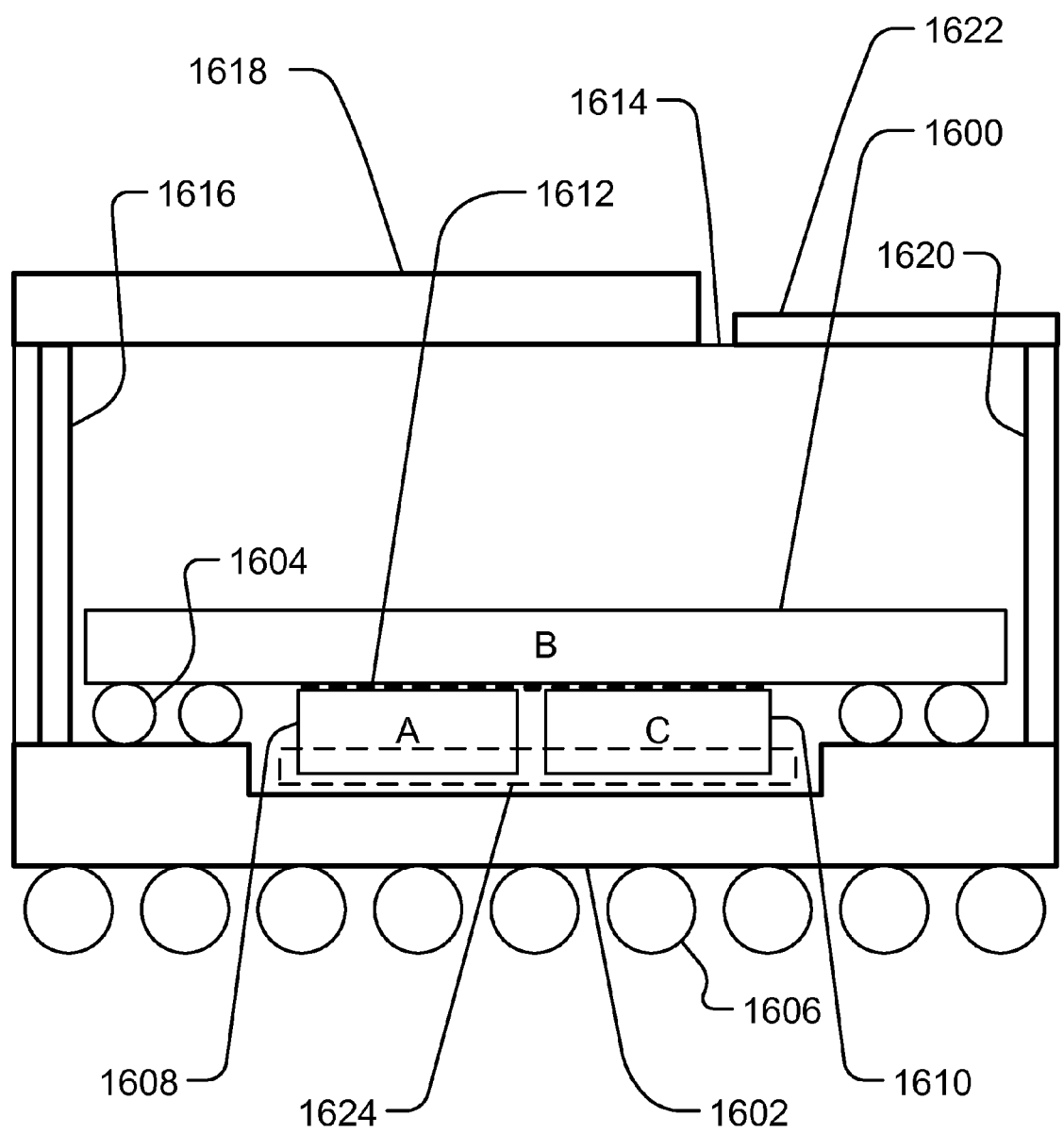
FIG. 16 depicts an example of package substrate with a blind cavity for fitting dice connected through MPIF, in an embodiment of this invention.

As illustrated in FIG. 16, in one embodiment, the package substrate (1602) includes a blind cavity (1624) to fit part of one or more context dice (e.g., IC device A (1608) and IC device C (1610)) that are flipped on a core die substrate (e.g., IC device B (1600)) which is in turn flipped on the package substrate over its bumps (1604). The context dice are electrically connected to the core die substrate through MPIF (1612). In one embodiment, the package includes other features such as heat slug (1618) and/or antenna (1622) that are connected to the package substrate through vias (1616 and 1620, respectively). In one embodiment, the package elements are protected by a molding/protective compound (1614) and the electrical connection to the package is provided through the package balls (1606).

Figure 17:
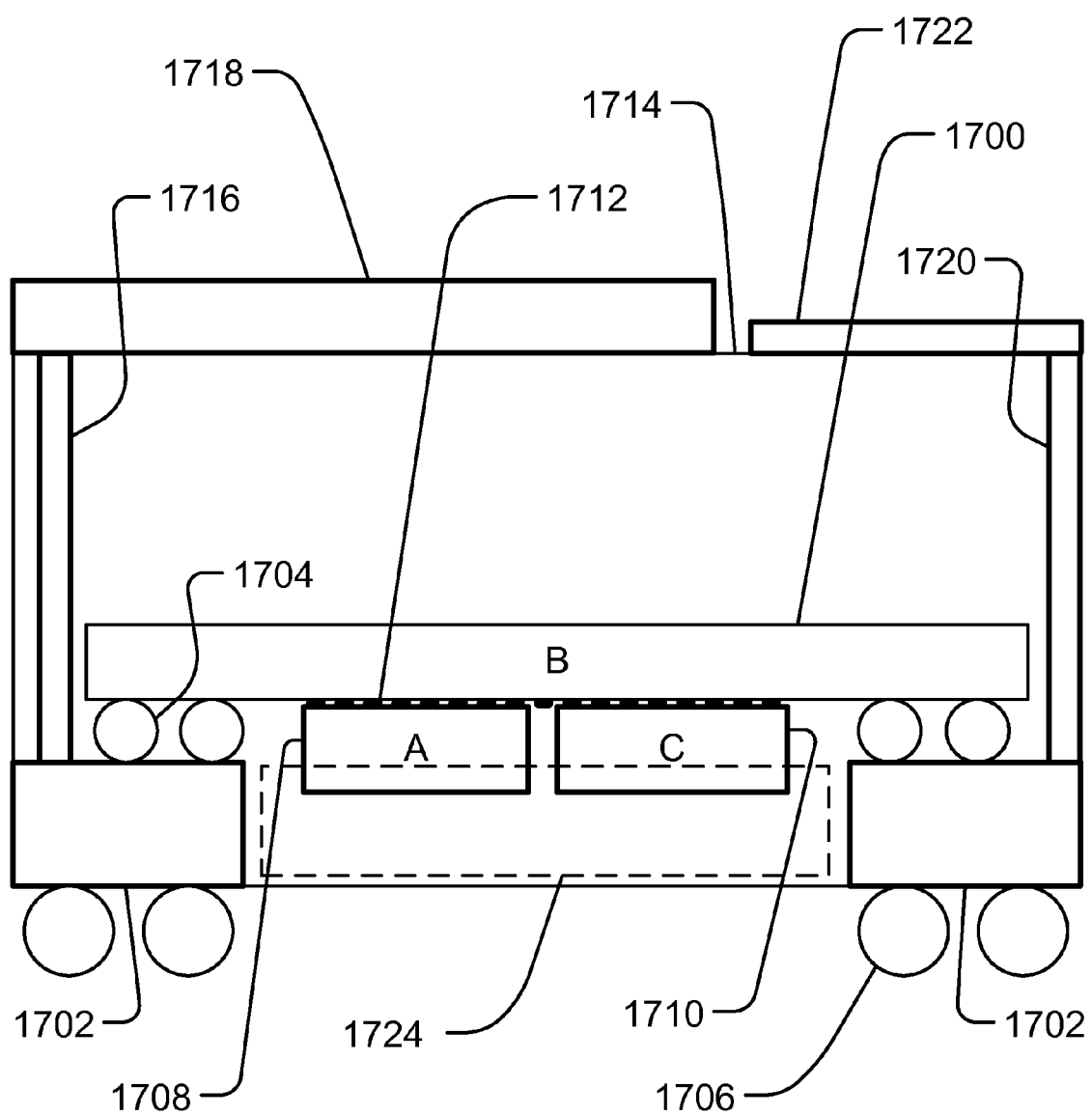
FIG. 17 depicts an example of package substrate with a through cavity for fitting dice connected through MPIF, in an embodiment of this invention.

As illustrated in FIG. 17, the package substrate (1702) includes a through cavity (1724) to fit part of one or more context dice (e.g., IC device A (1708) and IC device C (1710)) that are flipped on a core die substrate (e.g., IC device B (1700)) which is in turn flipped on the package substrate over its bumps (1704). The context dice are electrically connected to the core die substrate through MPIF (1712). In one embodiment, the package includes other features such as heat slug (1718) and/or antenna (1722) that are connected to the package substrate through vias (1716 and 1720, respectively). In one embodiment, the package elements are protected by a molding/protective compound (1714) and the electrical connection to the package is provided through the package balls (1706).

Figure 18:
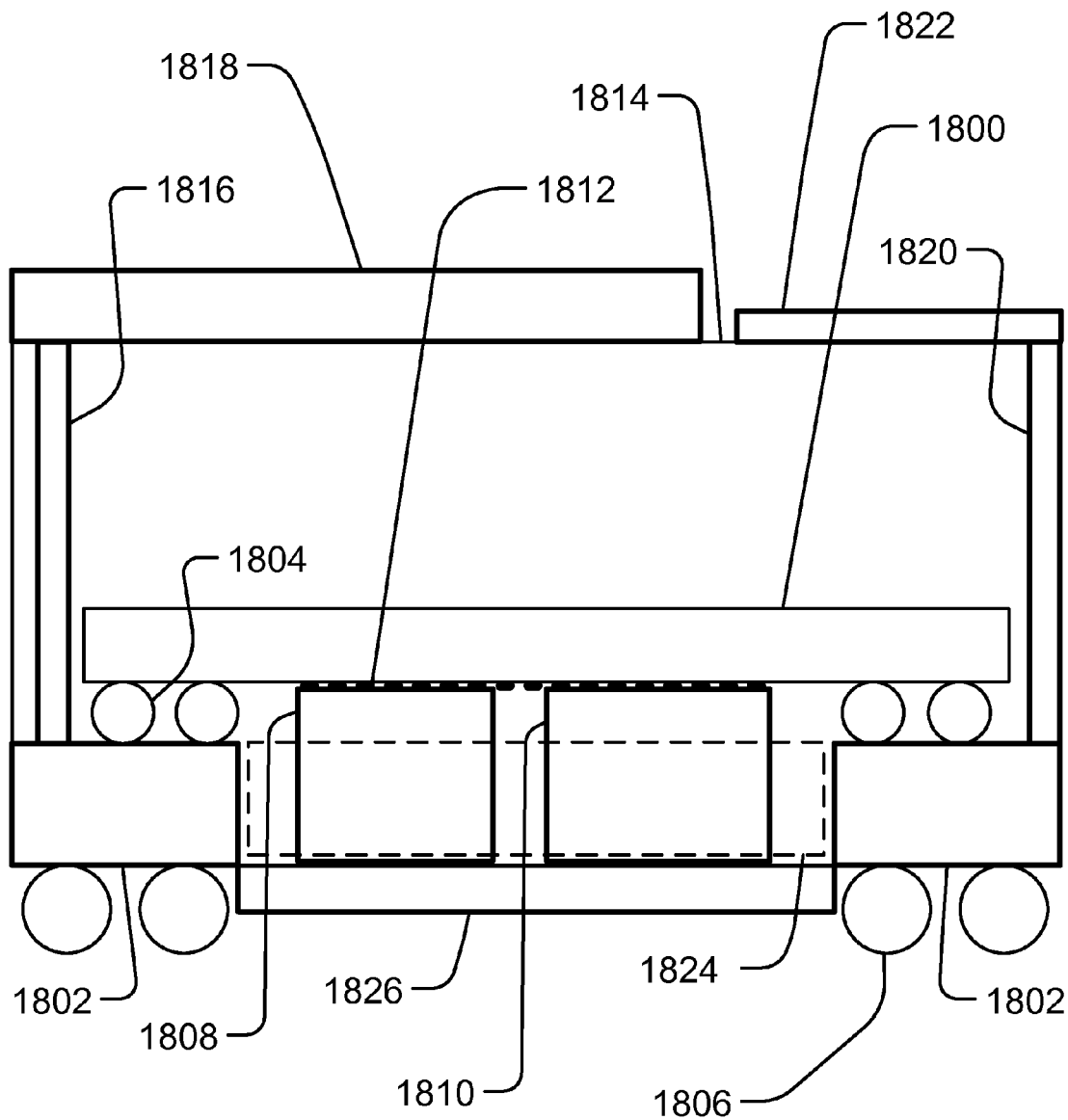
FIG. 18 depicts an example of package substrate with a cavity for fitting dice connected through MPIF while allowing for heat sinking the dice, in an embodiment of this invention.

As illustrated in FIG. 18, the package substrate (1802) includes a through cavity (1824) to fit part of one or more context dice (e.g., IC device A (1808) and IC device C (1810)) that are flipped on a core die substrate (e.g., IC device B (1800)) which is in turn flipped on the package substrate over its bumps (1804). The context dice are electrically connected to the core die substrate through MPIF (1812). In this embodiment, a heat slug (1826) is attached to the context die(s) exposed through the cavity (1824). In one embodiment, the package includes other features such as heat slug (1818) and/or antenna (1822) that are connected to the package substrate through vias (1816 and 1820, respectively). In one embodiment, the package elements are protected by a molding/protective compound (1814) and the electrical connection to the package is provided through the package balls (1806).

Figure 19:
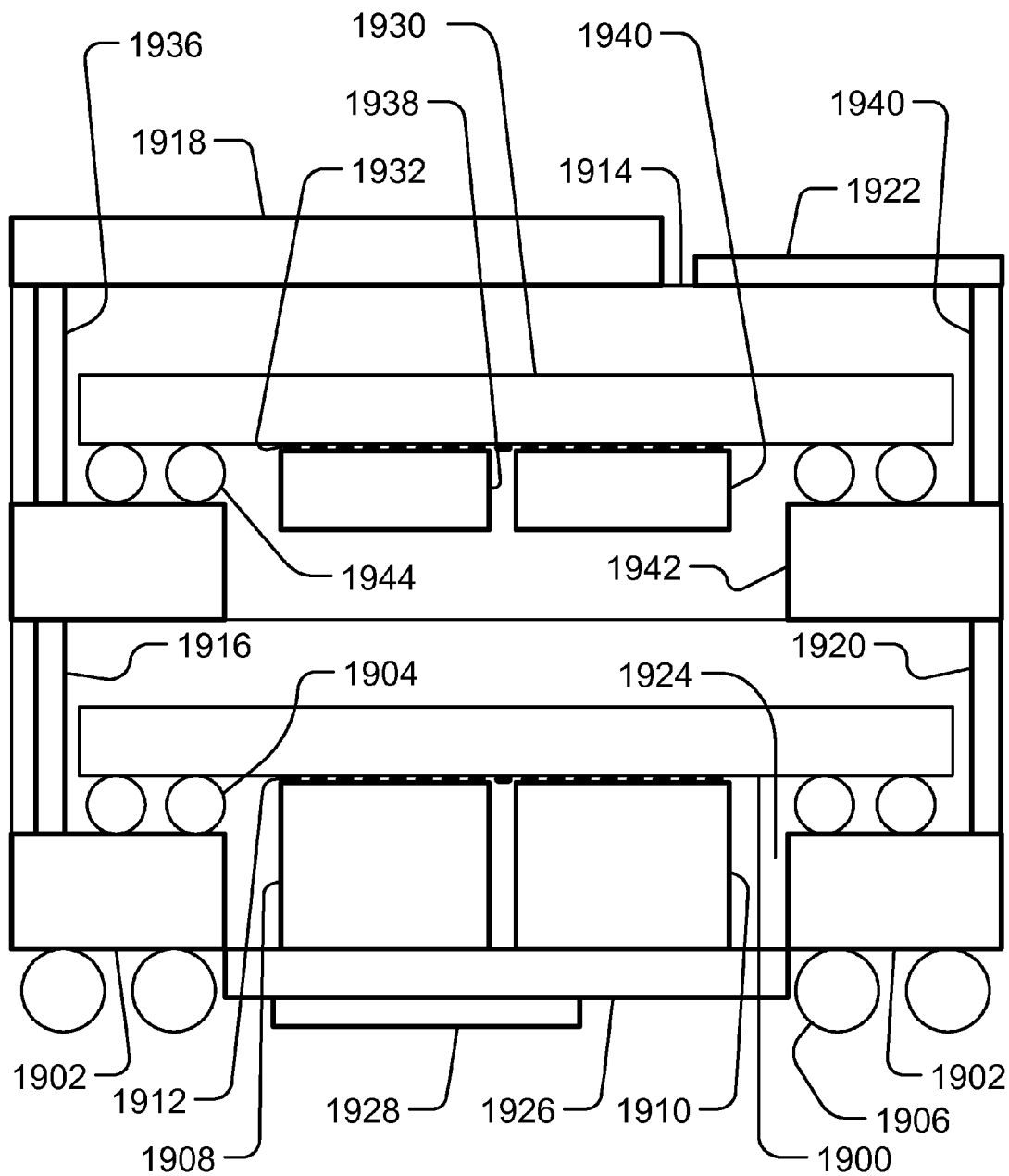
FIG. 19 depicts an example of stacked package substrate having cavities for fitting dice connected through MPIF, in an embodiment of this invention.

FIG. 19 illustrates an embodiment of this invention in which multiple package substrates (e.g., 1942 and 1902) are stacked vertically and are electrically connected through mold (1914) vias (e.g., 1916 and 1920) from the lower package substrate (1902) to the upper package substrate (1942). In one embodiment, a lower package (1902) includes an antenna (1928) placed on a heat slug (1926) which is attached to the context die(s) (e.g., 1908 and 1910) exposed through a through cavity (1924) in the lower package substrate (1902). In one embodiment, the upper package substrate (1942) has a through mold via to fit part of context die(s) (e.g., 1938, 1940). The context die(s) (e.g., 1908 and 1910, 1938 and 1940) are flipped and electrically connected through MPIF (1912, 1932) to core die substrates (1900, 1930) which in turn are flipped on the package substrates (1902, 1942) over their bumps (1904, 1944), respectively. In one embodiment, the package includes other features such as heat slug (1918) and/or antenna (1922) that are connected to the upper package substrate (1942) through vias (1936 and 1940, respectively). In one embodiment, the package elements are protected by a molding/protective compound (1914) and the external electrical connection to the package is provided through the package balls (1906) attached to the lower package substrate (1902).

Figure 20:
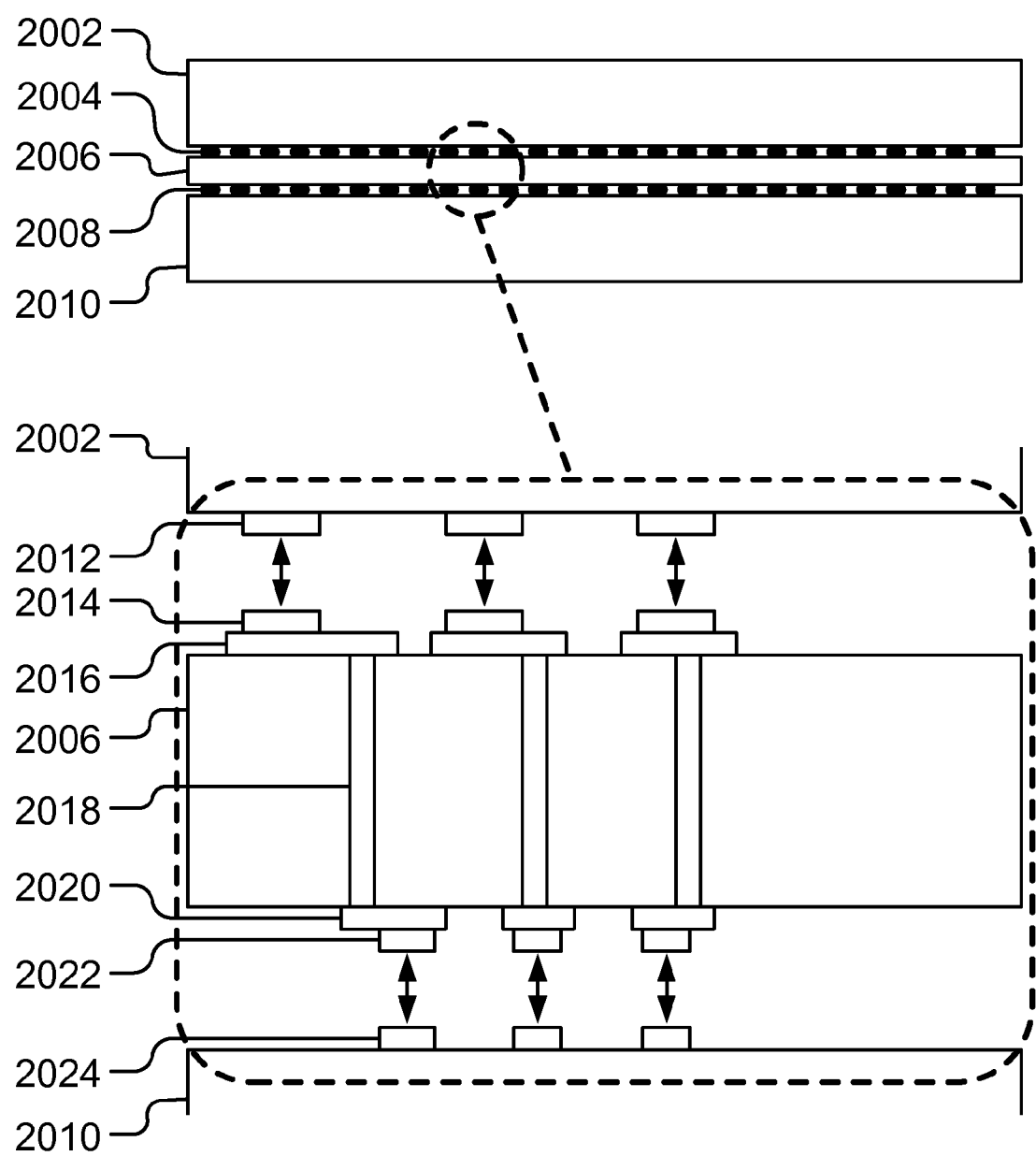
FIG. 20 illustrates an interposer layer providing electrical connection between the stacked dice using MPIF on each side, in an embodiment of this invention.

FIG. 20 illustrates an embodiment on this invention where an interposer (2006) is used to make a face to face electrical connection between two dice (2002 and 2010) via the MPIF (2004 and 2008) on the corresponding surfaces. In one embodiment, the interposer (2006) is used to match the MPIF pads (e.g., 2012) on one substrate (2002) to the MPIF pads (e.g., 2024) of the other substrate (2010) and provide the electrical connection through conducting layer(s) (e.g., 2016 and 2020) and vias (e.g., 2018) in the interposer (2006) between the matching MPIF pads (e.g., 2014 and 2022) on the contacting surfaces the interposer (2006). Various materials can be used for the interposer, such as silicon, FR-4, bis-maleimide triazine (BT), and cyanate ester (CE), or polyimide. In one embodiment, the interposer contains multiple metal/conducting layers/planes and vias for routing electrical signals and/or power, on either side. In one embodiment, the connecting vias through the interposer are lined up with one set of MPIF pads on one of the surfaces, while a conducting distribution layer on the opposite surface of the interposer is used to electrically connect the vias to the set of MPIF pads on the interposer's opposite surface. In one embodiment, the interposer is used to match MPIF pads of two dice with different pad contact pitch, shape, or configuration. Interposer may have various shapes or sizes in various embodiments of this invention. Interposer may include or support other electrical components such as an antenna in various embodiments of this invention.

Figure 21:
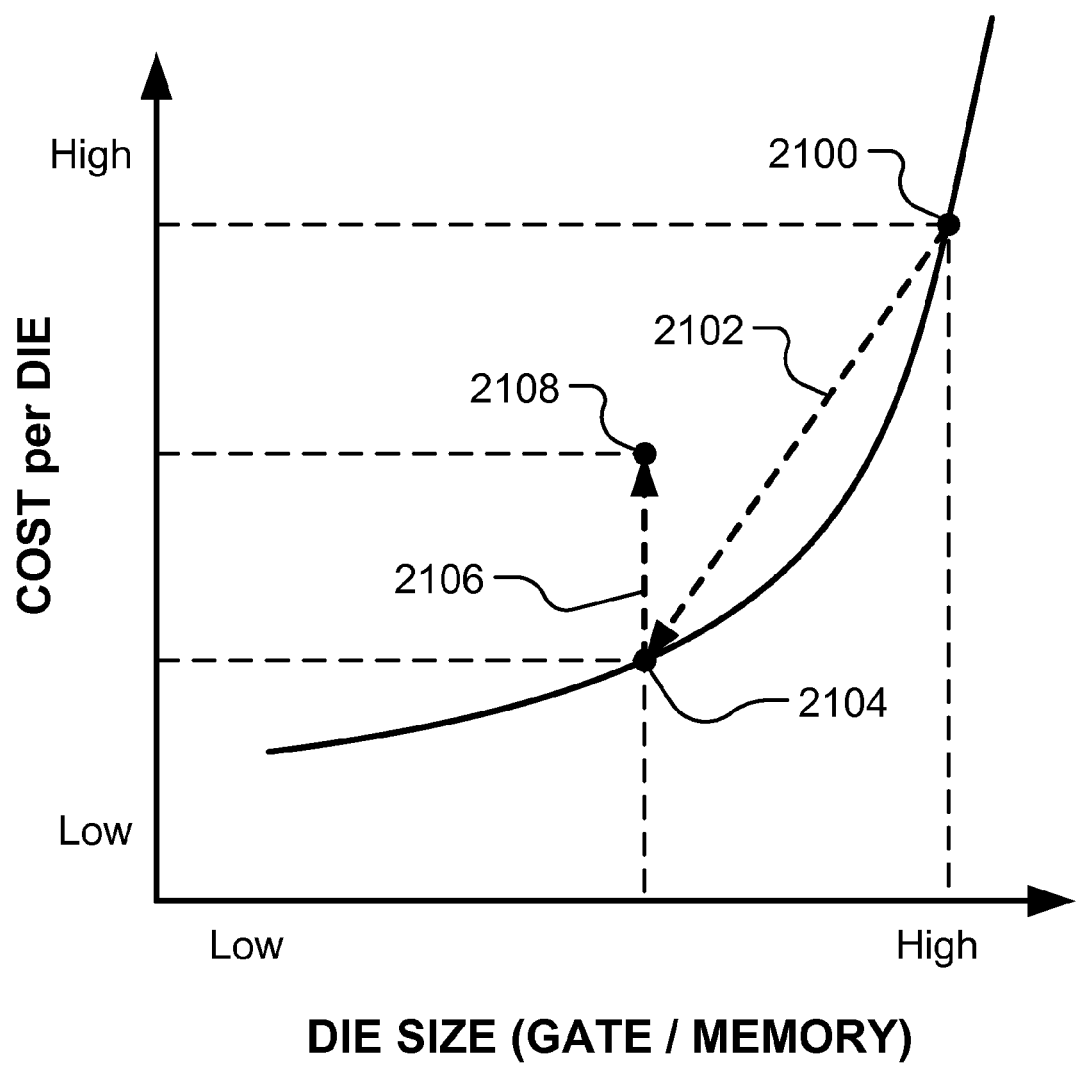
FIG. 21 qualitatively illustrates the cost and die size/gate/memory relationship and reduction of the cost due to core stacking, for an embodiment of this invention.

FIG. 21 qualitatively illustrates the cost per die versus die size (number of gates/amount of memory). One factor affecting the cost per die is the reduction in die yield due to increase in the number of gates or devices with increase in the die size. For example, compared with FPGA, an embodiment of this invention uses smaller die size as the programming interconnect switches are pushed to a context die. This is represented by the reduction of the cost (2102) from original (2100) (e.g., FPGA) to that of a core die substrate (2104). Point 2108 represents a total die cost with core staking of context die having a smaller size. In one embodiment, the increase in cost due to core stacking (2106) is still less than the reduction in cost due to die size reduction (2102). In addition, the initial development cost/effort/time is significantly reduced compared to that of structured ASIC as mentioned earlier.

Figure 22:
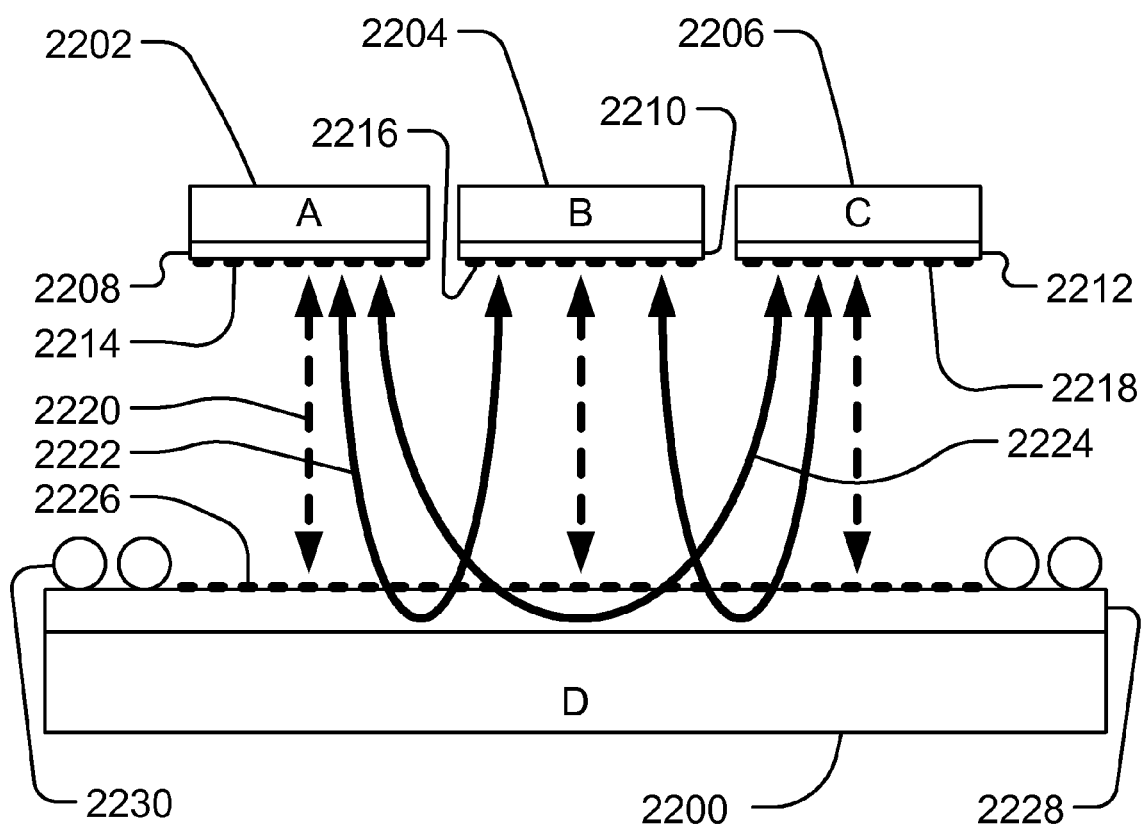
FIG. 22 illustrates CoreStack to CoreStack electrical connections, in one embodiment, through a Base-Core die substrate by flipping CoreStacks on the Base-Core die substrate.
Figure 23A:
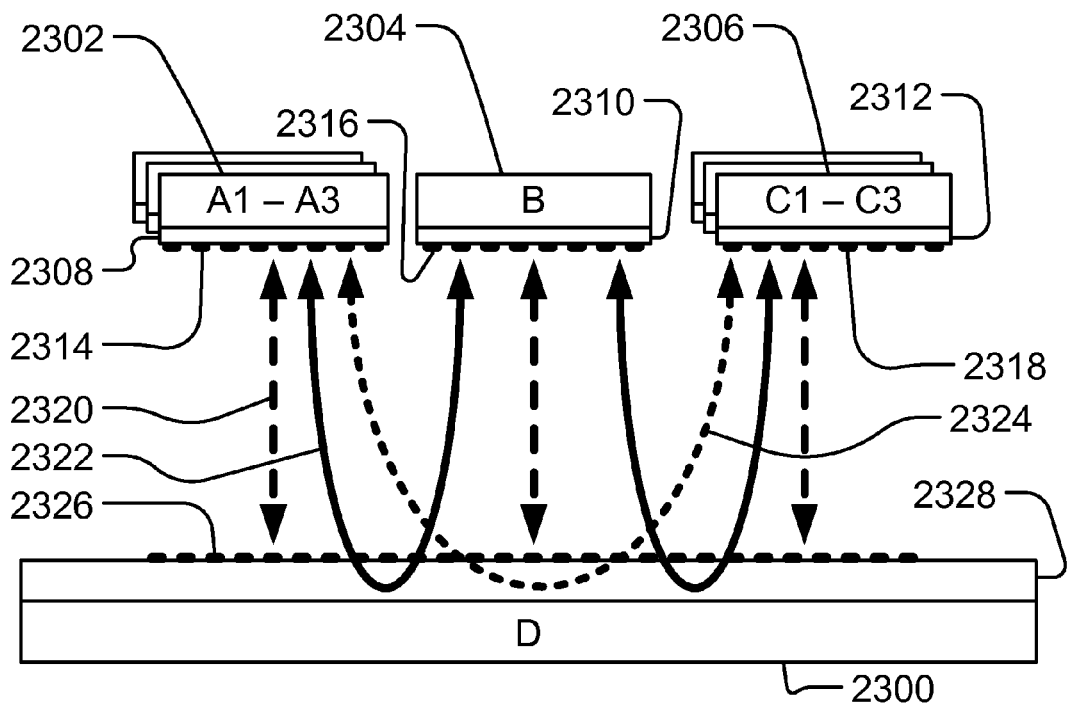
FIG. 23(a) illustrates CoreStack to CoreStack electrical connections via a CoreStack Switch, in one embodiment, through a Base-Core die substrate by flipping CoreStacks on the Base-Core die substrate.
Figure 23B:
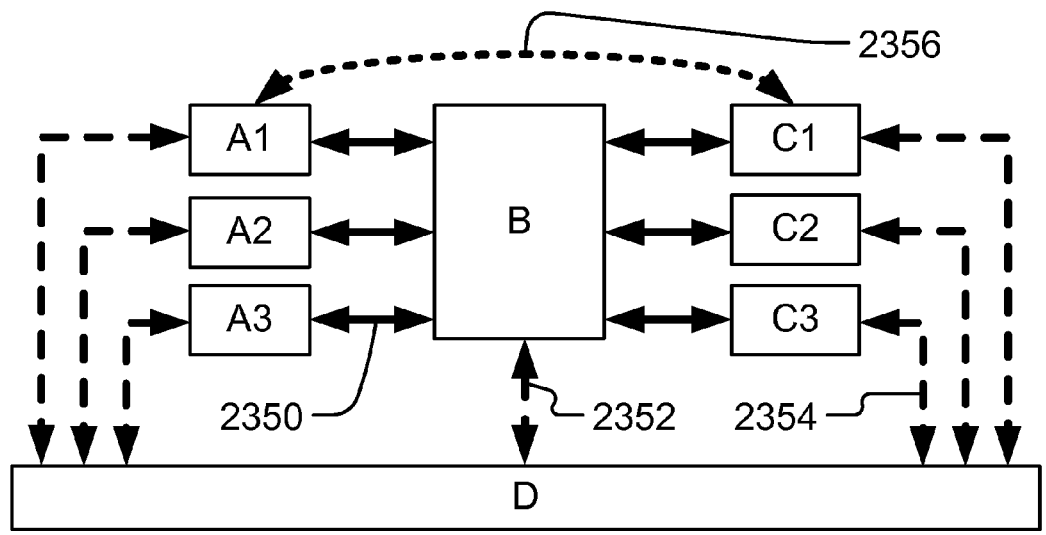
FIG. 23(b) logically illustrates the electrical paths between CoreStacks, CoreStack Switch, and Base-Core die substrate, in one embodiment.

For the purposes of FIGS. 22, 23(a), and 23(b), CoreStack is a die that is flipped (and stacked) on a core die substrate to provide electrical connections at their interface.

In one embodiment of this invention, as illustrated for example in FIG. 22, two or more CoreStacks (e.g., A (2202), B (2204), and C (2206)) are electrically connected together (as indicated by 2222 for connection between A and B, and 2224 for connection between A and C) without reaching the Base-Core's (D (2200)) transistors/gates. Such electrical connections are made via the CoreStacks' "bottom" RDL (e.g., 2208, 2210, and 2212) and CoreStacks' MPIF pads (e.g., 2214, 2216, and 2212), through MPIF pads (2226) of Base-Core (2200), and "top" RDL (2228) of Base-Core (2200). In one embodiment, additional metallization/conducting layer(s) on base-Core (2200) facilitate such electrical connections. In one embodiment, similar level of dense interconnects for face-face MPIF is provided for CoreStack-to-CoreStack connections via Core-Base's MPIF and metallization/conducting layer(s). In one embodiment, electrical connections (as indicated by dash lines, e.g., 2220) are also provided between CoreStack(s) (e.g., A, B, or C) with Base-Core (2200) through their respective MPIF pads. In one embodiment, Base-Core is bumped (2230) in order to be flipped on a package substrate (not shown).

In one embodiment of this invention, as illustrated for example in FIG. 23(a), one or more CoreStacks (2302) (e.g., represented by A1 to A3) are electrically connected/switched to one or more CoreStacks (2306) (e.g., represented by C1 to C3) via a CoreStack switch (2304) (represented by B). The switched connections, which are illustrated by solid lines (e.g., 2322) in FIG. 23(a), are made through CoreStacks' "bottom" RDLs (e.g., 2308, 2310, 2312) and CoreStacks' MPIF pads (e.g., 2314, 2316, and 2318), through Base-Core's (2300) MPIF pads (2326) and Base-Core's "top" RDL (2328). As illustrated in a logical diagram in FIG. 23(b), CoreStacks A1 through A3 are electrically connected (e.g., 2350) to CoreStack switch B, and CoreStacks C1 through C3 are electrically connected to CoreStack switch B (as depicted by solid arrow lines in FIG. 23(b)). In one embodiment, the electrical connections (as indicated by dash lines, e.g., 2320, 2354, or 2352) are also provided between CoreStack(s) (e.g., A1-A3, B, or C1-C3) with Base-Core (D)'s gates/transistors through their respective MPIF pads. In one embodiment, the MPIF pads and metallization/conducting layer(s) on Base-Core provide electrical paths (e.g., 2324, 2356) between CoreStacks (e.g., A1-A3 to C1-C3) without going through the CoreStack switch (e.g., B).

Figure 24:
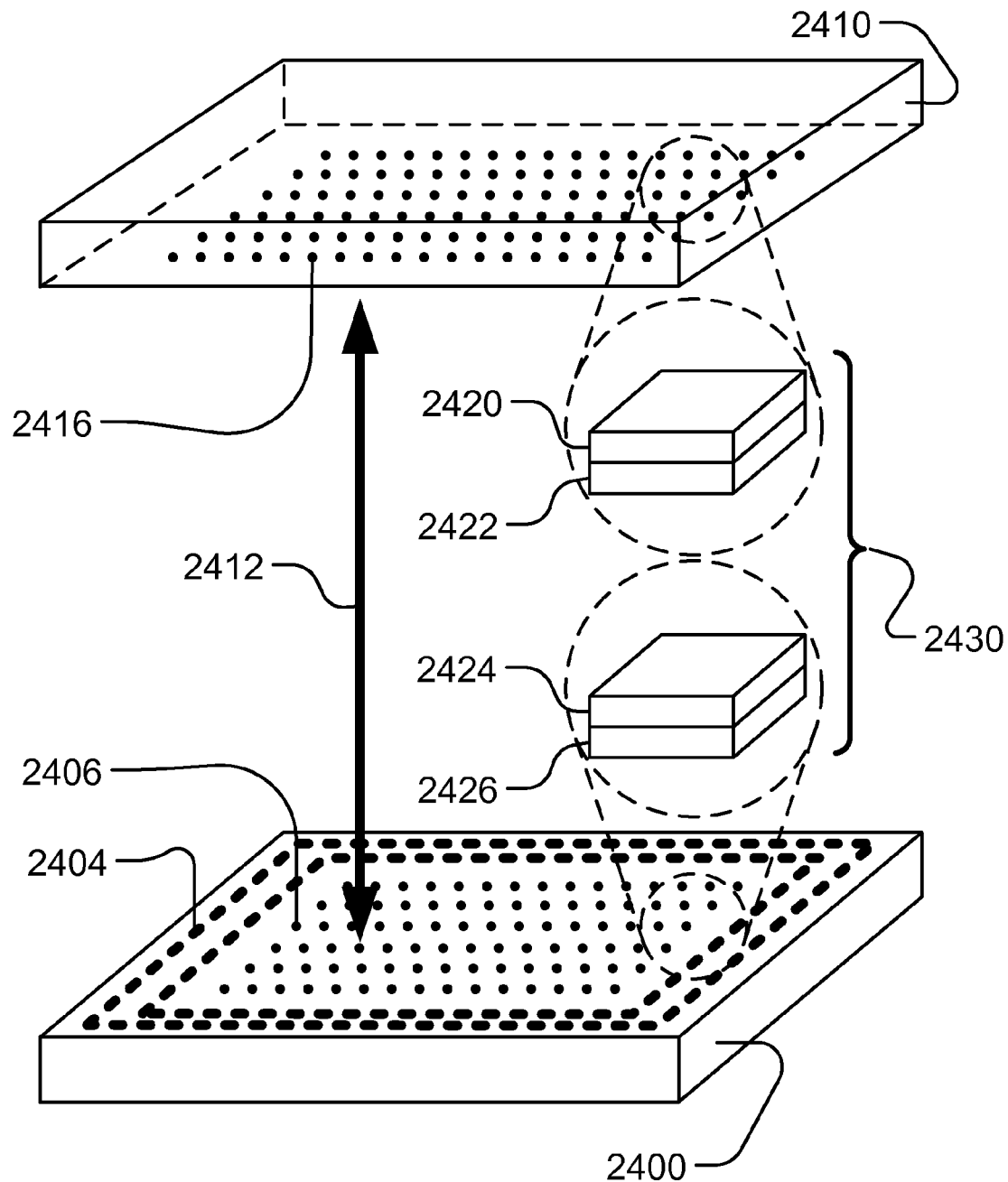
FIG. 24 illustrates a soft I/O by flipping a soft logic/context die on a core I/O template die, in one embodiment of this invention.

In one embodiment of this invention, a soft (i.e., programmable) Input/Output (I/O) is provided by leveraging the 3D gate stacking (2412) of a context/programming die (2410) on a core-base (2400) with I/O connections (e.g., I/O ring 2404), as illustrated for example in FIG. 24. In one embodiment, an I/O template (2426) is provided on the core-base (2400) that maps to various I/O basic structures such as Low-Voltage Differential Signaling (LVDS), High-Speed Transceiver Logic (HSTL), and/or Stub Series Terminated Logic (SSTL), that can be used to construct higher level I/O structures such as Double Data rate Synchronous dynamic random access memory (DDR2), Double-Data-Rate Three (DDR3), System Packet Interface (SPI4), Universal Serial Bus (USB), and/or MXS type interfaces. In one embodiment, electrical connectivity between the basic elements of the I/O structure on the I/O template "bottom" (2426) is provided via core-stacking soft logic (i.e., I/O configuration slot (2420)) through one or more metal/connectivity layer(s) and pads (2424) on the base template used for connecting to the soft-logic and one or more metal/connectivity layer(s) and pads (2422) on the soft logic, in order to form soft I/O (2430). In one embodiment, such core-stacking is provided through MPIF formed by the metallization/conducting layers and pads (e.g., 2406 or 2424, and 2416 or 2422) of the context die (2410) and the core base (2400). An embodiment provides the ability to reconfigure I/O pending the interface requirements. In one embodiment, e.g., for production, the base die (2400) is metalized (e.g., by fusing the MPIF pads (2406)) to adopt the soft I/O configuration. In one embodiment, the Soft Logic (2420) is used to configure the I/O Slot (2426). In one embodiment, e.g., for production, the metal connectivity to Soft Logic is fused to fix I/O configuration by eliminating the Soft Logic block. For an embodiment, the fusing of the MPIF pads (2406) is illustrated in FIG. 7(b).

For the illustration purposes, the die bumps shown as round in this disclosure; however, the bumps may have any shape or be in various sizes for the purpose of this invention.

For the illustration purposes, MPIF pads are shown as rectangular in this disclosure; however, these pads may have various shapes (e.g., round, polygon), size or pitch, or have any configuration for the purpose of this invention. For the purpose of this invention, the contact pads can be extruded, deposited or assembled or self-assembled with any processes. In one embodiment, the MPIF pads are made of carbon nanotube/fiber. In one embodiment, the MPIF pads are made of gold or copper posts electroplated or deposited and patterned.

For the illustration purposes, the context die is shown flipped on the core die substrate in this disclosure; however, the core die substrate may also be flipped over the context substrate for the purposes of this invention to form MPIF at the contacting surface.

For the illustration purposes, the MPIF pads are shown at the same side of die substrate as the main circuits on the die, in this disclosure; however, other embodiments where the main circuit on the die is on its opposite side (e.g., with connection paths to the MPIF pads through substrate vias) are also included in this invention. In such an embodiment, to form MPIF, the flip-chip is done on the MPIF pad side.

For the illustration purposes, few context dice are shown attached to a core die substrate in this disclosure through MPIF; however, any number of dice assembled in any configuration is included in this invention.

For the illustration purposes, an embodiment is specified with 10 k to millions of MPIF pads per $cm^2$; for example, an embodiment with number of MPIF pads in range of 10,000 to 100,000,000 is included in this invention. However, other embodiments having number of pads of about hundreds or thousands are also included in this invention. For example, an embodiment with number of MPIF pads of at least 4000 is included in this invention.

Any die assembly process is in scope of this invention, e.g., wafer-wafer bonding (which can be metal to metal, or any alloy combination of material), through-die-via (with die being any material such as Si, SiGe, GaAs, InP, and SiC), wirebond, flip-chip, or any combination of above.

For the purpose of this invention, between (or in contact with) any component(s) (e.g., dice or interposers), any material(s) (e.g., polymer, molding or adhesive) may be used for the purpose of reduction of stress, cracks, warpage, or delamination or to enhance reliability or thermal dissipation (e.g., with spatially isotropic or anisotropic conductive materials).

For the purpose of this invention: Any molding/protective compounds of any shape, size, or materials can be used; the mold(s) can contain cavity/cavities of any sizes/shapes; the mold(s) or protective compounds can be multi-layer materials of any forms/shapes or can contain conductive paths (e.g., vias, filled/hollow coppers blocks); the mold(s) can contain planes; or the mold(s) can be used as substrate, for example, for routing purposes or making connections.

In an embodiment of this invention, through mold via(s) is used, for example, for the purpose of stacking other components on the top of the base package or provide a means of connection. Various embodiments of this invention use through mold via(s) of various forms or shapes.

For the purpose of this invention: An antenna of any forms/shapes can be mounted or integrated any place on/in the package(s) (e.g., on the top/bottom/edge of the molding compounds, top/bottom/edge of the package substrate) and connected to the package using a conductive path. For example, in one embodiment, an antenna mounted on the mold is connected through mold via(s).

For the purpose of this invention: any number of components/packages can be stacked vertically/horizontally; package substrates can have cavity of any forms or shapes; heat slug or other materials of any forms or shapes can be integrated any place on the package/packages (e.g., on the top molding compound) for thermal dissipation and thermal management purposes, e.g., through mold(s) via(s).

For the purpose of this invention, passive components (e.g., capacitors, inductors, and resistors) of any forms/shapes/materials may be mounted or integrated in the package/packages.

For the purpose of this invention: package(s) may have cavity(s) of any forms or shapes; the cavity(s) may be of any depth or cut all the way through the substrate; a heat slug/heat-spreader (e.g., made of copper or other materials), an antenna, or other components (e.g., passive components) may be mounted or integrated on the cavity, e.g., at the base of the cavity (on the Ball Grid Array (BGA) side) or anywhere on/in the package substrate; or the spreader may be grounded by any means (e.g., using via(s)).

In one embodiment, a heat slug/heat spreader material block is used as an antenna. In one embodiment, such antenna is patterned or as one solid piece. For the purpose of this invention: the heat spreader may be constructed by means (e.g., blocks of any size/shapes, or from a collection of individual spreaders); the heat slug(s) or antenna(s) may be stacked on the top of each other; via(s) or other conducting materials/paths may be used to connect the slugs/antennas to the substrates/devices; or heat spreader may be embedded within the molding compound.

In one embodiment, a low temperature, high density wafer to wafer connection is used to form the MPIF. In one embodiment, a non-reflowable material(s) (e.g., copper) is used at the base of MPIF pad with a reflowable material (e.g., solder) as a capping material for the pad. In one embodiment, after aligning the dice (or a die and an interposer) to be contacted at their MPIF pads, heat and/or compression is applied to enhance the contact reliability. In one embodiment, the dice are locked in place before forming the contacts between the pads, e.g., by using vacuum holds or a molding material. In one embodiment, molding material is applied to the dice after forming MPIF pad connections between the dice to enhance the reliability of the contacts. Other embodiments of this invention use various means to form electrical contacts between the MPIF pads of the dice.

In an embodiment of this invention, instead of bumping and flipping a core die substrate on a package substrate, as shown for example on FIGS. 2, 7(a), (b), 9(a)-(c), 11, 12, and 16-19, the core die substrate is flipped and electrically connected to the package substrate through MPIF patterns (not shown). In an embodiment, a cavity in package substrate, for example as shown in FIG. 16-19 accommodates/fits the context IC(s) already flipped on the core die substrate, so that the context IC(s) does not prevent MPIF connections between the core die substrate and the package substrate.

In one embodiment, the context die, the core die substrate, or the package substrate comprises organic semiconductor devices, layers, or components. In one embodiment, interposer comprises of organic semiconductor devices, layers, or components.

OTHER EMBODIMENTS & EXAMPLES

As mentioned above, FPGAs are widely used in many applications, due to their versatility and benefit in various areas, e.g. a) Field Programmability and b) limited or no upfront Non Recurring Engineering cost. However, the FPGA has limitations in 1) area, 2) power, 3) form factor or body size, 4) performance and 5) cost effective path to high volume manufacturing, that prevents the solution to be effectively applicable in many applications, where low power consumptions is high on the list of requirements, such as mobile devices, tablets, etc. Also, device form factors limits deployment of some FPGAs in areas where space is the main constraint, such as hand held micro devices, etc.

Alternative to FPGAs are offered in the form of ASIC (Application Specific Integrated Circuit), Standard Products, Structured ASIC and in some cases COT (Customer Own Tooling). With these solutions, the die area is efficiently used for functions related to the features of the targeted application. In other words, the solution is tailored for the application. As a result, much less, or no gate level configurability, is offered, where the die solution is fixed to the specific application. Alteration to post die/silicon is not available, or would cost significantly, as well as time, to get die ready for evaluation (e.g. millions of dollars in cost, and 12 to 24 months of (long) design cycle).

In addition, the upfront cost for ASIC implementation and manufacturing can exceed several million dollars, as well as the complexity of the design and integrated intellectual property. Generally, for low to moderate volume applications, ASICs or COT solutions are not the ideal option, due to the challenges stated.

Many designers defer from using ASIC, to avoid the NRE and the delay in getting the custom solution, in favor of using FPGA.

Figure 25:
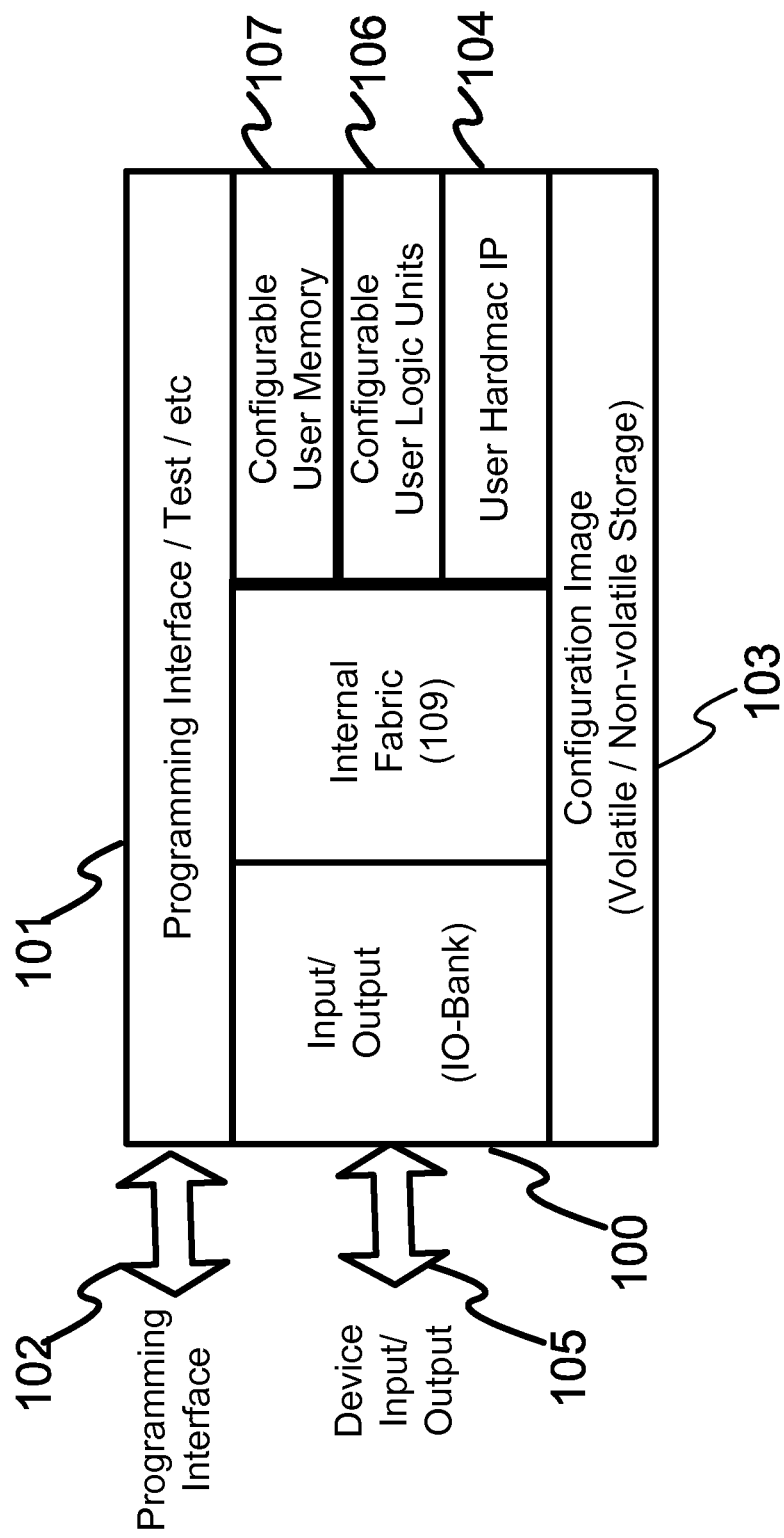
FIG. 25 shows a FPGA Block Diagram. (FPGA Building Blocks)

Our examples below show various solutions to optimize this situation:

FIG. 25 illustrates the prior art, of a typical FPGA building blocks—(100) the Input and Output block connected to other devices placed on the same PCB via Device Input/Output (105). (109) represents Internal Fabric as a massive fabric providing the interconnects among all the blocks within the FPGA. (104) represents User Hardmac which is a part of many complex FPGAs today. These hardmacs are placed on the FPGA as common blocks that are generally utilized by most applications. (106) represents Configurable User Logic Units which are generally the area customer or designer user logic is implemented. (107) represents Configurable User Memory which is used by application to configure memory blocks of different sizes. The Configurable User Logic Units (106), User Hardmac IP (104), Input/Output (100) and Configurable User Memory (107) are flexible, configurable or "Programmable" via the interconnect Internal Fabric (109) for creating connection among different blocks. The state of these blocks (104), (105), (107) and (100) and their interconnects are generally kept statically via the Configuration Image (103). Configuration Image (103) is loaded with a bit-stream image representing the logical representation of the implemented application. This image is loaded at power up or during the reset/initialization process. The image is generally static. The image can be reloaded for different applications or in the event the design requires updates for feature addition or logic fixes (bugs); hence, field programmable. For Volatile storage, in the event of power cycle or reset, generally, the bit-stream image needs to be reloaded into the FPGA in order to establish the desired functional behavior. With Volatile Storage (103), such as SRAM, an image can be downloaded as often as required.

Some FPGAs, the Configuration Image is based on Non-Volatile storage (such as anti-fuse, embedded Flash, etc.) where the image is programmed once, and generally there is no need to configure the device with the bit-stream/Image.

The Programming Interface/Test/etc (101) is generally connected to an external device such as Flash or EPROM via Programming Interface (102). The external storage device contains the bit-stream image representing the functional behavior of the FPGA. During the development phase or other debug/update phase, the external Programming Interface (102) can be connected to a Programming device, such as dedicated FPGA downloader or Computer (such as Personal Computer, PC).

Separating Core from Context (Separating the usable logic that logic designer implements in a design from the programming part of it): The programming or configuration function can be separated or removed from the design by hardening process.

Figure 26:
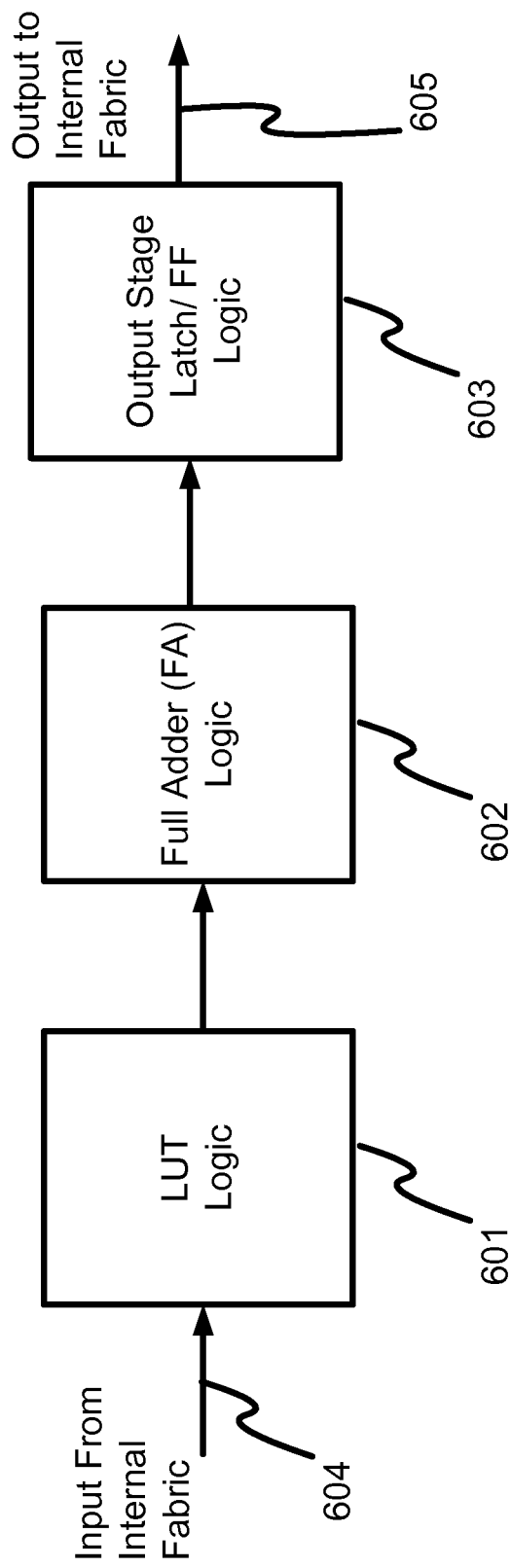
FIG. 26 shows a FPGA Logic Unit (LU). (Configurable User Logic Units Blocks)

FIG. 26 illustrates the FPGA Typical Configurable User Logic Units. The Logic Unit represents the core of the user logic to be implemented, generally, a representation logical Sum-of-Productions or Product-of-Sum implemented in LUT (604), feeding the arithmetic operation Full Adder Logic (602), latched using an Output Stage Flip/Flop (such as D Flip Flop) (603). Both the Full Adder (602) and/or the output stage Latch (603) can be bypassed, and the LUT output can directly drive the final output stage (605), which is feeding the Internal Fabric. One can conclude that Logic Units can be daisy-chained, since the inputs are fed from the Fabric and the Output are fed back to the Fabric. Example of this would be a basic binary counter or shift register, where the next count or shift bit is dependent on the previous bit.

Figure 27:
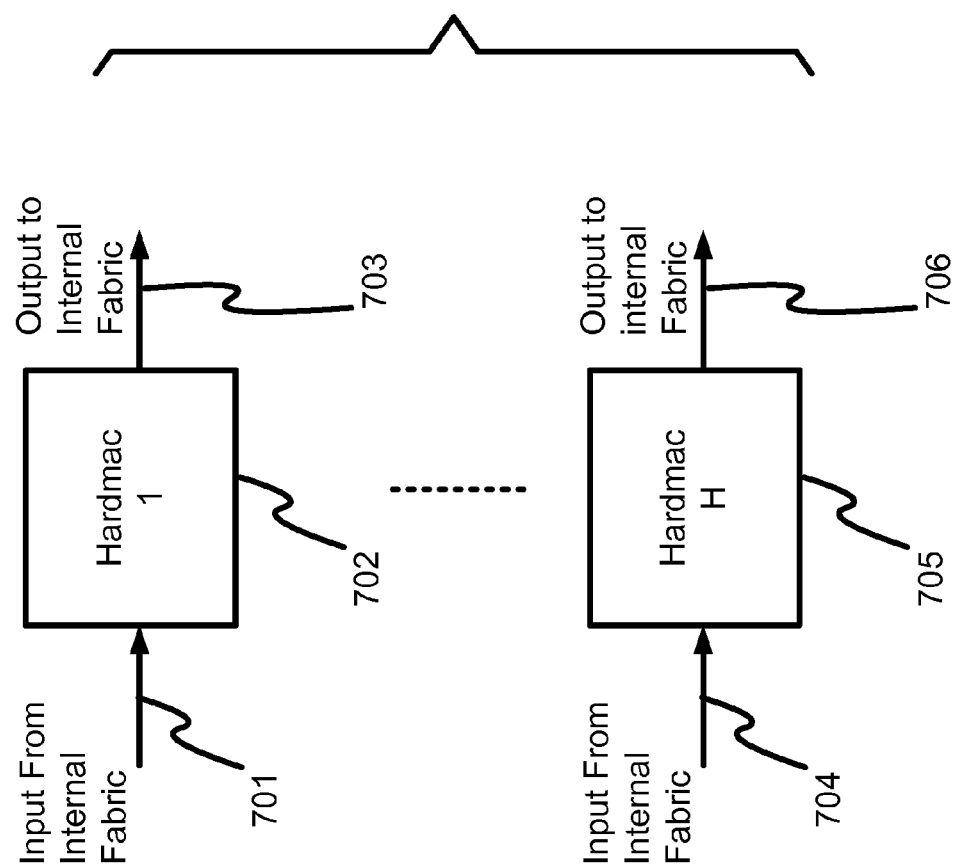
FIG. 27 shows a Hard Macro of Typical FPGA.

For FIG. 27: Many FPGAs contain Hardmacro blocks (702). Hardmacros are generally fixed functions, representing complex functions, which are generally common with many applications. Examples are Ethernet Interfaces, PCIe (PCI express), DDR controllers, and more. These common pre-fabricated functions are generally based on industry standards (e.g. IEEE), utilized in many applications, providing much denser area and lower power. In the same manner as Logic Units, Hardmacs are driven by the FPGA Fabric (701), and the output of the Hardmac feeds back into the Fabric (703).

Figure 28:
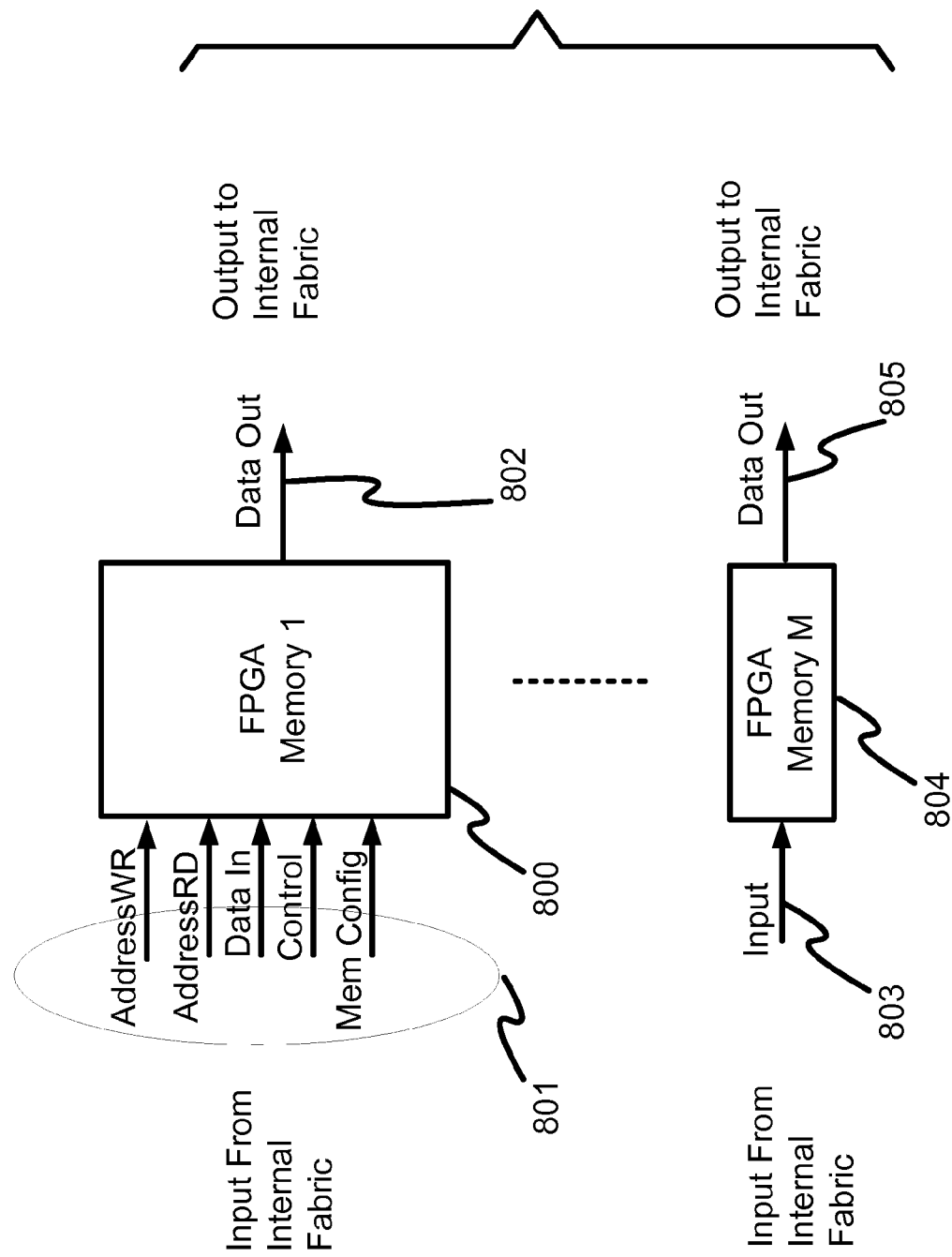
FIG. 28 shows a configurable FPGA memory.

For FIG. 28: Configurable Memory (800) are key blocks within the FPGA. The memory blocks are either used individually or cascaded to form a larger memory block for the purpose of storage of information. The FPGA Memory (800) is flexible by width and depth, and in some cases, it can be divided into several sub blocks. In some cases, FPGA Memory (800) can be converted into Content Addressable Memory (CAM) for parallel lookup. Similar to other configurable blocks, The FPGA Memory's (800) address, data and control signals (801) are driven by the Internal Fabric. The Data Out (802) is fed back into the fabric. Such connection allows the other blocks, such as the Logic Units or Hardmac, to connect to the FPGA Memory, or the output from The FPGA Memory can be routed to other FPGA blocks, via the Internal Fabric.

Figure 29:
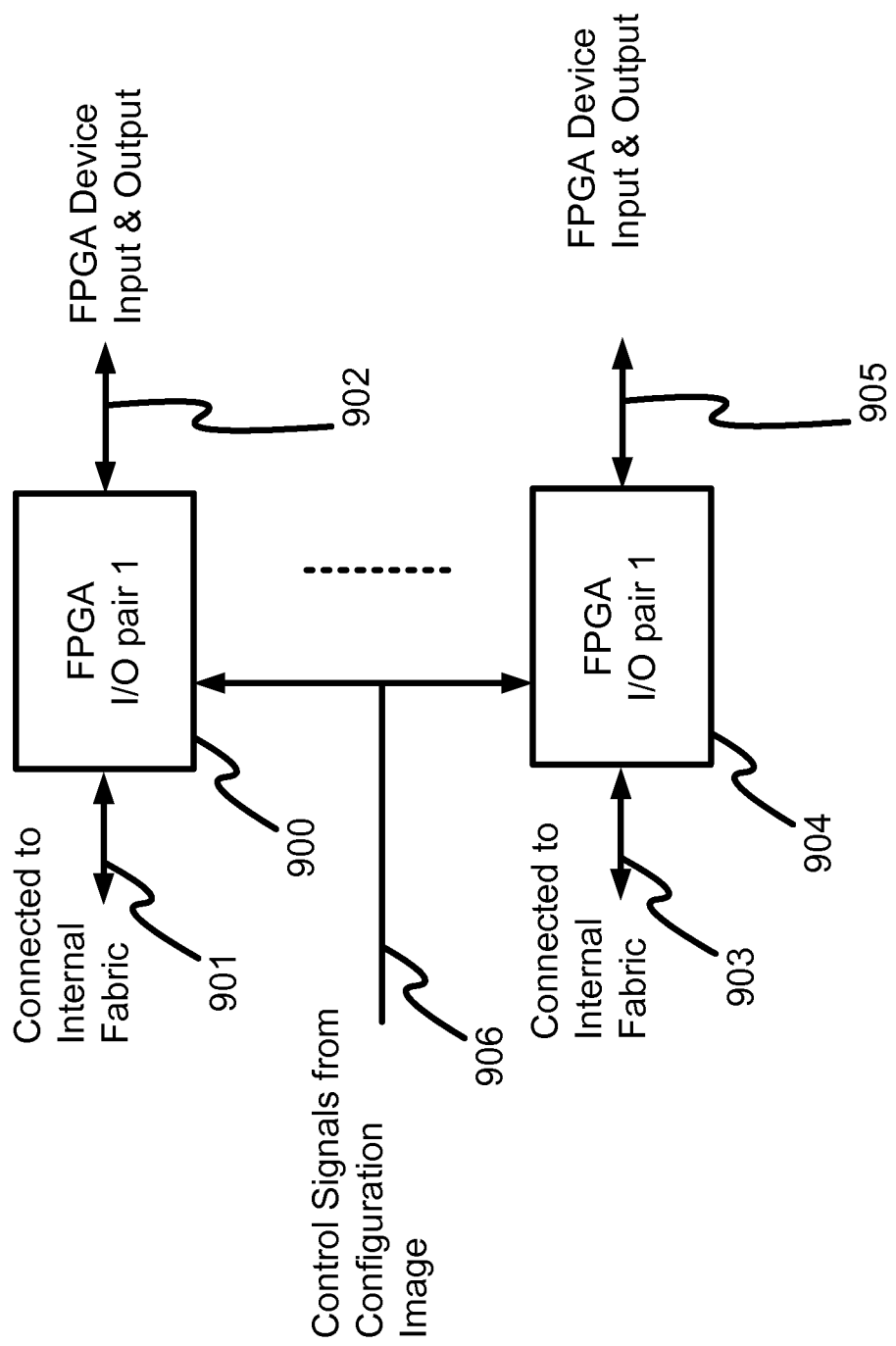
FIG. 29 shows a FPGA Input/Output Block.

FIG. 29: Input and Output signals in and out of FPGAs are typically designed to support multiple standards and formats (900). In the case of Input signals, different formats are supported from single ended to differential signals. The Control Signals from the Configuration Image (906) holds the value representing the configuration of the Input signal (902) to (905). Likewise, an output signal at the FPGA Device Output (902) to (905) can be configured as single ended or differential controlled, by the Image controlling the specific Output (906). The same process holds valid for bi-directional signals.

Signals from the FPGA I/O pair (900) or (904) are connected to the FPGA Internal Fabric (901) and (903). These signals are then routed to the Logic Units, Memory Units, Hardmacro blocks, or other FPGA resources. An I/O signal can be routed back to an output, Loopback. Generally, I/O signals are grouped into I/O Banks, as one embodiment.

Figure 30A:
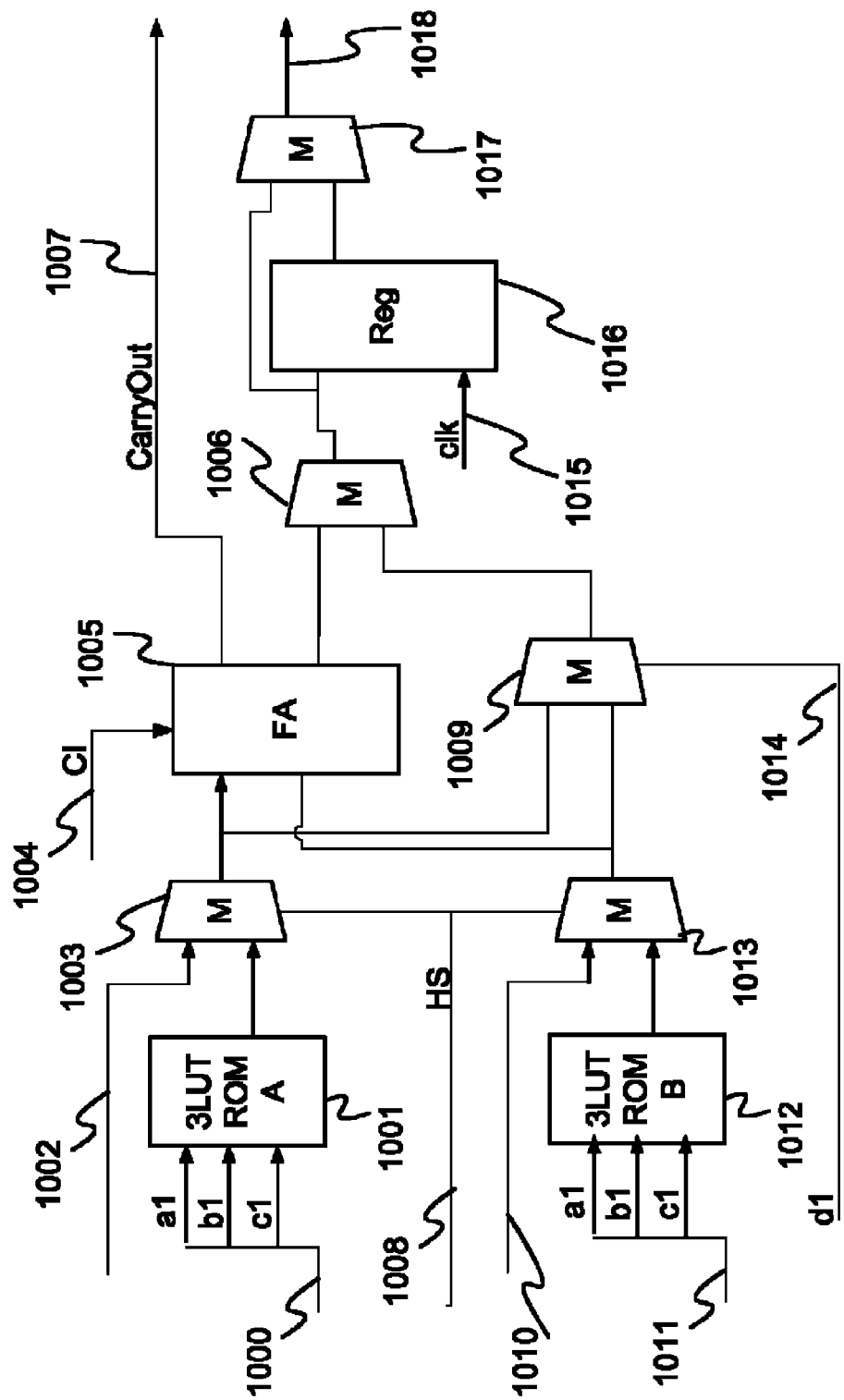
FIG. 30(a) shows a SiFace Logic Unit (LU) block diagram residing in BaseStack.

FIG. 30A illustrates a typical Logic Unit of HPLA. This Logic resides at the BaseStack. The signals (1000), (1011), (1002), (1004) and others, to and from the Logic Unit are connected via the MPIF.

When in Configurable mode of operation, Logic Unit signals (1000, 1002, 1004, 1007, 1008, 1010, 1011, 1013, 1014, 1015, 1018) are connected to the CoreStack via the MPIF layer. The CoreStack's function is to route these signals dynamically to other Logic Units, Memory Units, Hardmacros or Input/Output Units, creating a larger combinatorial and logical behavior, including latches or Registers for both statefull and state-less functions. During the Dynamic mode of operation, where the CoreStack holds the binary image representing the functional and logical behavior, signal HS (Hardened Signal) (1008) is asserted, to force the operation of the BaseStack, based on the state of CoreStack. In this mode, Dynamic Mode, or NOT Hardened Mode, the 3LUT_ROM (1001) and (1012) are not used, and bypassed through the Mux M (1003) and (1013). The signal driven to the Logic Unit is driven by signal (1002) and (1010). These signals are driven from the CoreStack and from LUT_Mesh (2014) (See FIG. 35). The state of this signal can be altered by programming the LUT_Mesh during the configurability of HPLA.

Figure 35:
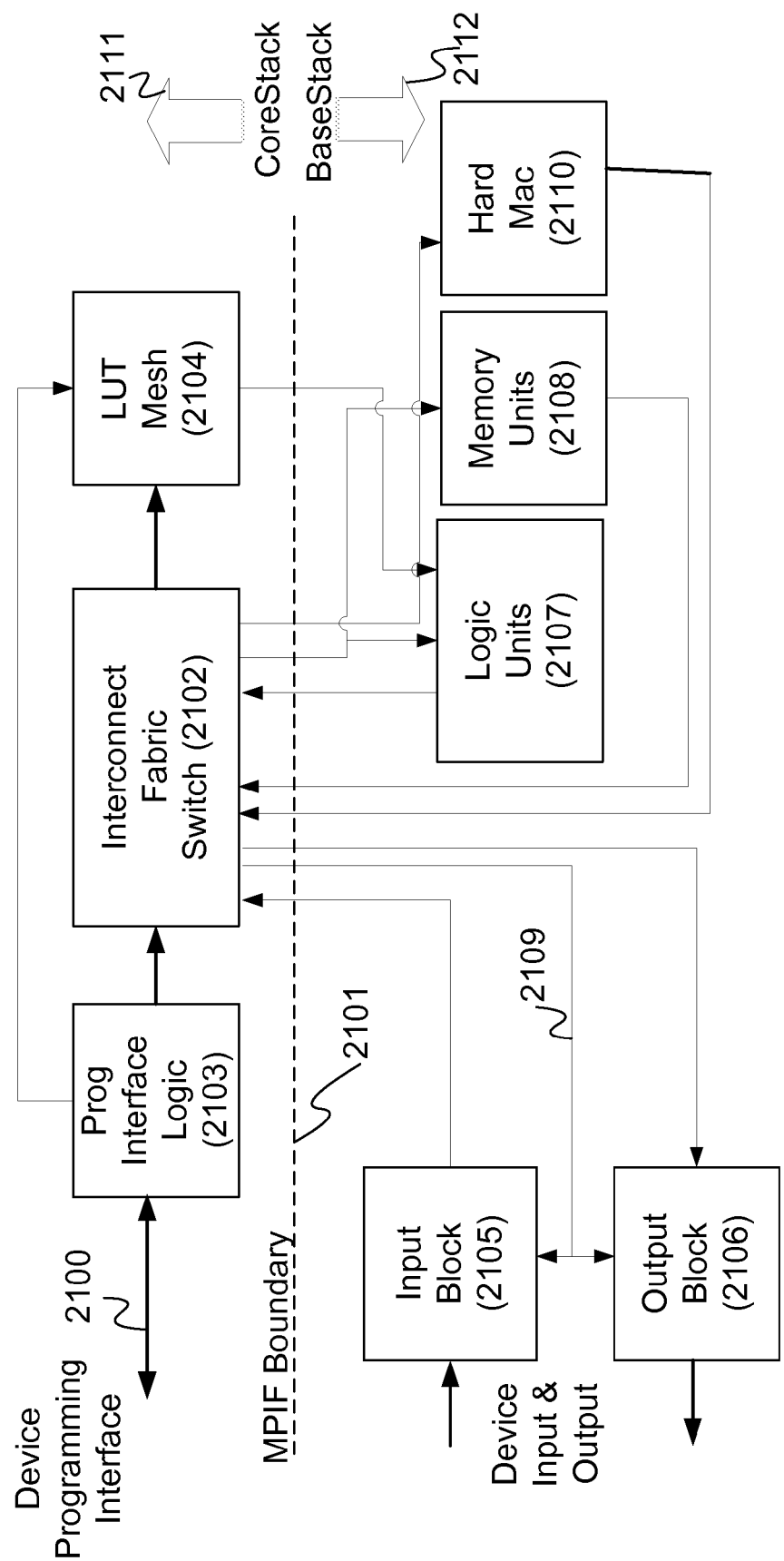
FIG. 35 shows a HPLA high level block diagram.

The 3LUT_ROM (1001) and (1012) are the Hardened representation of standard FPGA LUT which is located as part of the LUT_Mesh block (see FIG. 35 (2014)) within the CoreStack. Either dynamic or Hardened, the LUT function represents a combinatorial logic based on the three input (1000) and (1011). The output of the LUT in Dynamic Mode is driven from the CoreStack (1002) or from 3LUT_ROM (1001) during the Hardened Mode. The output of LUT feeds a Full Adder, FA, (1005). Likewise, the output of the FA (1005) feeds the Register (1016) clocked by clk (1015).

The input to the Logic Unit (1000) and 1011), or (1002) and (1010), feeding the 3LUT_ROM (1001) and (1012), may be propagated to the output (1018), bypassing either of FA (1005) or Reg (1016), by asserting Muxes in the signal path (1003), (1013), (1009), (1006) and/or (1017). These decisions are generally enforced by the user programming the CoreStack and creating a binary image feeding the BaseStack via the MPIF Layer.

Once the HPLA configuration is finalized, one may want to switch from the Dynamic Mode of operation, where the image for BaseStack can frequently be altered, to the Hardened Mode where the configuration of CoreStack is frozen and established by replacing the CoreStack with die Metal or Redistribution Layers (RDL) and programming the 3LUT_ROM (1001) and (1012) with their dynamic representation inside LUT_Mesh. (See FIG. 35 (2014)). In this process, the RDLs route the signals between different blocks (Logic Units, Input/Output Units, Memory Units, HardMac Units and other Units inside the HPLA). The RDL is processed as part BaseStack to complete the IC (integrated Circuit) manufacturing, packaged and delivered to user. The behavior of the Hardened device is now fixed and is a representation of what the CoreStack configuration was dictating to BaseStack during the configuration process.

The HS signal (1008) selects the mode of operation for HPLA in either configurable mode or Hardened mode.

Figure 30B:
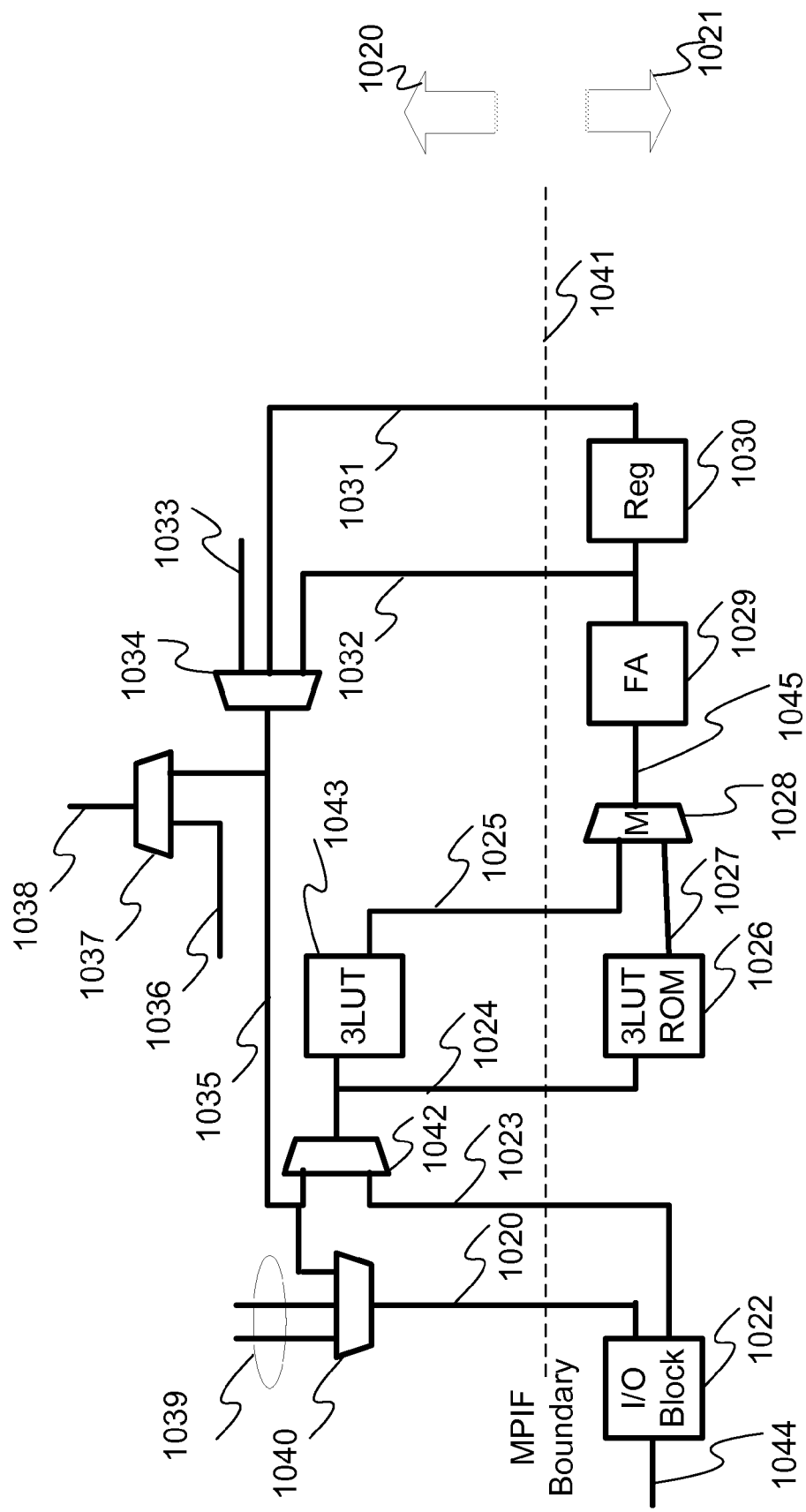
FIG. 30(b) shows how an FPGA Logic Unit divided between CoreStack and BaseStack. (Logic Unit, Fabric, 3LUT/ROM through MPIF)

FIG. 30B illustrates the construction of HPLA typical Logic Unit divided between BaseStack (1021) and CoreStack (1020) connected via the MPIF (1041).

The main idea is to have the signal from the BaseStack feeding the CoreStack where these signals can be switched or routed, and then, drive the inputs to elements of BaseStack. This approach would push the fabric logic and all associated storage elements to CoreStack and leave the fundamental logical units and memory units used to describe a circuit inside the BaseStack. Such separation allows the BaseStack die area to reduce to a smaller size, compared to a standard FPGA. In this case, the FPGA overhead for programming is separated from the actual logical elements required to program a circuit. All the programming and configuration is implemented at the CoreStack level.

Once the final configuration is reached, the CoreStack may be removed and replaced with additional metal layers providing the interconnect reflecting the image holding the configuration. This approach hardens the BaseStack. The new BaseStack+Metal Layers would represent the same logical behavior as the BaseStack plus CoreStack. However, the result would allow for a smaller die size, lower power and reduce form factor, and even higher performance.

Input signals (1023) from the HPLA device connected to the I/O Block (1022) are fed to the CoreStack via MPIF (1041) where they can be switched or routed (1042) back to the Logic Units and other elements of BaseStack, via (1024). Other signals from BaseStack Logic Unit or other elements (1032), (1031), and (1033) are also fed to the CoreStack where these signals can be routed either back to the same Logical elements (1035) within the BaseStack or other logical elements (1038) within the HPLA BaseStack.

A Logic Unit consists of Lookup Tables or LUTs of various configuration. For example, a 3-Input 1-output LUT (3×1) would have eight 1-bit values stored. The LUT can represent a logical function reduced with 3 variables referenced as "a", "b" and "c". For example, a LUT can be programmed to represent the function (a&b+!c). This is a logical AND function of "a" and "b" terms with logic OR function with the term negated (!) "c". Other LUT configurations have been implemented with variation of different inputs and outputs, such as 3×2, 6×1, 6×3 and more, allowing for more complex description of logical equations. In general, these LUTs, regardless of their configurations, tax the die in a FPGA, in exchange for offering configurability. The dynamic nature of a LUT has overhead that is much larger in area (or gates), compared to a static version or hardened version of the LUT, which can be represented in a ROM (read only memory) or similar device.

With our (SiFace) technology, the LUT (1043) element is moved to the CoreStack (1020) and programmed the same as a traditional FPGA. The LUT configuration can be altered as many times as required, to reflect the logical behavior of a targeted design. A corresponding ROM (1026) version of the LUT (1043) resides or mirrored inside the BaseStack (1021) and is not used unit the time of hardening process, which would fixate the logical behavior of the LUT into its corresponding ROM.

In order to maintain same functionality between the dynamic (LUT version) and static (ROM version), the signals (1024) driving both must be the same. A multiplexer (1028) is used to select between the LUT (1043) or ROM (1026) version. It is programmed to select the LUT when configurability is applied and is programmed to select ROM once the HPLA is hardened.

The output of LUT (1025) or ROM (1027) is fed to a Full Adder (FA) (1029), as in any traditional FPGA implementation. The output of the FA (1032) is either latched via a register (1030) or directly fed outside the Logic Unit to the CoreStack Mux (1034). In either case, the output of FA (1032) and Reg (or Latch) (1031) are fed back to the CoreStack via MPIF (1041) for further switching or routing (1034) within the CoreStack. Having the signals from various elements of Logic Unit (1032) and (1031) connected to MPIF provides the flexibility of selecting which signals of Logic Unit to use for the next stage of processing. This is unlike a traditional FPGA, where such selection would happen within the BaseStack resulting in unnecessary overhead logic for muxing/selection.

FIG. 30B illustrates one Logic Unit of HPLA. A HPLA generally contains many of these Logic Units arranged in groups and hierarchy forms. Input signals (1023) from Input Block (1022) can drive a group of Logic Units. Also, the output from a Logic Unit (Register Output (1031), FA Output (1032), Carry out, etc) can drive as an input to the same (1035)-(1024), or another Logic Unit, via a hierarchical switching (1034)-(1037), within HPLA CoreStack.

Many of the signals within the CoreStack can be routed to the HPLA output via the IO Block (1022). This signal (1020) is switched (1040) at the CoreStack level. The source of the signal (1020) can be from any of the available signals that have been connected to the CoreStack Switch Fabrics, such as (1040) (1034) or (1042).

The following example attempts to illustrate the path a signal may take from HPLA input to output. An input signal (1044) is fed to a Logic Unit, registered and fed back to the output signal (1044).

Dynamic or non-hardened path:
(1044)-(1023)-(1025)-(1045)-(1032)-(1035)-(1020)-(1044):

Note that signal (1035) has connectivity from (1029) to (1030), in addition to (1034).

The same concept as illustrated in FIG. 30B applies to other elements of HPLA, such as Memory Unit, Hard Mac Unit, and Clock Unit.

Figure 30C:
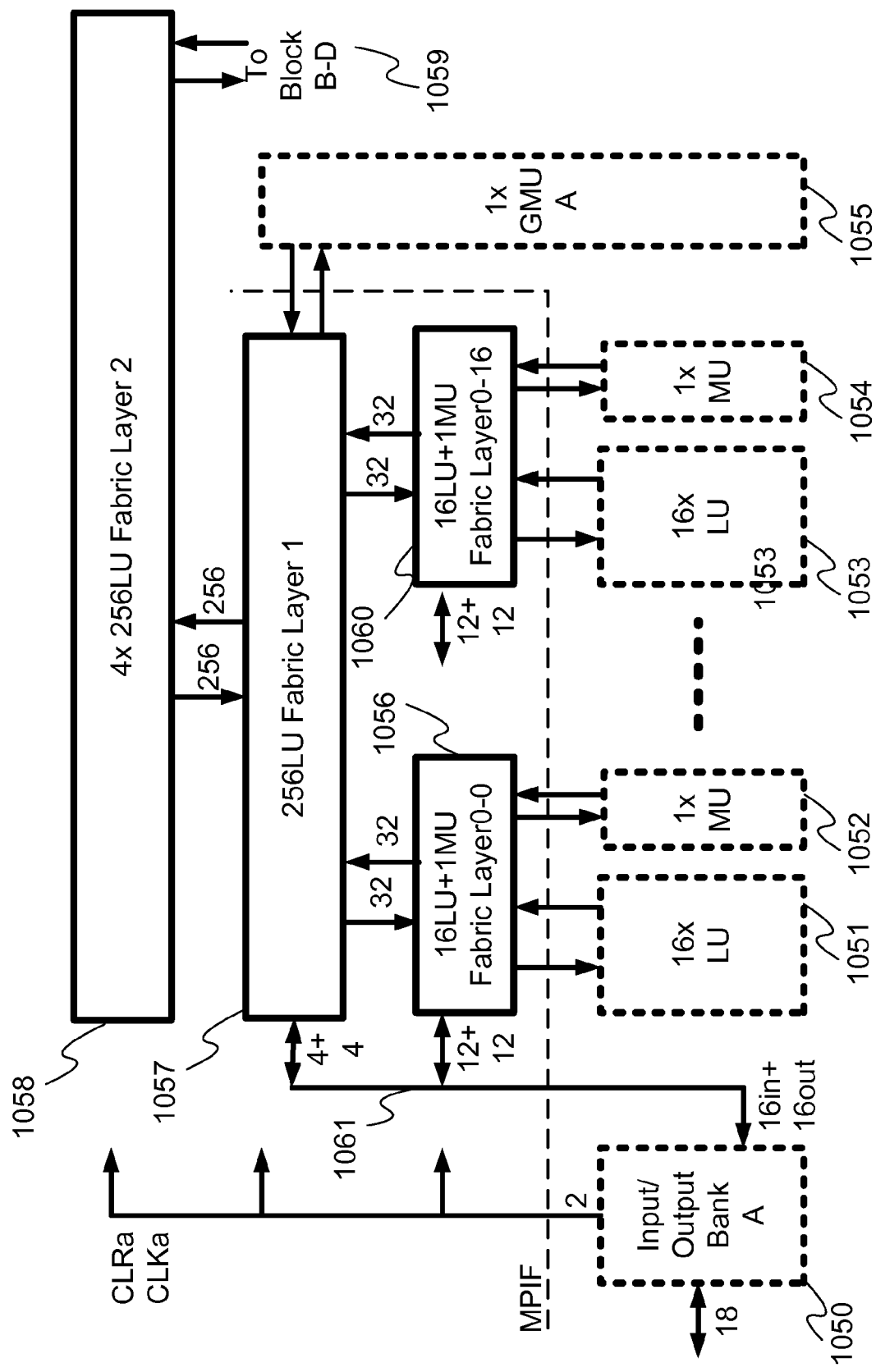
FIG. 30(c) shows an example case construction of BaseStack Logic Units, Memory Units and associated CoreStack Interconnect Switch Fabric Logic. (The boxes or rectangles with dashed lines indicate base stack, and the ones with solid line borders are core stack.)

FIG. 30C illustrates a simple construction of HPLA BaseStack and CoreStack consisting of Logic Units, Memory Unit, Interconnect Switch Fabric, etc. This example considers a group of 256 Logic Units sub-grouped into 16 Logic Units. Each Logic Unit has a corresponding Memory Unit. The larger group of 256 LUs share a large Memory Unit, as well.

CoreStack and BaseStack are separated via the MPIF. BaseStack is marked differently in the figure, to differentiate it from the CoreStack. In this example, this block has total of 18 connections to the outside world. These connections can be dedicated input, output or bi-directional signals.

The CoreStack Interconnect Fabric Switch (IFS) is constructed in a multi-layer fashion. The number of connections between each layer and blocks, as well as the number of blocks, is a function of HPLA complexity. Fabric Layer-0 (1056) is intended for local switching of Logic Units (1051) and Memory Unit (1052). This function is repeated 16 times for each group of 16+1 LUs and MU. Fabric Layer-0 IFS takes 12 input signals from the Input/output Bank (1050) and provides up to 12 output signals back to the Input/Output Bank (1050). The 12 Input signals together with other local and global signals are switched into any of the Logic Units Layer-1 IFS connects the 16 Layer-0 IFSs resulting in interconnect for total of the 256 Logic Units (1051) and 16 Memory Units (1052). Layer-1 also provide interconnect to a common Memory Unit (1055) shared by any of the 256 LUs (1051) through (1053). Four out of 16 device input signals are also routed to Layer-1 IFS for more global routing. Each Fabric Layer-0 communicates with Fabric Layer-1 via 32 dedicated bi-directional signal. In this case, each group of 16 LUs would have 3 output signals (FA, Co and RegOut) that makes a total of 48 signals, plus the input signals can also be routed to the upper layers, making the output out of Fabric Layer-0 to more than 60 signals. However, this example only allows 32 of these possible outputs to be routed to upper layer.

The Layer-1 IFS switching capacity would be in the order of:

32 signals per Layer-0×16=512
4 signals from the 10 Bank
256 signals from the Layer-2 IFS That make the switch complexity up to 512+4+256=772 signals to handle and route. In this example, there are 4 Block of 256 LUs where Fabric Layer-2 is the agent that enables connectivity among the 4 banks via (1059). Each Bank can have a dedicated CLK and CLR which can further be routed to different layers for connectivity.

Figure 31:
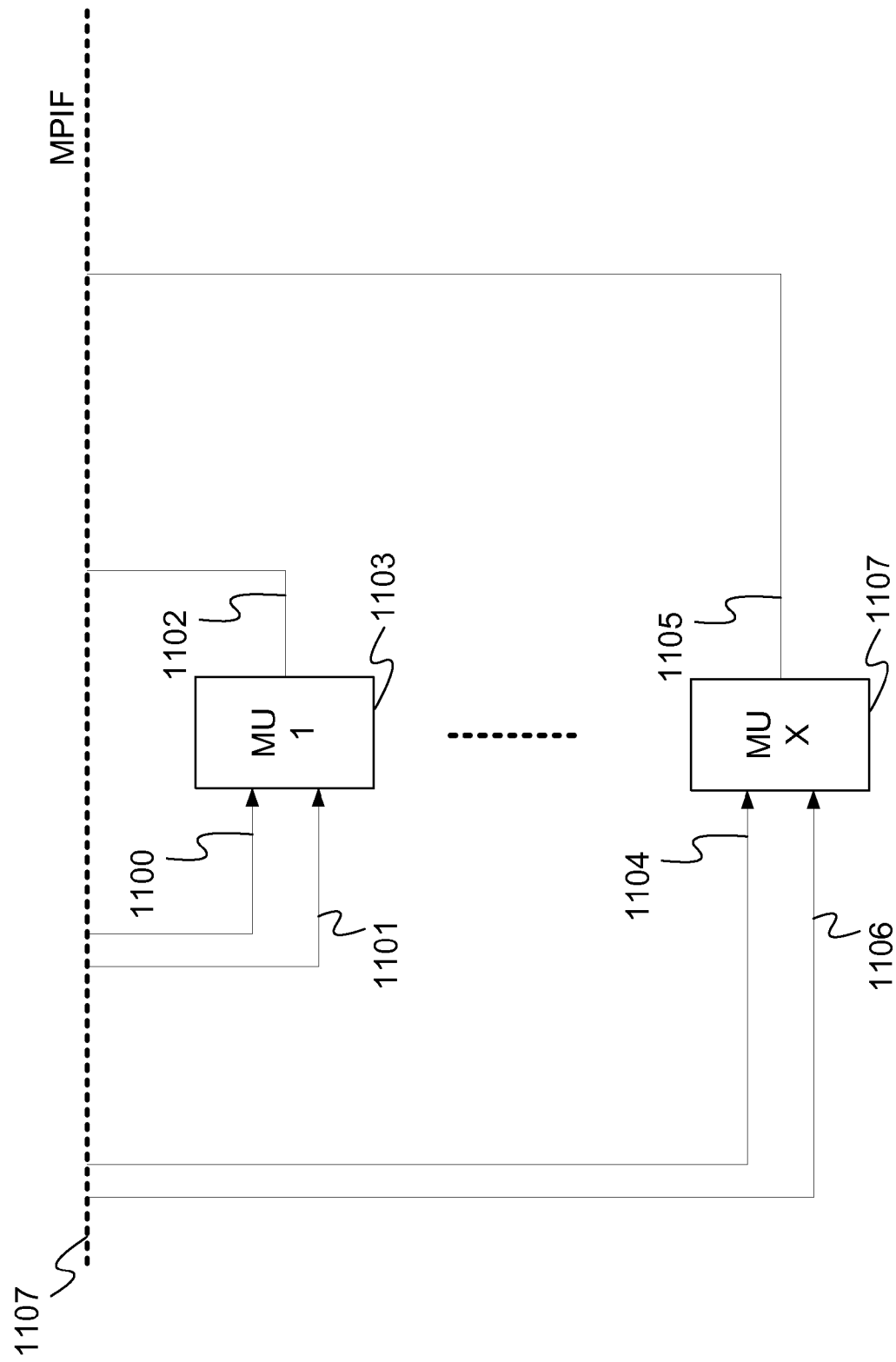
FIG. 31 shows a SiFace configurable memory residing in BaseStack.

FIG. 31 illustrates a possible HPLA configurable memory. A configurable memory block is implemented as a part of the BaseStack. The configuration of each Memory Unit is controlled via the signals driven to and from CoreStack connected via the MPIF (1107). The Memory Unit signals (1100), (1101) and (1105) may initially be driven by CoreStack and eventually may be hardened by the RDL Layer removing the CoreStack and fixing the configuration of the memory.

Figure 32:
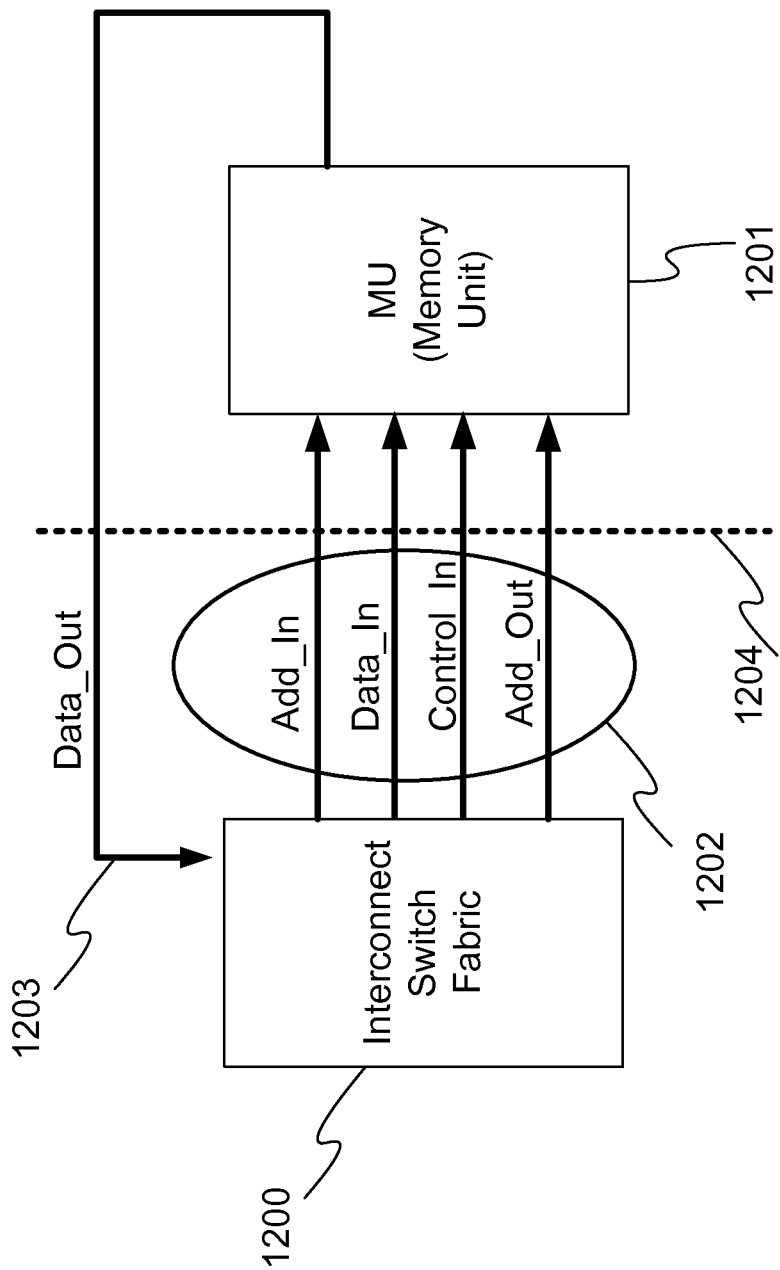
FIG. 32 shows a SiFace configurable memory residing in BaseStack, crossing MPIF boundary, interfacing to CoreStack "Interconnect Switch Fabric".

FIG. 32 further illustrates the operation of HPLA configurable memory, Memory Unit. During the Dynamic operation of HPLA, a Memory Unit located in BaseStack is configured and driven from the CoreStack interfaced through the MPIF (1204).

Write Address (Add_In), Write Data (Data_In), Control signals, such as READ, Write, SELECT, ENABLE, as well as memory configuration, etc, (1202), are driven from the CoreStack Interconnect Switch Fabric (1200). Once the data is accessed within the Memory Unit, the result data output, Data_Out (1203) is fed back to the CoreStack via MPIF (1204).

Larger memory organization both in width and depth can be constructed by cascading multiple Memory Units (1201)

in series or in parallel. The Memory Unit can be constructed as single port, dual port or even multiport. The size can be any depth by width, limited by the number of Memory Units available and the performance target for the application.

For example, a Memory Unit can be architected to have 4 tightly coupled blocks, each 2 blocks are shared address and separate data bits. A typical configuration of 512B (512×8) can be constructed, and the following alternative configuration can also be implemented:

1] 2×2×(512×8)
2] 2×512×16
3] 1×512×32
4] 2×1024×8
1×2028×8
5] 2×512×16
1×1024×8

Many other configurations can be implemented by different embedded memory architectures (for example, SRAM, etc), as well as the Address/control/Data connectivity.

FIG. 33A illustrates a possible prototyping/limited or low volume production and full or high volume production scenario. In the event of field programmable HPLA, where both BaseStack (1900) and CoreStack (1902) are connected via MPIF (1903), CoreStack can be loaded with bit streams or image that configures the logical behavior of BaseStack. The bit stream loaded into CoreStack can dynamically be altered. The contacts between CoreStack and system Printed Circuit Board (PCB) is through MPIF (1903) to package bump (1904) to package substrate (1905) to Package Balls (1906) to the PCB.

Even a HPLA can be used for production. One can decide to harden the HPLA to reduce solution cost and power. To Harden a HPLA, the manufacturing process does not construct the device with the CoreStack. It replaces the CoreStack from BaseStack (1907) with metal layers and/or Redistribution Layer (RDL) (1908). In other words, the BaseStack is constructed without the bonding of CoreStack. The Fabrication house would utilize and add additional metal layers, including the redistribution layer to complete the manufacturing process of the wafer resulting in the final die for final packaging/assembly process. The RDL (1908) are additional metal layer(s), as part of the die wafer manufacturing of HPLA. The RDL metal connectivity or routing is a representation of the bit stream or Image that was finalized with the CoreStack (1902). The RDL basically routes signals among the many block units of BaseStack (1907), hence, Hardened.

Figure 33B:
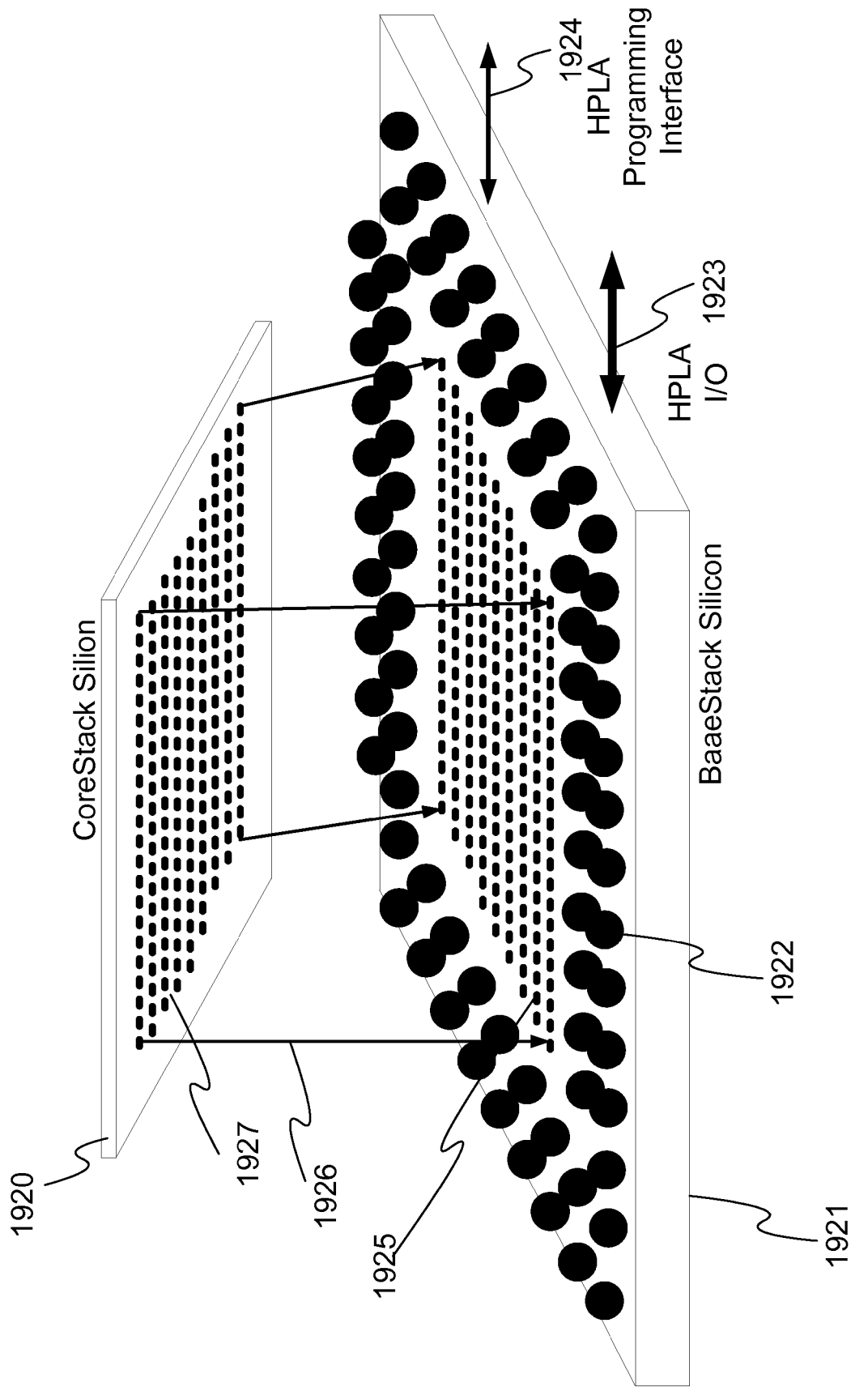
FIGS. 33 (a), 33 (b), and 33(c) show our (SiFace) FPGA solution from BaseStack, combined with CoreStack, referred to as HPLA (Hybrid Programmable Logic Array), to BaseStack hardened by one or more metal layers and/or Redistribution Layers (RDL).
Figure 33C:
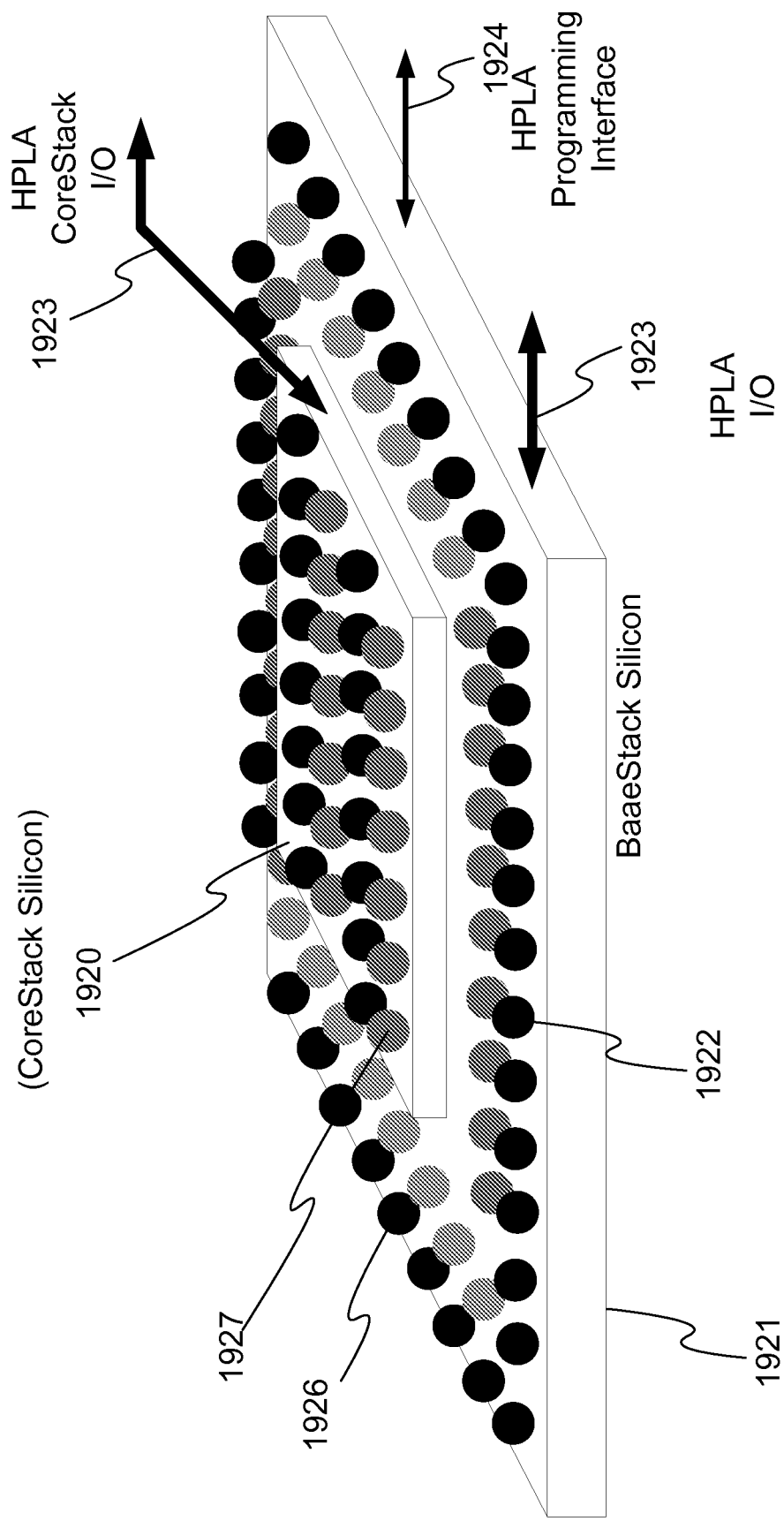
Figure 33D:
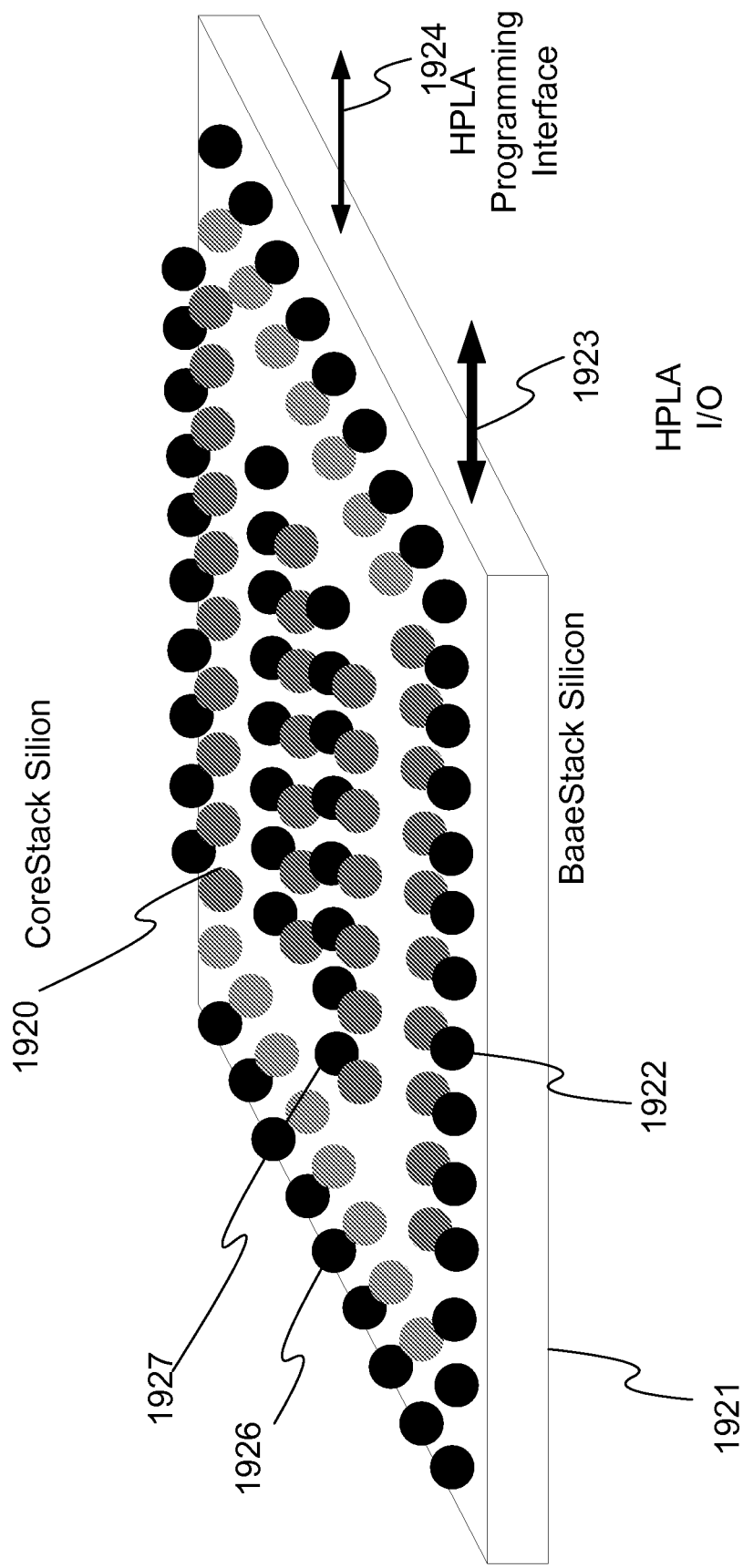
Figure 33E:
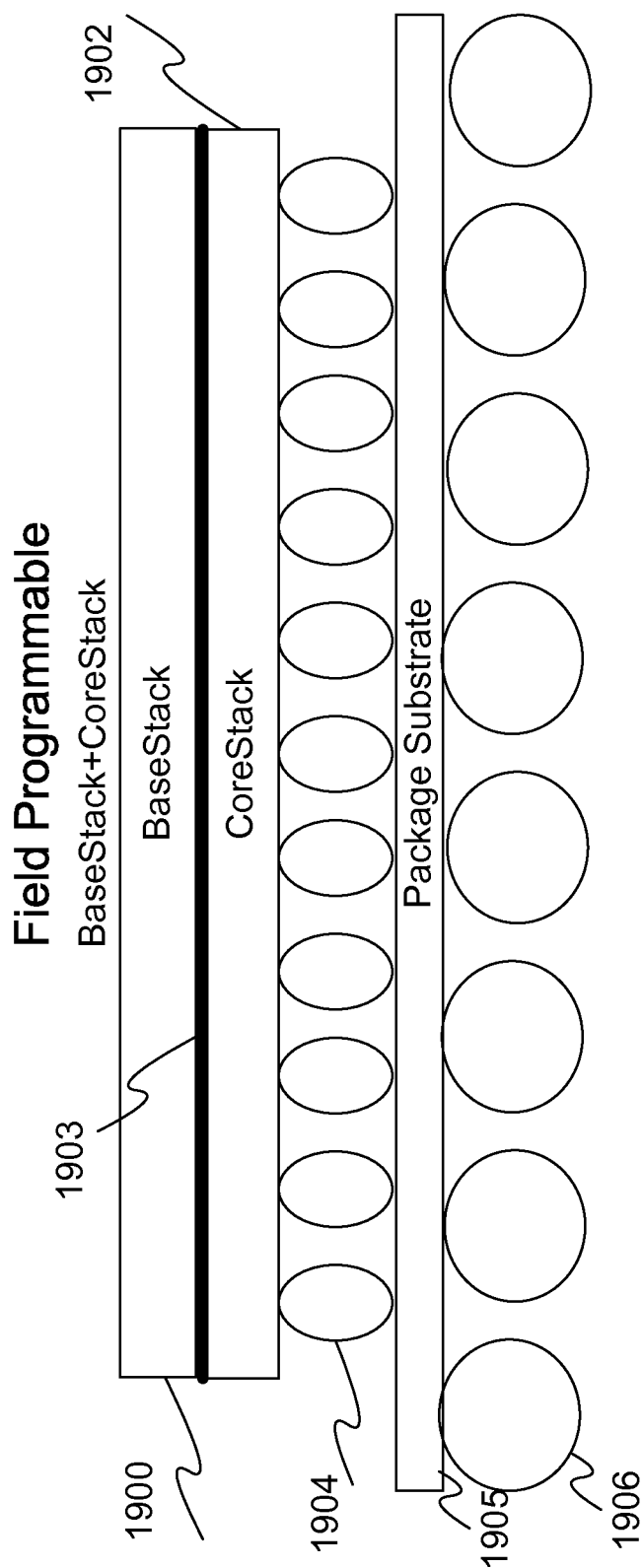
Figure 33F:
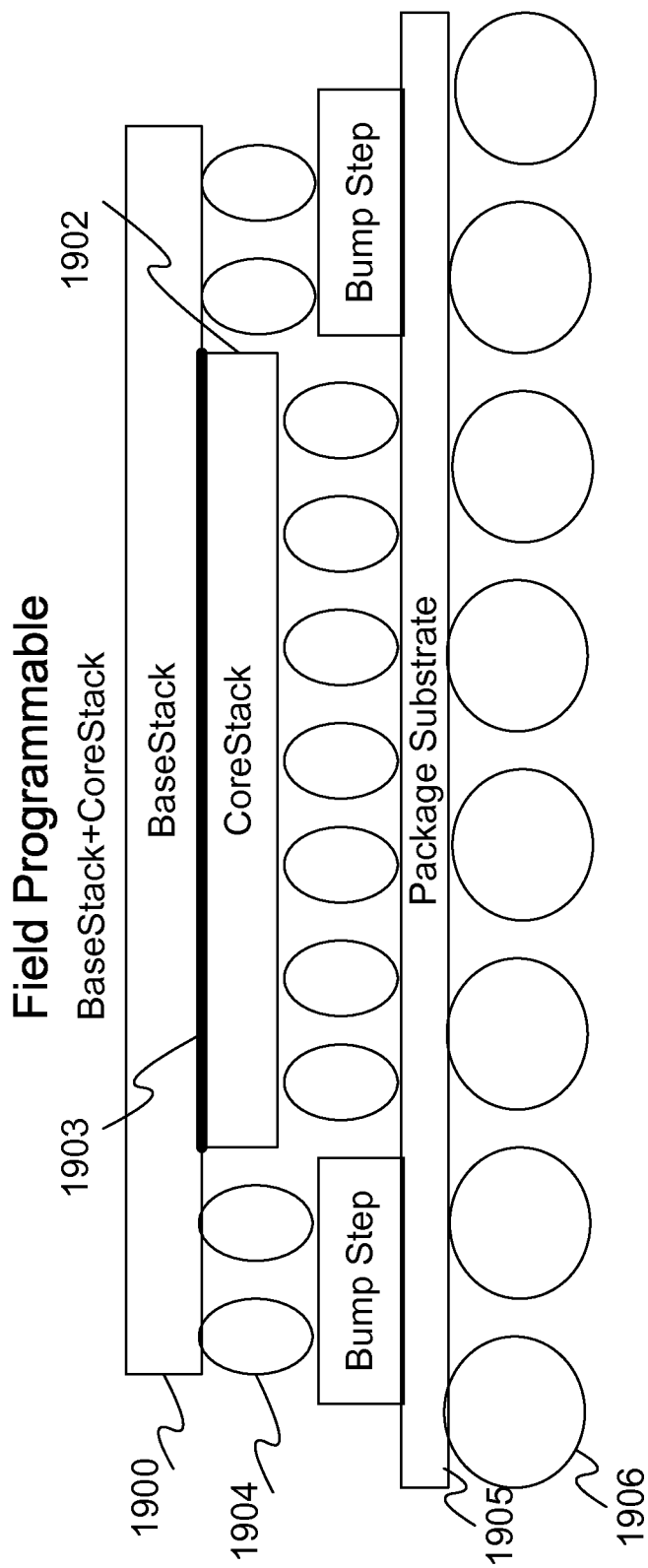

FIG. 33B illustrates the construction of HPLA. This figure does not show the connectivity to the package substrate.

BaseStack (1921) and CoreStack (1920) are both dies that are attached, in a face to face method. Each face includes the MPIF (1925) and (1927) that are generally a matching pattern, one being mirror of the other in order to make electrical connection from one die to the other.

The CoreStack die in some cases would need to be grinded, to reduce its thickness, to create clearance for the BaseStack die bump (1922), to connect to the package substrate.

The Input and output signals (1923) are generally interfaced to the BaseStack (1221). These signals are routed to the CoreStack via the MPIF (1922) and (1927). In addition, power and ground signals are fed through the BaseStack and routed to CoreStack, supplying power to operate the logic. The programming signals (1924) configuring CoreStack are also routed via the BaseStack. The programming signals may be interfaced by other means to the CoreStack, such as TSV (Through Silicon Via).

In the process of manufacturing, the CoreStack 1920 is aligned (1926) to its companion BaseStack (1921) via MPIF (1925) and (1927).

FIGS. 33 (*a*), 33 (*b*), and 33(*c*) show our (SiFace) FPGA solution from BaseStack, combined with CoreStack, referred to as HPLA (Hybrid Programmable Logic Array), to BaseStack hardened by one or more metal layers and/or Redistribution Layers (RDL). (FIG. 33 (*a*) relates to Prototype to production.) (FIG. 33 (*b*) relates to 3D Construction, BaseStack+CoreStack.) (FIG. 33 (*c*) relates to CoreStack I/O interface.)

FIGS. 33 (*d*), 33 (*e*), and 33(*f*) show hardening corestack I/O mapping, HPLA CoreStack match BaseStack, and HPLA with Bump Step, respectively.

Figure 34A:
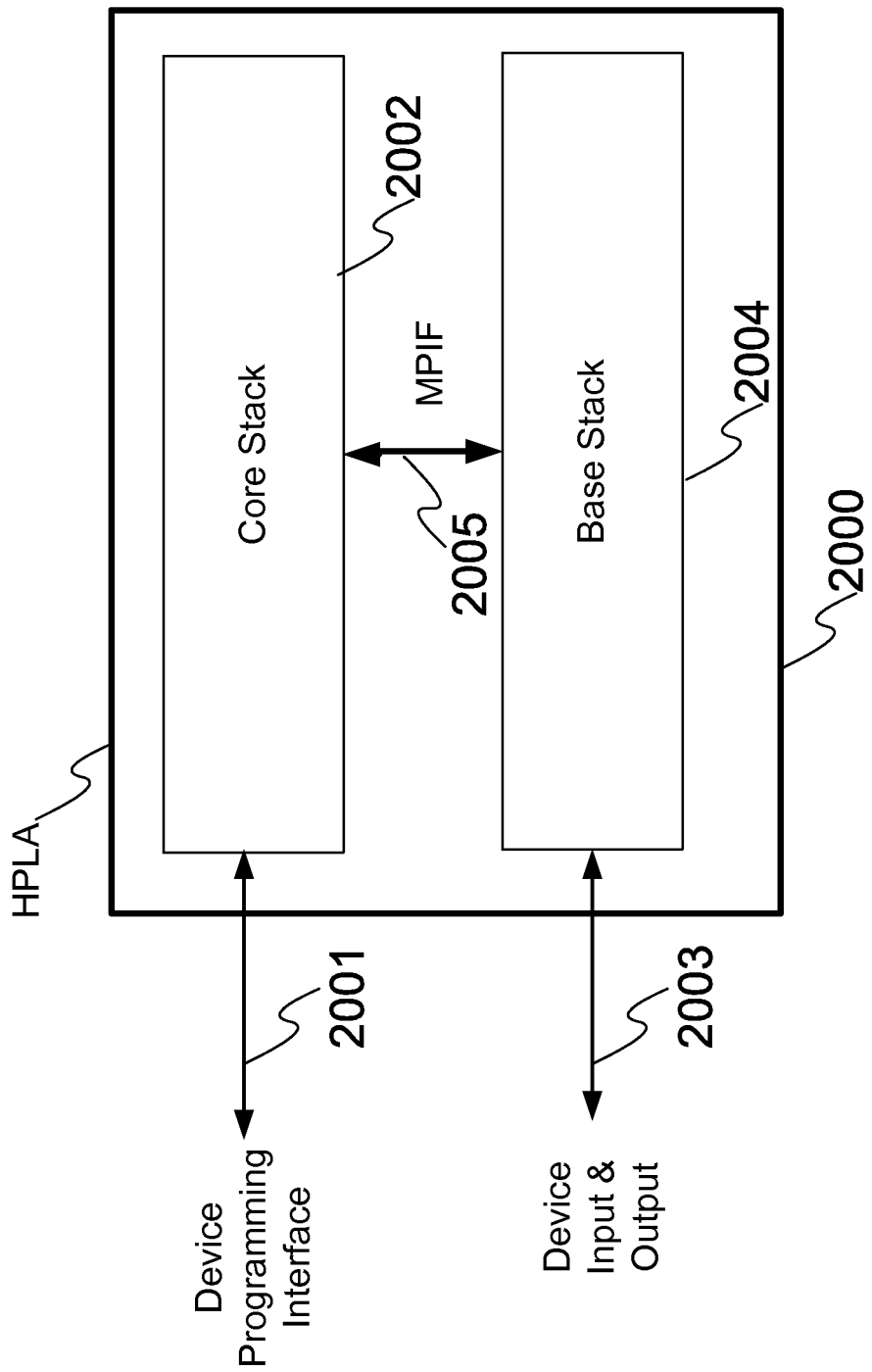
FIGS. 34 (a) and 34(b) show High level construction of Hybrid Programmable Logic Array (HPLA).

FIG. 34A illustrates high level HPLA (Hybrid Programmable Logic Array) block diagram (2000). The HPLA is constructed from two main blocks—1) BaseStack (2004) and 2) CoreStack (2002), connected via Massively Parallel Interconnect Fabric, MPIF (2005). Signals/ground and power supplies are interfaced to HPLA via standard Device Input & Output (2003). HPLA, when configurable, is controlled via the Device Programming interface (2001). This interface (2001) is generally a serial bit stream that hold an image representing a specific configuration of BaseStack (2004). The image in form of signals is connected to BaseStack, via MPIF (2005), which configures HPLA to a specific combinatorial and logical behavior.

Figure 34B:
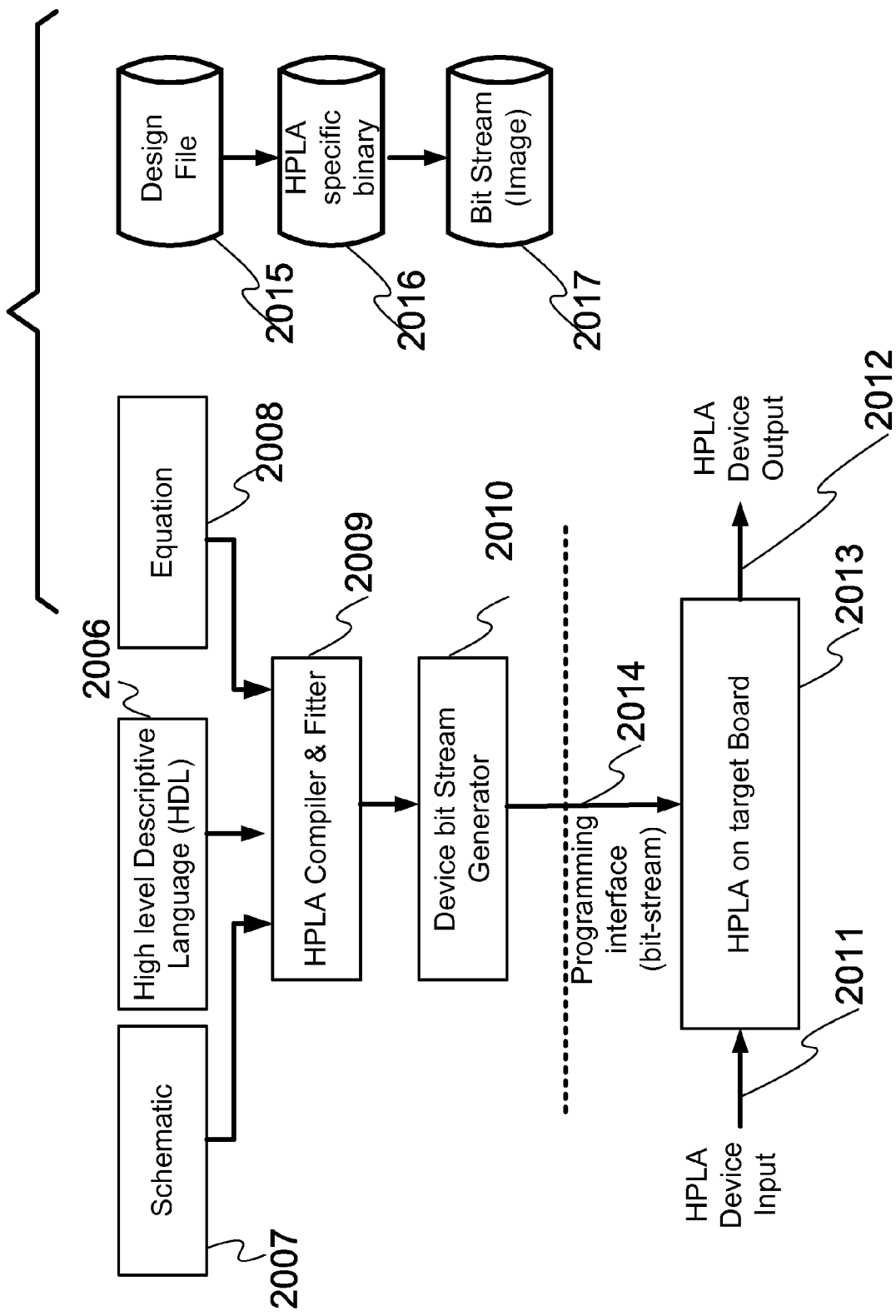

FIG. 34B illustrates the basic programming model for HPLA. The Logic behavior can be expressed in many file formats (2015), such as Schematic (2007), logical equations (2008) or High Level Descriptive Language (2006)—examples are VHDL or verilog, as most common design entry. The Design File (2015) is parsed for syntax and error, then reduced to most optimized logical representation (2016) of descriptive language within the Design File (2015). Depending on target HPLA platform or device, the fitter attempts to map the optimized logic to that particular device and create the binary image (bit stream) file (2017). The bit stream file (2017) can be downloaded in to the target HPLA device (2013) via the programming interface (2014). The bit stream file (2017) can reside on a workstation and downloaded into the HPLA by different common means, such as JTAG, USB, Ethernet, etc, via the programming interface (2014). The bit stream (2017) file can also reside on a non-volatile storage, such as Serial or parallel EEPROM/Flash, and permanently reside on the target board and loaded during power up, or commanded via external source—reset, interrupt, etc.

Once an image is loaded into a HPLA device during the image load time, it then can be brought into operation mode, where the behavior of the logic per Design File (2015) be examined and validated. In the event a designer determines that the behavior of the intended logic is not accurate, or identifies a bug, he or she can alter the Design File and (2015) and go through the same process of compilation, fitting, and testing.

FIG. 35 illustrates a high level view of HPLA containing both BaseStack (2012) and CoreStack (2011) connected via the MPIF (2101). The main objective of HPLA is to separate as much as possible, the programming portion of a Field Programmable Gate Array (FPGA) from the main die into a separate die (CoreStack). As a result, it reduces the FPGA area associated with the actual logic that a designer/user would need to implement. The MPIF (2101) provides a tightly coupled high density connectivity between the two isolated die, to allow a similar 2D (two dimension) integration in 3D (three dimension). A designer can configure a HPLA with programming and reprogramming the CoreStack (2012), to implement the logic design.

The Interconnect Fabric Switch, IFS, (2102), is the switch, router or cross-bar designed to provide the interconnect routing among all the blocks resident with the BaseStack. The signals from Interconnect Switch Fabric are connected to the BaseStack via the Massively Parallel Interconnect Fabric (MPIF) (2101). The IFS signals, both input and output, via the MPIF, are generally static signals that hold the state of combinatorial logic within the Logic Unit (2107), memory configuration of Memory Unit (2018), Logic Unit (2107), Hardmac (2108), Input Block (2105), output Block (2106), and other configurability features of BaseStack. In the event of Hardening, the CoreStack IFS (2102) is replaced with the RDL or metal layers, permanently configuring routing configuration of BaseStack (2112).

Each Logic Unit (2107) contains at least one Look Up Table (LUT) implementing a combinatorial behavior of 3-input or higher logic signals. These LUTs are generally inefficient, collectively consuming large die area translating to large dissipation of mainly static power including leakage resulting in increased die cost. They further introduce routing congestion for programming each LUT. The HPLA moves the LUT function of Logic Units (2107) from BaseStack (2112) to LUT_Mesh (2104) of Core Stack (2111). With such separation, the associated storage, routing and programming of the LUTs are executed at the CoreStack resulting in reducing the die area of BaseStack, impacting HPLA cost and power, once hardened.

Input and output Blocks, I/O Blocks, (2105) and (2106), handle the signals that are connected to HPLA, in many permutations, such as dedicated Input, Output, Bi-directional, single ended, differential signals, etc. The CoreStack (2111) drives the configuration of the I/O Blocks via the MPIF Layer, separating the configuration of the I/O from Programming or configuring the I/O. As a result, the BaseStack die area and power consumption is further reduced.

Device Programming Interface (2100) connected to either development platform, such as a workstation, or non-volatile memory, such as EPROM or FLASH, download a serial bit-stream that represents an image configuring or programming BaseStack (2112). Programming Interface Logic (2103) holds the bit-stream image.

Figure 36:
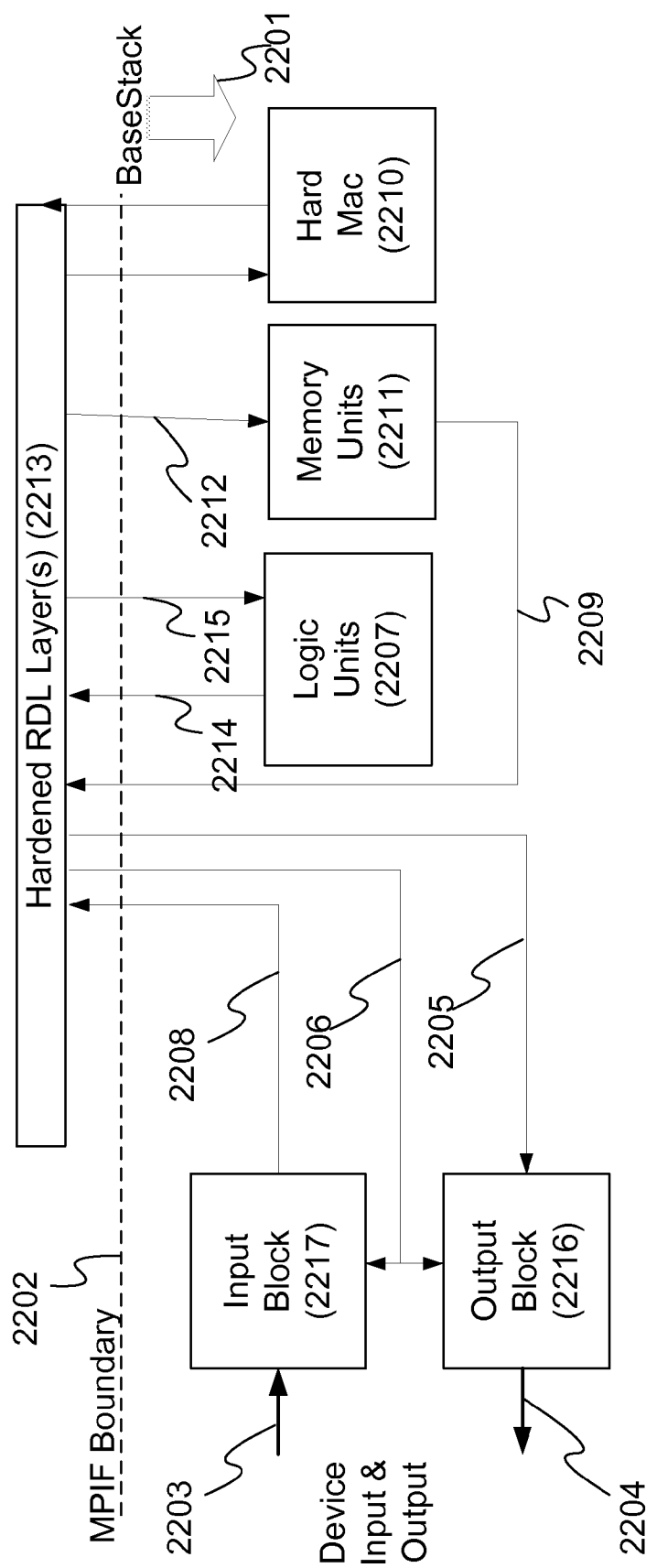
FIG. 36 shows a HPLA in hardening mode, by removing the CoreStack and replacing with Metal and/or RDL layer(s).

FIG. 36 illustrates how hardening is implemented. In the event a HPLA is required to be hardened, the CoreStack functions are replaced with Hardened RDL Layers or metal layers (2213). Hardened RDL Layer (2213) provides all the interconnect routing among the BaseStack (2201) Units and Blocks. As a result, and generally, the configuration of the BaseStack (2201) is fixed to the image that was intended for. The logical behavior of BaseStack (2201) should represent the bit-Stream Image that was designed for. Generally, the EDA implementation tools would do a round of timing closure, signal integrity, Power calculation, etc, to assure timing behavior match between an HPLA with a set bit-stream image and its corresponding Hardened HPLA.

A simple example of HPLA hardening process: An input signal (2203) is configured inside the Input Block (2217) as a differential LVDS signal through control signals (2206). The configuration for making the Input signals as LVDS is now hardened as part of the Hardened RDL Layer(s) (2213). The single-ended signal (2208), driven from the LVDS inputs, then is connected to the Logic Unit (2207) via the Hardened RDL Layer (2213) and connection (2215). This signal can also be connected to other Logic Units or other functions inside the BaseStack (2201). The signal (2208) is logically manipulated inside the Logic Unit (2207). The result from the Logic Unit (2207) is driven out in to the Hardened RDL Layer (2213) via connection (2214). This result can be further processed and fed back into other Logic Units (2207) or other Units, such as the Memory Unit (2211). The reiterated result (2205) may be connected to an Output Block (2216), routed through the Hardened RDL Layer(s) (2213). The signal can be configured or programmed as a single ended HSTL type, via signals (2206) driven from the Hardened RDL Layers (2213). The HSTL signal is not exiting the HPLA via signal (2204). The same would apply to combined Input and output blocks including bi-direction logic.

Figure 37:
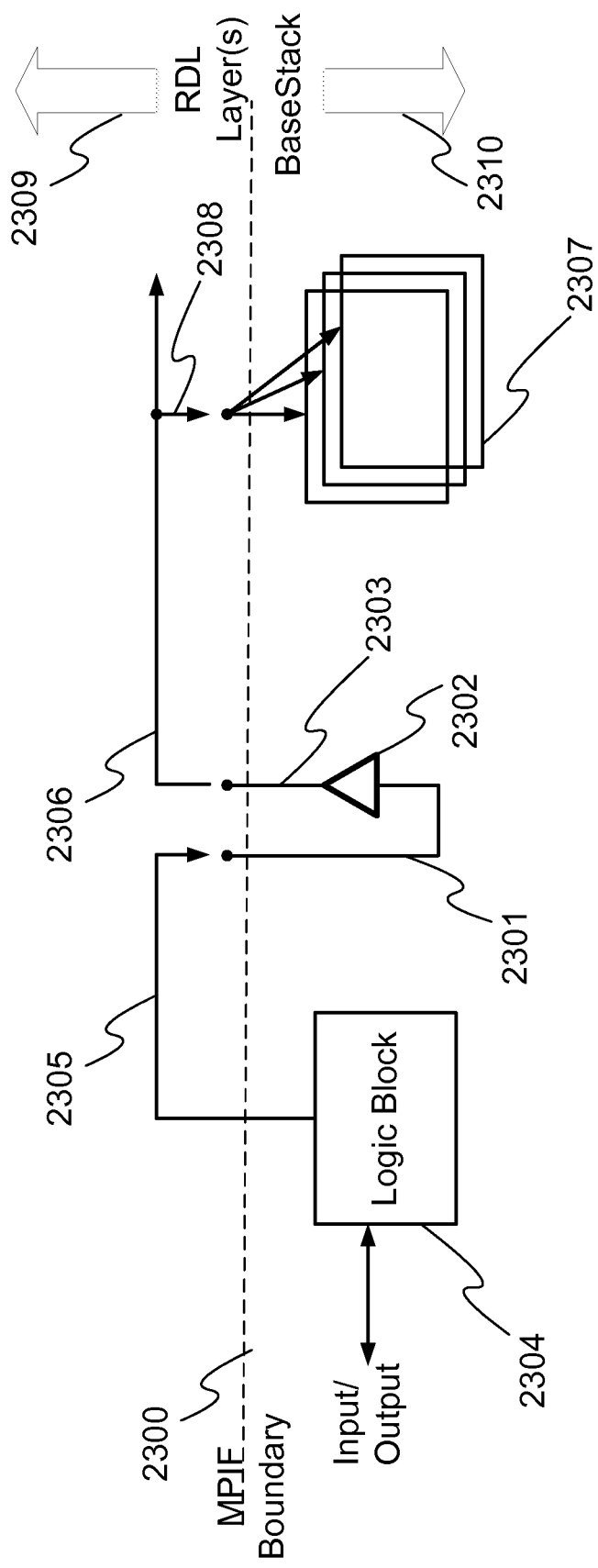
FIG. 37 shows a HPLA buffer or repeater for driving signals requiring higher driving.

FIG. 37 illustrates MPIF Repeater or Buffer. Once HPLA is hardened, the RDL Layers (2309) act as the massive interconnect between the blocks, and in some cases, a signal from a BaseStack Block (2304) may be driving multiple inputs to other BaseStack Logic block(s) (2307). To provide the drive strength necessary, repeaters are strategically placed within the BaseStack (2310) and can be used to connect signals (2305) from one location within the BaseStack and routed to input of the Buffer (2302) via another MPIF connection (2301). The output of the buffer (2303) is then driven back to the MPIF (2300) where it can be routed back to other blocks within the BaseStack (2306). The MPIF buffer (2302) may be used to drive standard logic, including HPLA clock routing, reset routing, and other signals that generally drive many logics.

Figure 38:
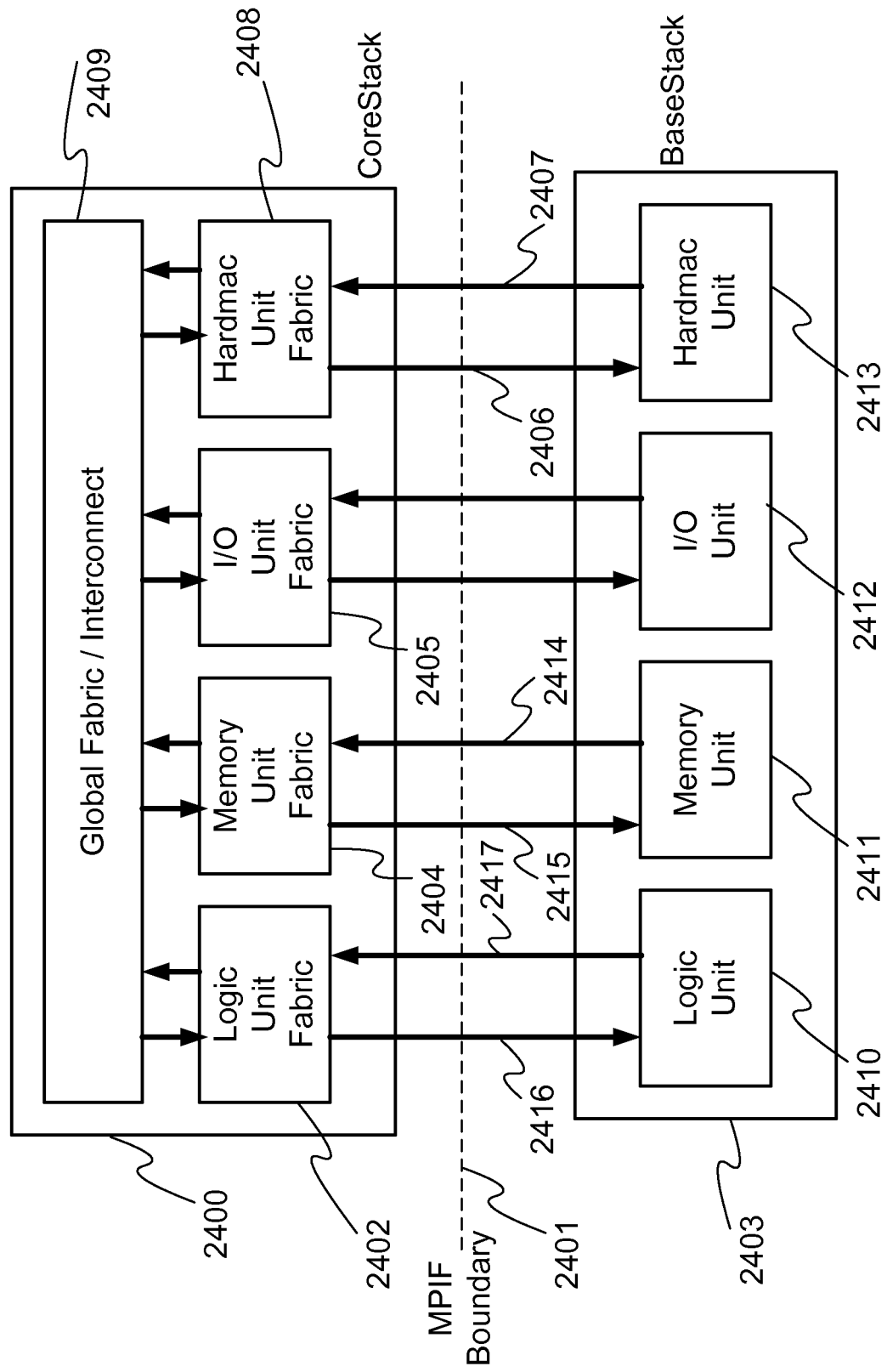
FIG. 38 shows a HPLA Interconnect Switch Fabric (ISF) depicting the interconnect among all HPLA logical blocks. The ISF consist of several sub-blocks.

FIG. 38 illustrates one implementation of Interconnect Switch Fabric (IFS) (2400). In this case, the IFS (2400) consists of four configured Fabric Blocks. One can extend the number of specific fabrics, such as Logic Unit Fabric (2402), to many specific Fabric blocks.

Each Logical Block within the BaseStack (2403), such as the Logic Unit (2410) or Memory Unit (2411), requires specific routing configuration and programming. As a result, the corresponding programming and routing blocks exist at the CoreStack (2400) level, such as Logic Unit Fabric (2402) or Memory Unit Fabric (2404). The function of Logic Unit Fabric (2402) is to provide the routing connectivity between all Logic Units (2410), as well as routing the signals to other Logic Units of the BaseStack (2403). In order to reach other Logical Units of the BaseStack (2403), signals from Unit Fabrics of CoreStack (2408), such as Logic Unit fabric (2402), connect to a Global Fabric & Interconnect (2409). The Global Fabric & Interconnect (2409) provides a hierarchical routing capability with the CoreStack (2408). This allows, for example, functions (2417) from the Logic Unit (2410) to drive the signals (2415) of a Memory Unit (2411), and output signals (2414) from the Memory Units drive other Units of BaseStack (2403). The interconnect between CoreStack (2400) and BaseStack (2403) is made via the MPIF Layer (2401).

Similarly, the I/O Unit Fabric (2405) drives the signals to and from the I/O Unit (2412). Hardmac Unit Fabric (2408) drives the signals from the Hardmac Unit (2413).

Ultimately, BaseStack's functional and logical Unit blocks are interconnected via the MPIF (2401), and the connection signals are routed, utilizing the CoreStack (2400) Unit Fabrics and Global Fabric Interconnect (2409).

Figure 39:
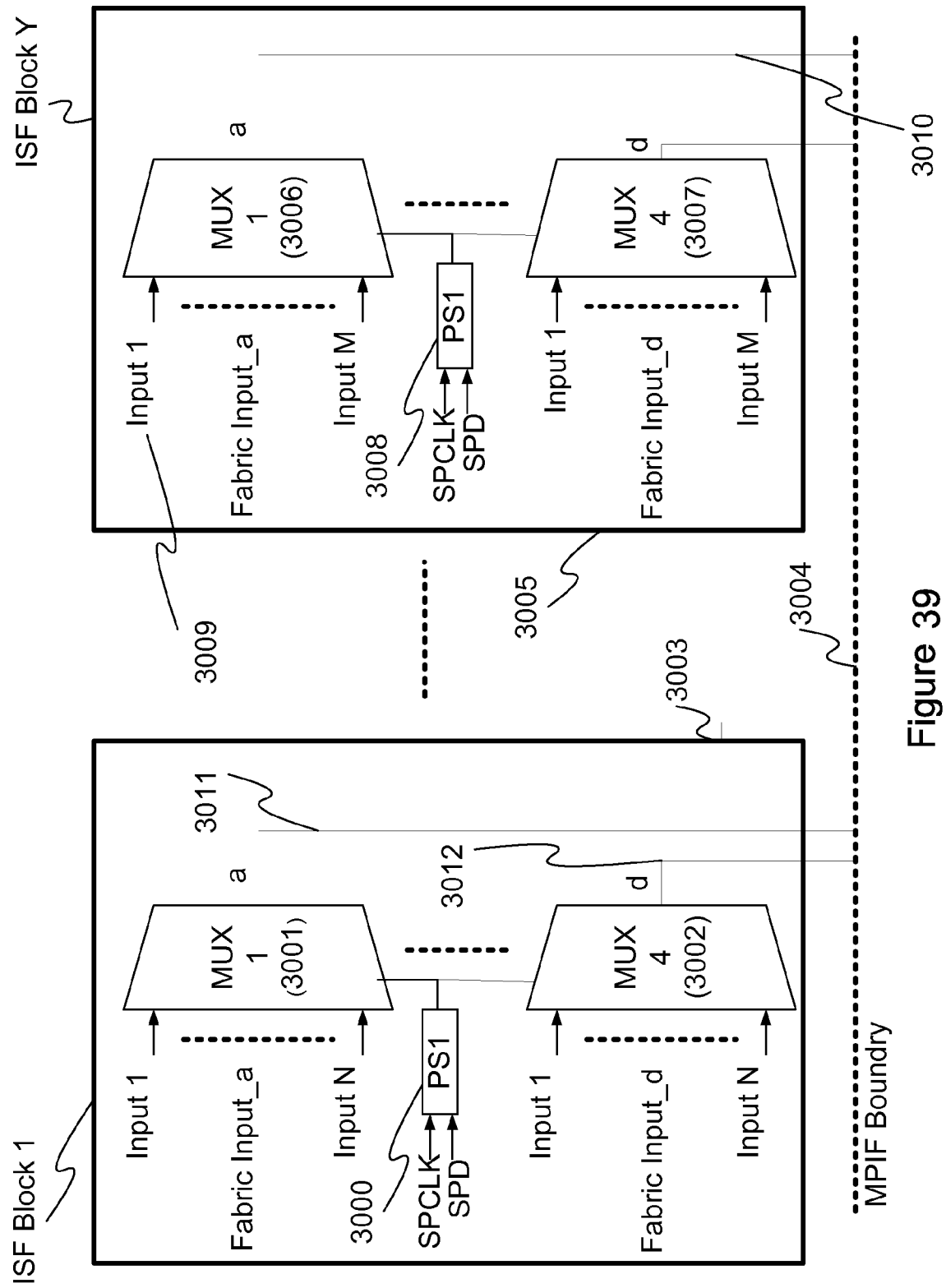
FIG. 39 shows an ISF Interconnect for Logic Units (LU).

FIG. 39 illustrates Logic Unit fabric typical configuration. Inputs (3009) from various sources feed the Routing Mux block (3006), and the output from the Mux (3010) drives the Logic Unit of BaseStack via the MPIF (3004). The routing decision of which signal is selected and feeds the Logic Units is done by the MUX selector (3008). The Mux Selector (3000) or (3008) are fed from the Programming Block of CoreStack. The value for the Mux (3008) is generally static and correlates to the image intended for the HPLA downloaded into the Programming Block of CoreStack.

A Logic Unit within the BaseStack requires several inputs as a function of the size and number of LUTs used. In this example, and Interconnect Switch Fabric (ISF) (3003) provides 4 Input configuration of "a" (3011) to "d" (3012). Other numbers of Input for Logic Unit can be constructed.

The number of ISF Blocks (3003) at the CoreStack are generally match the Logic Units resident inside the BaseStack. In this case, ISF Block 1 (3003) to ISF Block "Y" (3005) correspond to ½ of "Y" numbers of Logic Units of BaseStack.

Figure 40:
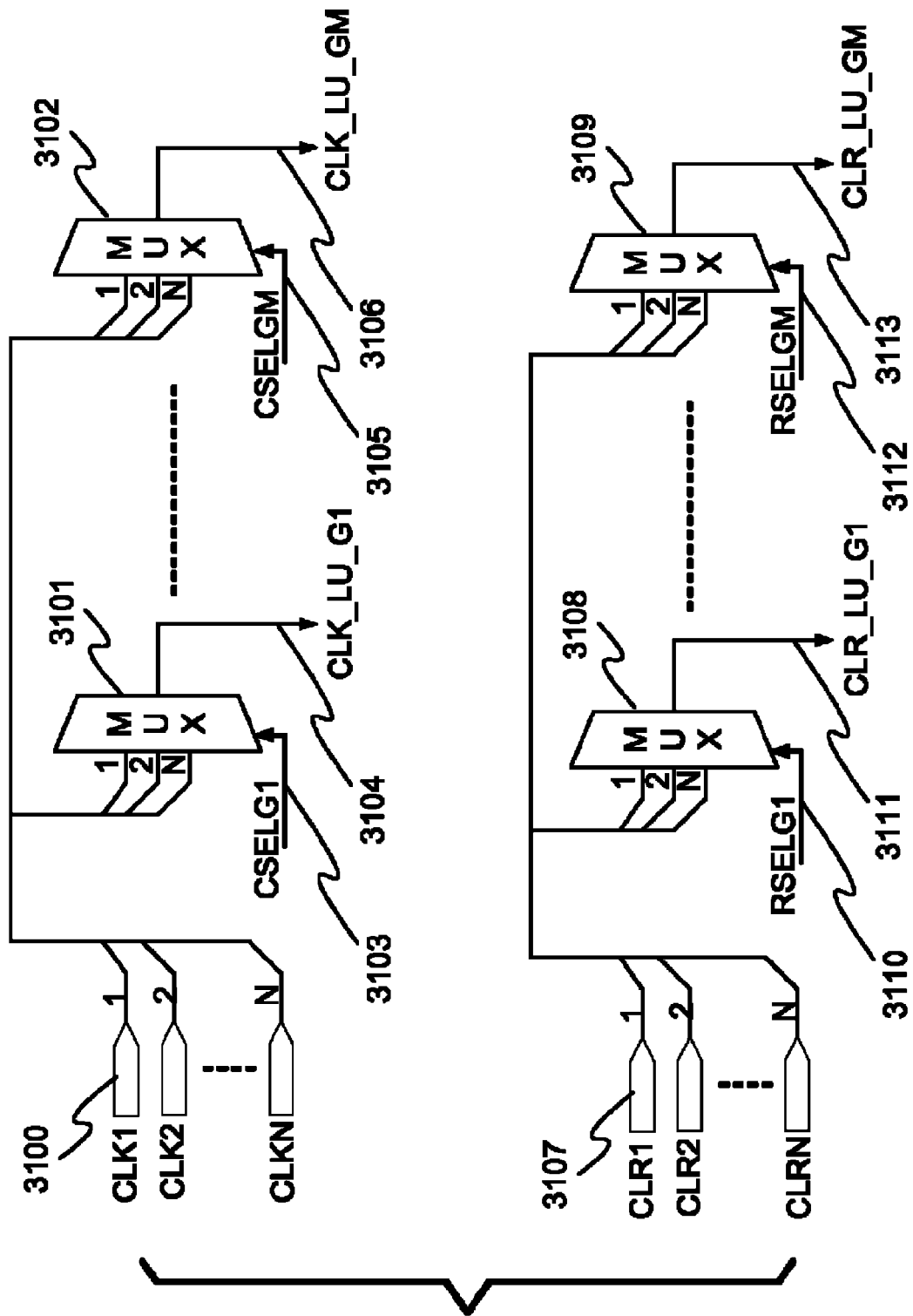
FIG. 40 shows an ISF clock, reset and control routing/switching.

FIG. 40 shows ISF clock, reset, and control routing/switching. In a similar way, the global signals, such as clock or reset, are fed to the CoreStack, for routing to required blocks within the BaseStack. A HPLA can consist of one to many of these signals. Each Logic Unit or BaseStack functional block may have at least one clock (3104) from the many clock sources (3100), provided via a dedicated mux (3101). The same description applies to other global common signals, such as CLR (3107).

Figure 41:
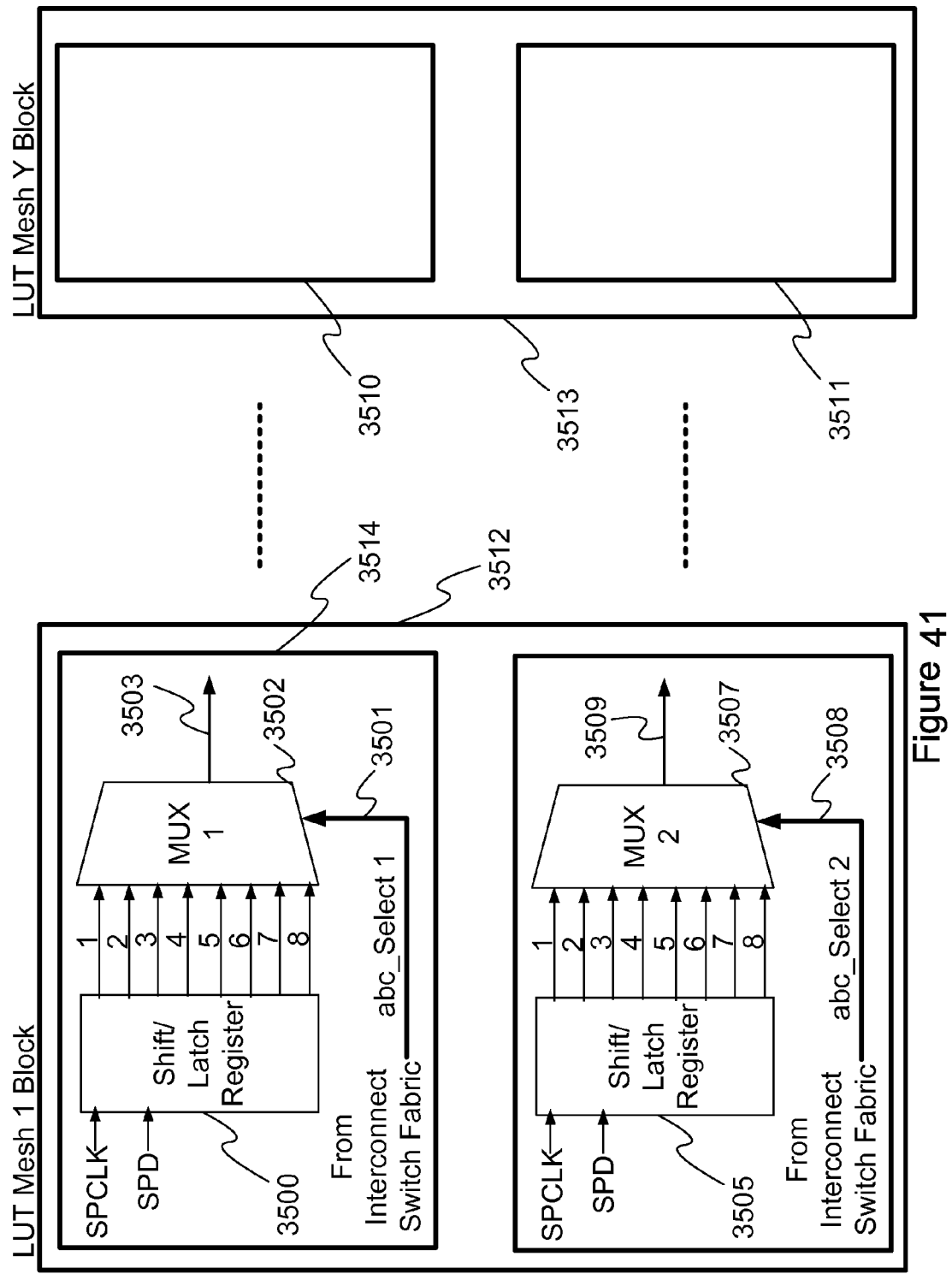
FIG. 41 shows a Programmable Look Up Table (LUT) construction, residing in CoreStack.

FIG. 41 illustrates that one method Look Up Table (LUT) Mesh can be constructed at the CoreStack. The LUT has generally been a part of the Logic Element of FPGAs, and tightly coupled. With HPLA, the LUT is decoupled from the Logic Element of the BaseStack and pushed into the CoreStack. However, the MPIF continues to keep the LUT and Logic Element tightly coupled, hence, removal of the configuration storage required for the Logic Element to CoreStack, in a 3D construction and removing the LUT function, once final configurability or programmability is completed, replacing it with MPIF RDL/metal layer(s). To construct a LUT of 3×1, an eight bit shift register (3500) and a multiplexer or MUX (3502) can be used. To select the output of the LUT, a 3-bit control, abc_select (3501) is connected to the MUX selecting of one eight combinations, programmed into the Shift Register (3500).

Different size and type of LUTs have been implemented, such as 4-Input, one output. In this illustration, a 3-Input LUT is demonstrated (3514). During the programming phase, the LUT (3500) is loaded with a bit stream from Programming Interface. During the HPLA operation, the abc Selects (3501) picks which one of eight value bits stored inside register (3500) is selected and presented at the output of the MUX (3503). The MUX output (3503) feeds the MPIF block, which eventually feeds the Logic Element of the BaseStack.

In this illustration, there are two LUTs (3512) per each Logic Units resident in the BaseStack. The LUT Mesh (3512), once removed as part of the hardening process, would be replaced with the 3LUT_ROM, within each BaseStack Logic Unit. The 3LUT_ROM is also configured by methods described. The value of each 3LUT_ROM would be a binary representation of the Shift/Latch Register (3500). Having the 3LUT_ROM as a static image of the LUT Mesh, it occupies less area and uses less power, due to reduction in complexity of the configuration and signal routing overhead, and converting the volatile memory to non-volatile memory.

For LUT Mesh Blocks (3512) at the CoreStack, each corresponds to 3LUT_ROM pair resident with each Logic Unit. The number of LUT Mesh per Logic Unit and HPLA can be different, depending on the requirement of that particular HPLA implementation.

Figure 42:
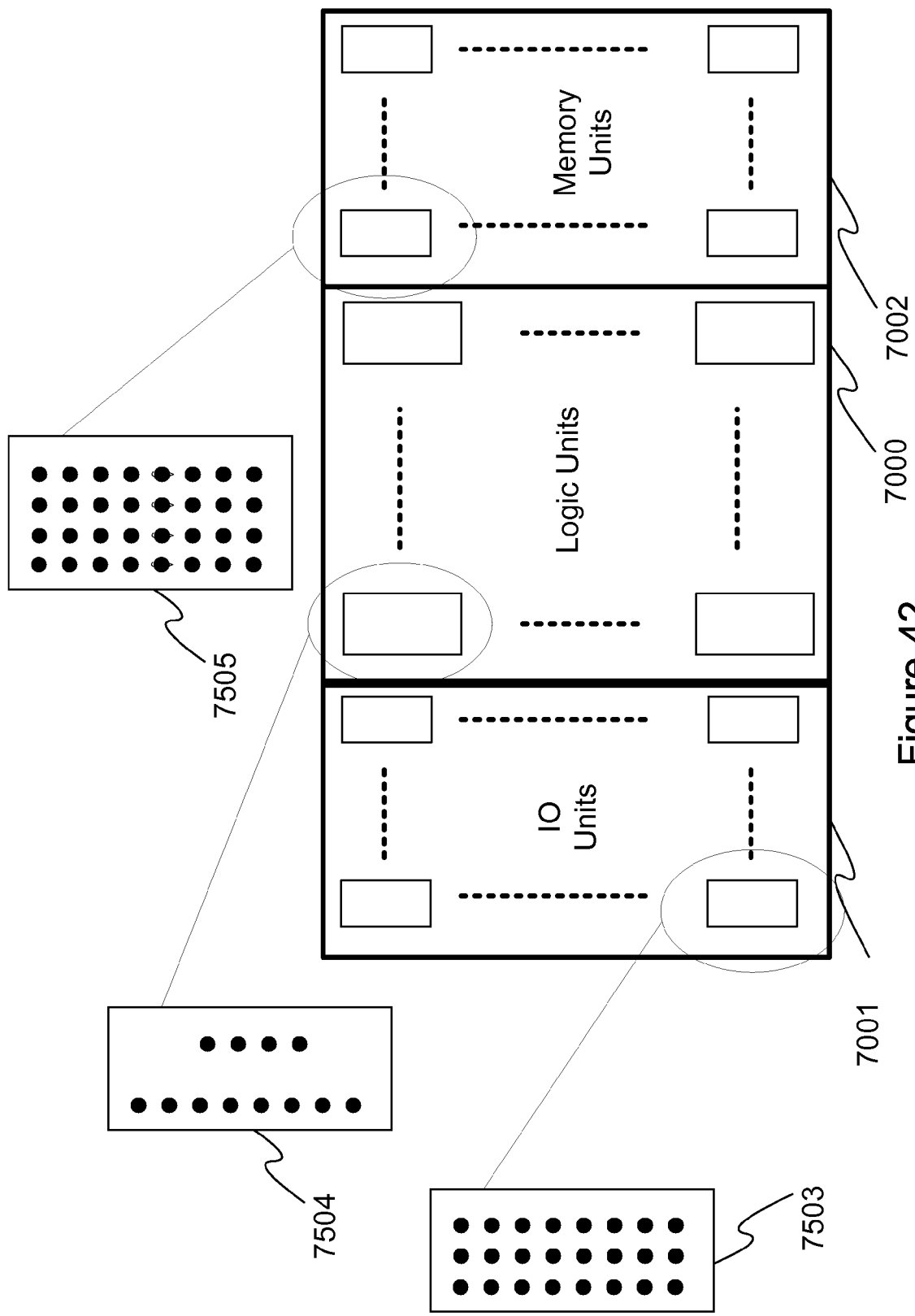
FIG. 42 shows a footprint of MPIF layer with different sub-blocks and possible different patterns—I/O block, Logic Unit and Memory Unit. (MPIF Hardening (MPIF Layer))

FIG. 42 illustrates one possible high level construction of HPLA, viewed at the junction between the BaseStack and CoreStack. It also attempts to illustrate one arrangement of different logical blocks between the two Stacks. In this particular case, a bank consists of IO Units (7001), Logic Units (7000), and Memory Units (7002). With an implementation of HPLA, one can include more than one bank of each functional blocks, constructing a larger configurable device, such as a matrix of 16 Logic Units (7000), corresponding Memory Units (7002), and IO Units (7001). Such partitioning creates a hierarchal structure.

The MPIF patterns (7503), (7504), and (7505) of each functional block would be different, addressing its interconnect requirements via the MPIF Layer. These MPIF patterns represent Via connections from the BaseStack and the corresponding CoreStack. The via connection are routed inside each die substrate, connecting to the transistors of the die, as described above.

Each Logic Unit has a corresponding MPIF pattern (7504). These patterns collectively are via connection to the logic gates constructing the Logic Unit. The pattern for a Logic Unit would represent the input and output signals to and from the BaseStack and CoreStack. A HPLA device, while in programming or configuring mode, would contain a BaseStack and a CoreStack, each having a matching MPIF pattern where the vias make the electrical connection between the top die and the bottom die in a 3D construction. In this case, where the HPLA is enabled to be programmed via an external source, the MPIF acts as bridge between the CoreStack and BaseStack.

Once a HPLA is intended to be hardened, the manufacturing process would replace the CoreStack with additional routing layers, referred to as the Redistribution Layers or RDL, to create the interconnect between different blocks of IO Units (7001), Logic Blocks (7000), Memory Units (7002), and other blocks, such as the Hardmac (not shown in this figure), etc. The interconnect would also be between the Units of each larger blocks. For example, many individual Logic Units (7504) can construct a larger logical block, such as a binary counter, by daisy chaining these blocks.

The MIPF patterns for any of logical units, for example, Memory Unit (7505), can be and would be different, depending on the architecture of HPLA. The arrangement of these patterns and their placements are a function of the HPLA product and its intended market and application. A HPLA may be constructed for the Networking applications where the IO pattern (7503) for the IO Units (7501) would require specific placement for high speed interfaces, where as for an Automotive or mobile applications, the IO pattern would be constructed with a different arrangement.

Figure 43:
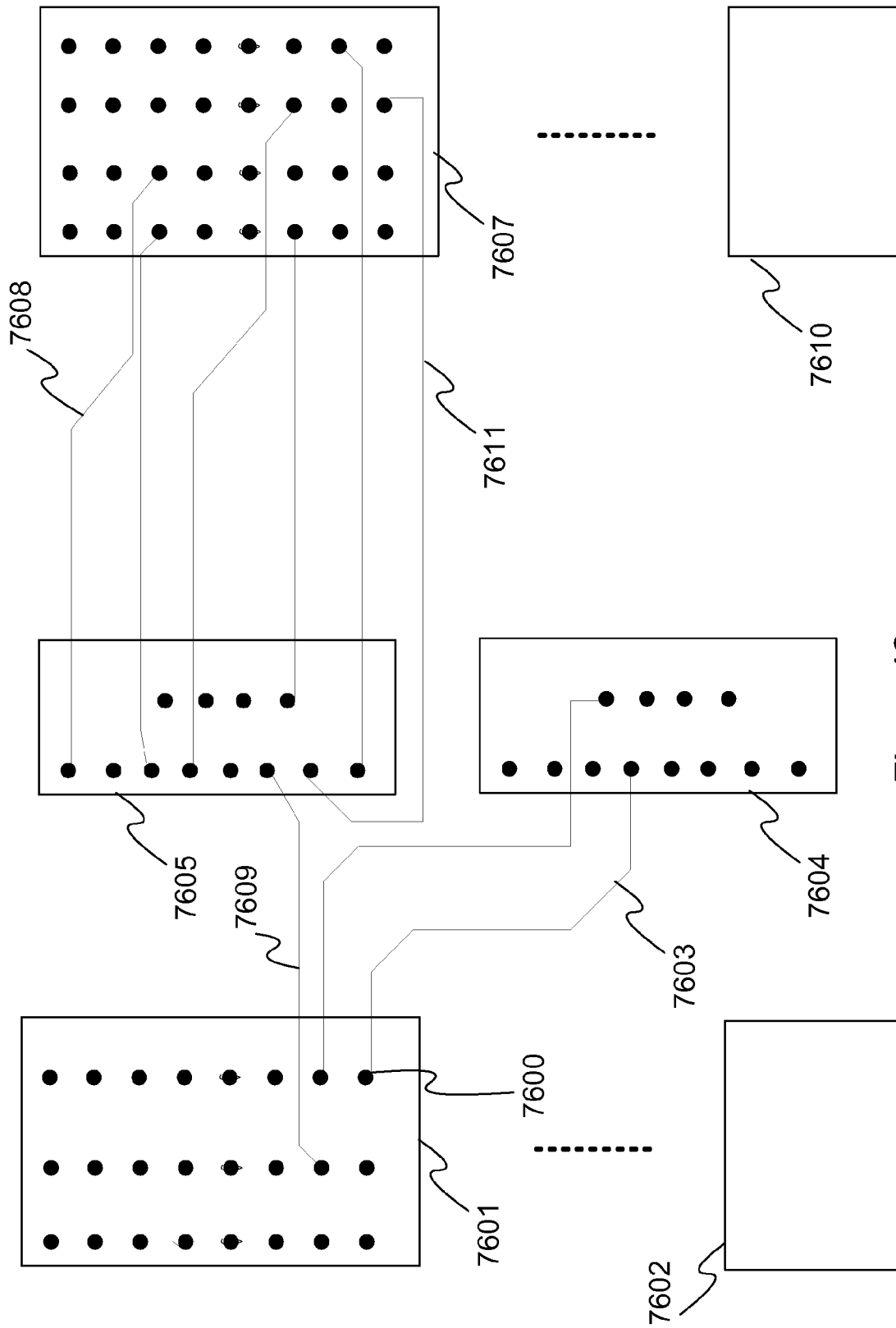
FIG. 43 shows an example case of hardening process with interconnects between MPIF connections, by physically routing signals. (MPIF Hardening (RDL Layer))

FIG. 43 illustrates an example of how interconnects at the MPIF are implemented. Generally, the Hardening process of a HPLA would use the BaseStack and RDL or metal layer to create a final product representing a particular image for a logical behavior of the BaseStack. In this figure, an IO Unit (7601) is routed to a Logic Unit (7605), Logic Unit (7404) and a Memory Unit (7607). A standard or customized EDA tool can be used to create the routing, based on the design files generated. The routing can be completed with an addition of single metal layer or multiple metal layers. The number of layers is generally a function of the architect of the logical units, their placement from each other, and spacing of MPIF, dictating the routing channel available within each layer.

In FIG. 43, an example of routing at the MPIF is shown. MPIF via (7600) from the IO Block (7601) input is connected to the Logic Unit (7604) MPIF via driving one of its inputs. MPIF via connection between the IO Unit (7601) and Logic Unit (7605) are made through the routing signal (7609). Signal (7608) connects the MPIF via from Logic Unit (7605) to Memory Unit (7607). In this case, an example would be the output of Logic Unit (7605) Register is driving the address bit of the Memory Unit (7607).

Figure 44:
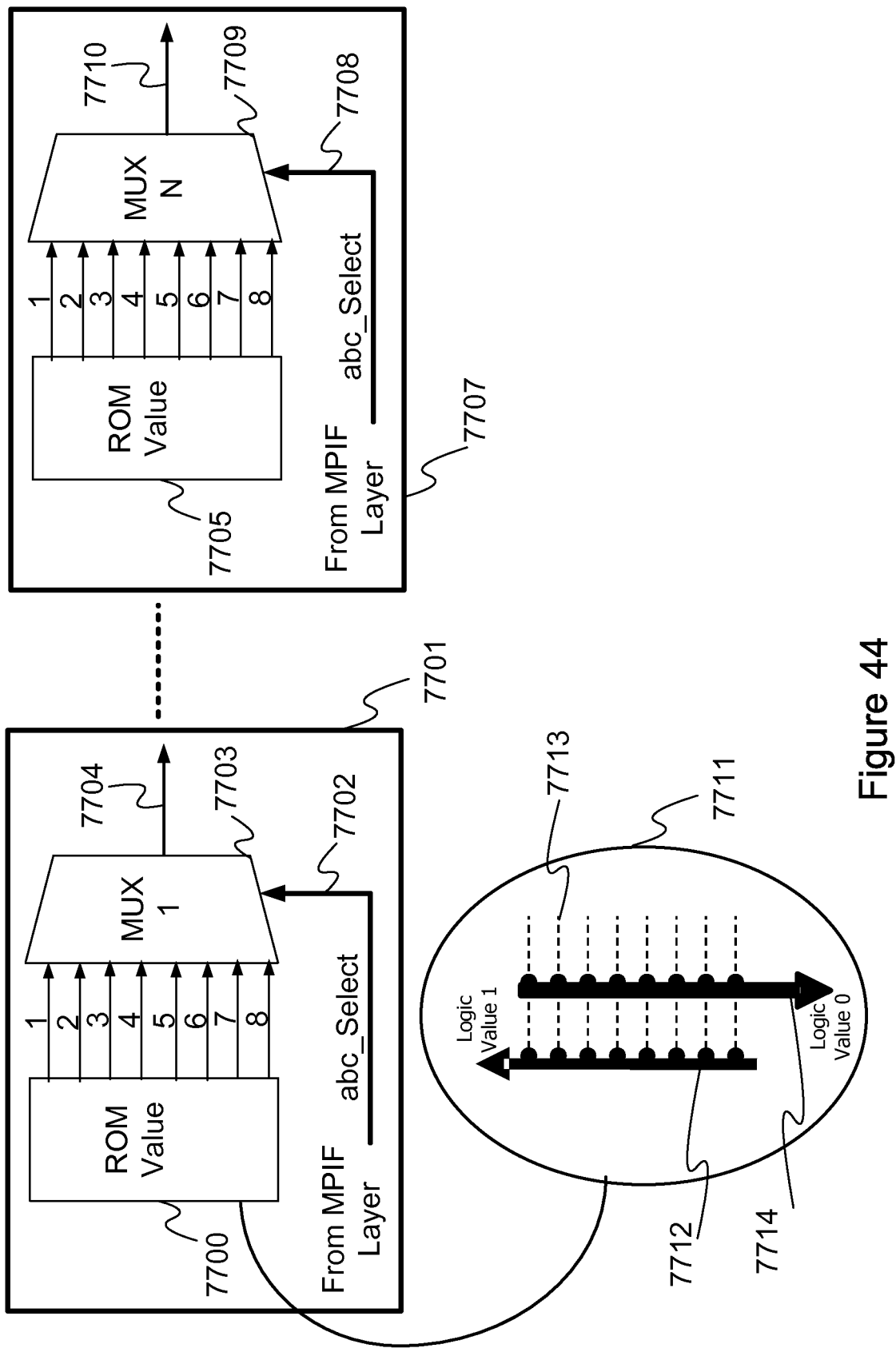
FIG. 44 shows The ROM (Read Only Memory) residing in BaseStack representation of LUT. (MPIF Hardening (3LUT_ROM Layer))

FIG. 44 illustrates the hardening process of 3LUT_ROM (7701) within the Logic Unit or other Units residing at the BaseStack. Generally, the 3LUT ROM is bypassed, when in programming mode, where both the BaseStack and CoreStack are constructed in 3D. The 3LUT ROM function is displaced during the programming mode, with the LUT Mesh block of CoreStack of HPLA. A MUX within the Logic Unit places the 3LUT ROM logic in bypass mode.

During the hardening process, or once an HPLA is hardened, the 3LUT ROM is configured to represent the logical behavior of its corresponding LUT_Mesh logic. The configuration can be implemented through the MPIF or at the lower Metal Layers of the BaseStack. The number of input to the ROM can be 2, 3 or higher count, dictating the size of the ROM. A 3 input ROM with one output would require 8 binary values, that need to be stored. A 4-input, one output ROM would require 16 binary values, etc. For a construction of BaseStack Logic Unit ROM, there is a corresponding LUT, as part of the LUT Mesh, representing the same number of ROM and LUT inputs. The LUT Mesh is used during the programming phase, and the ROM is used when the HPLA is hardened. In both cases, the HPLA can be used as a production vehicle. However, the Hardened HPLA would most likely be lower power and at lower cost of manufacturing.

The ROM or Read Only Memory, (7701) or (7707), can be constructed, utilizing industry standard EDA tools, and compiling for the specific ROM configuration. A ROM (7701), in this case, is constructed from a x-input MUX (7703) strapped to a binary ROM Value (7700). Signals from the MPIF layer (7702) are connected to the address select of the ROM, allowing the accessing each location of the ROM. A binary 0b000 on the (7702) would select location "1" of the MUX (7703). The logical value of location "1" is then presented at the output of the MUX (7704). Each binary value of the ROM (7701) is configured during the hardening, through the ROM Value (7700).

Each 3LUT ROM (7701) has a pattern (7711) which allows both a Logic value 1 (7712) or Logic Value 0 (7714) to be available during the hardening process, where each input to the MUX (7703) can be fixed or hardened to a value "One" or "Zero". The hardening values can be implemented as part of lower layers of die, closer to the substrate and the transistors of HPLA, fusing the ROM to the specific value, OR the values can be driven from the MPIF layer. Hardening the ROM, by leveraging the MPIF, would place additional vias at the RDL layer, possibly resulting in more congestion, where having to leverage Metal-1 or Metal-2 of die buildup buries the signal, resulting in denser implementation of hardened HPLA. However, adding additional manufacturing steps impacts manufacturing time and cost.

Figure 45:
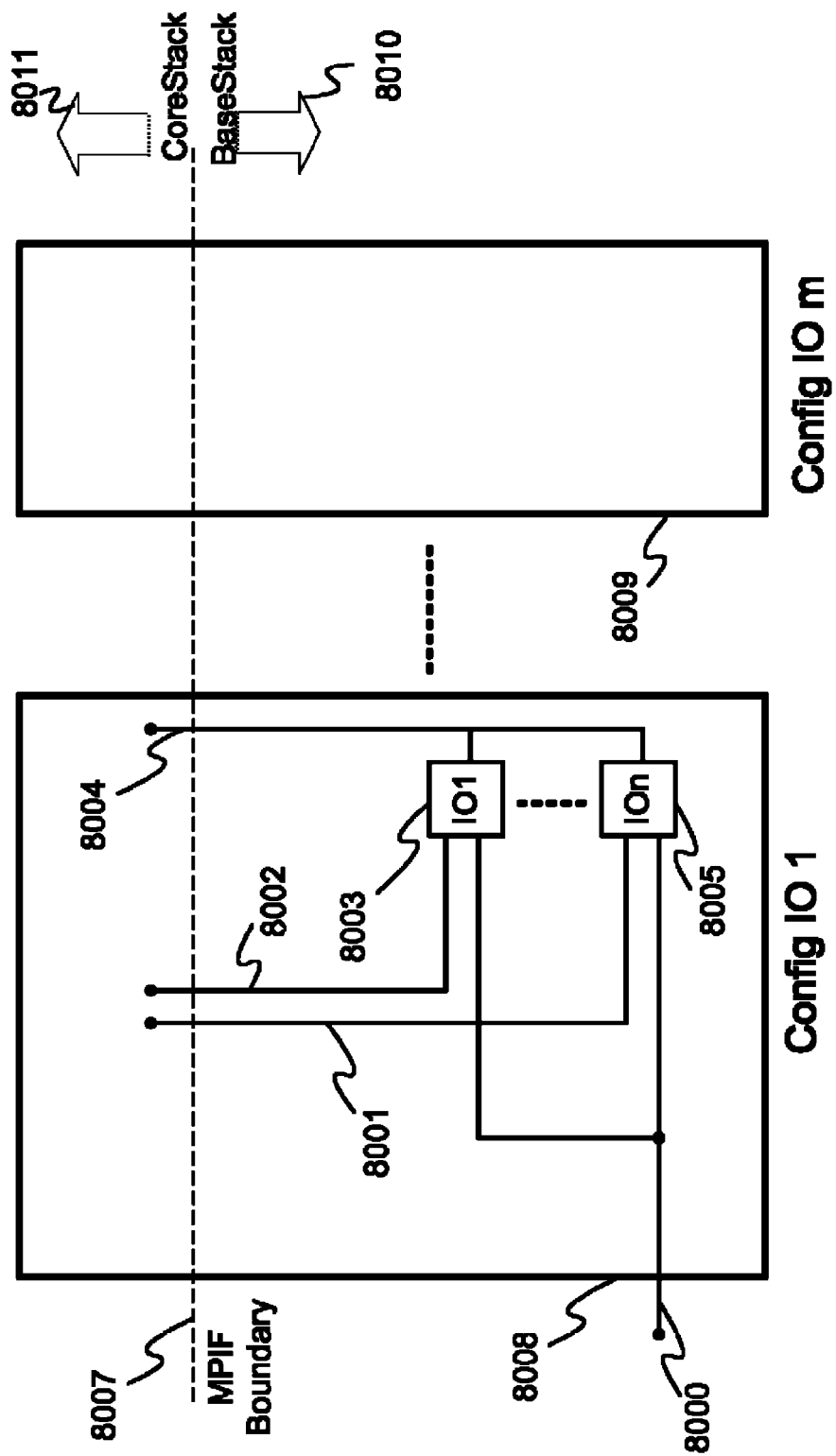
FIG. 45 shows HPLA 10 blocks, where multiple 10 standards in parallel are collapsed into a single IO slot. (Standard Programmable Input/output Bank)

FIG. 45 illustrates Input and Output construction of HPLA. I/O are standard requirement of any die requiring interface to other die or input/output devices such a USB, UART, etc. I/O signals can be single ended (HSLT, SSTL, etc), differential (LVDS, PECL, CML, etc), high speed signals based on Serializer/Deserializer (SerDes) (PCIexpress, Ethernet, etc), or mixed signal (analog to digital converters, ADC, etc).

FPGA requires many of the I/O interfaces to be flexible and programmable. For this purpose, one architecture can place all required and relevant interfaces and connect them in parallel, creating an I/O interface that can be configured to many different standards utilizing the FPGA programming interface. An example would be an I/O that can be both SSTL, HSTL in single ended mode, as well as LVDS in differential mode, when a signal pair is used. The challenge or issue with this approach is the implementation of the I/O, supporting many different interface standards, causing the I/O block die area to grow substantially. A design can leverage and take advantage of the overlap between the standards and reduce the area associated with each I/O. In addition to the complexity of the I/O construction, the selection of the I/O requires intelligence within each I/O that is loaded as part of the bit stream (image) for the specific implementation or configuration of the I/O. This configuration capability would add additional area and complexity, impacting cost and power associated with the FPGA.

With HPLA, the programming function of an I/O is moved to the CoreStack (8011), from the BaseStack (8010), connected via the MPIF layer (8007). Different I/O standards of IO1 (8003) to IOn (8005) can be placed in parallel and connected via a common interface (8004), feeding the MPIF Layer (8007). And I/O (8000) can be an input signal, output signal or bidirectional signal. The I/O (8000) interface from the outside of the HPLA feeds the I/O blocks IO1 (8003) to IOn (8005), for processing of different standard, requiring different voltage level, hysteresis, termination, drive capability, protection, etc. A design of Config IO (8008) can leverage the overlaps between different standards, resulting in reduction of area and possible performance improvement. Configuring an IO block (8008) is done via the CoreStack (8011) Logic (8001) for IO1 and (8002) for IOn, connected through the MPIF Layer (8007) to the BaseStack (8010).

A HPLA may contain no Configurable IO, one configurable IO (8008), or many configurable IO (8009). The IO count and the type of IO are a function of application and market the HPLA is targeted for.

The IO programming is done at the CoreStack (8011). During the configurability or programming of HPLA, the Interconnect Switch Fabric of CoreStack (8011) selects which output functions should be enabled.

During the hardening process, the RDL or metal at the MPIF Layer (8007) is implemented to create the interconnect/routing between the IO Units and other Units, such as the Logic, Memory, Hardmac, etc.

Figure 46:
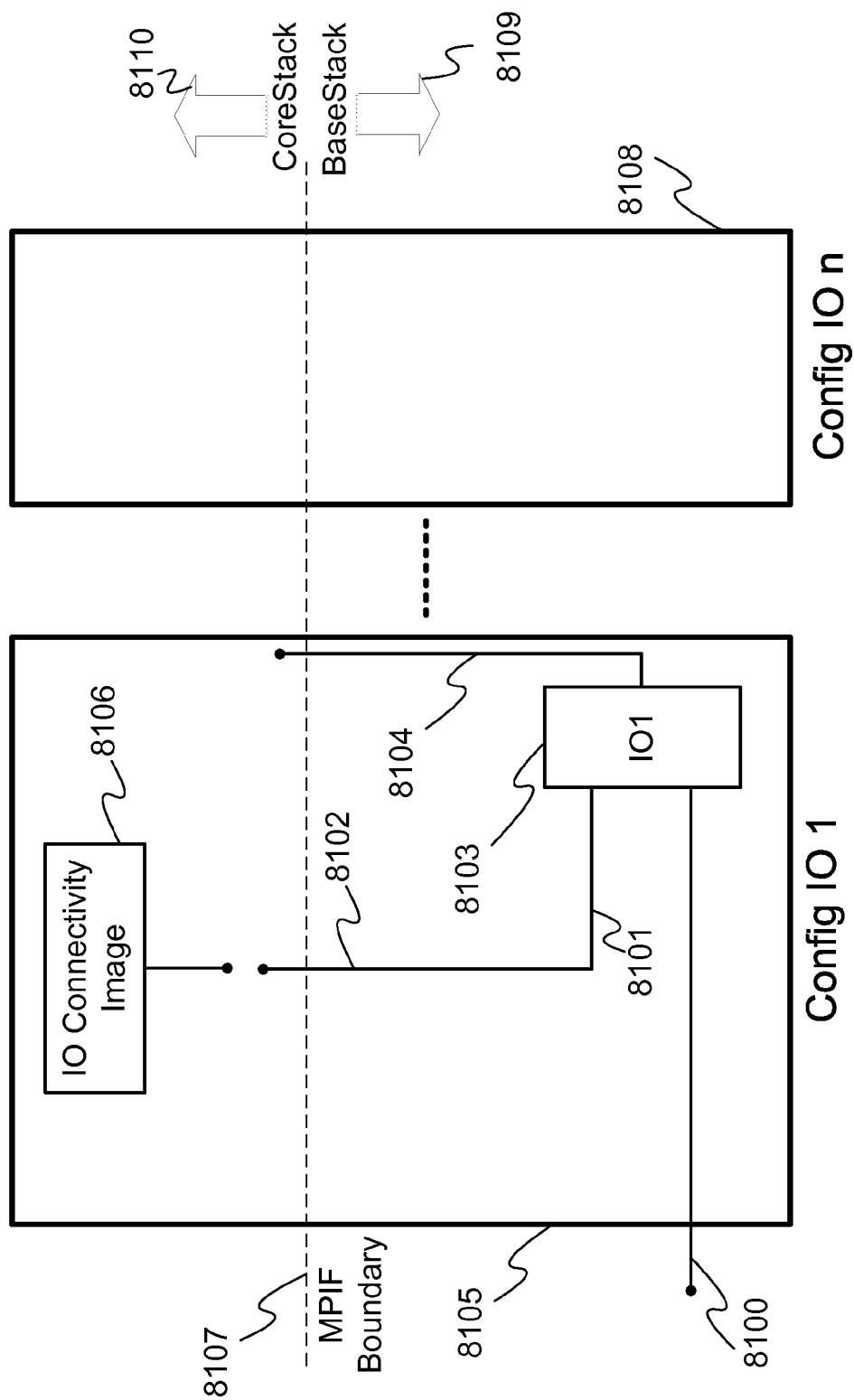
FIG. 46 shows a HPLA SoftIO as an alternative to HPLA IO, where the layer(s) through the MPIF mask the desired IO. (Soft Maskable Input/output Bank)

FIG. 46 illustrates another method of implementing configurable IO.

Multiple I/O structures, generally residing on the die IO Slot, can be constructed, leveraging a single logical and mixed-signal base (8103), configured to different IO standard through MPIF, either via a CoreStack Logic (8106) or hardened at the MPIF layer (8107), via the RDL layer.

The IO Connectivity Image (8106) residing at the CoreStack (8110) can be loaded with different images, each representing different IO Standards. These images are routing signals that configures that personality of each IO (8103), to behave like a HSTL interface or LVDS interface at the HPLA input (8100). Such implementation further reduces the die area associated with the BaseStack (8109). The IO Connectivity Image (8106) maps over the IO block (8103) via the MPIF signal (8102). During the hardening process, a similar representation of IO Connectivity Image (8106) is created with the RDL layers, through the MPIF (8107).

Figure 47:
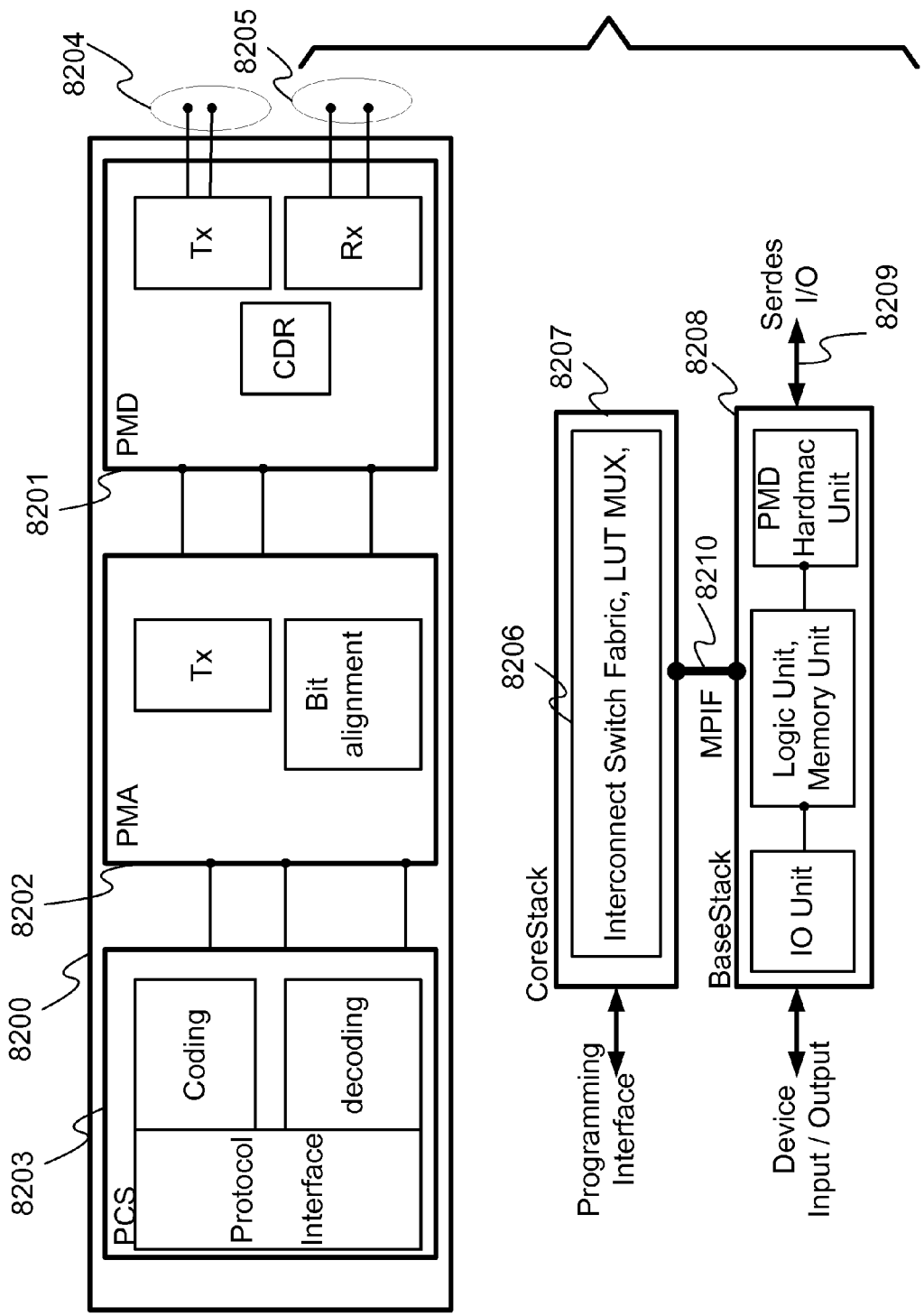
FIG. 47 illustrates how a high speed serdes can leverage the benefits of HPLA. (soft serdes)

FIG. 47 illustrates how a high speed serdes can leverage the benefits of HPLA. Generally, with most high speed interface, there are three components contributing to the Physical Layer: 1) Physical Media Dependent, PMD (8201), 2) Physical Media Attachment, PMA (8202) and 3) Physical coding Sublayer (PCS) (8203). The PMD (8201), mainly mixed-signal circuitry, deals with the media and signaling between the Transmitter and receiver, plus signal conditioning to assure error free connection (low bit error rate) and operation of the link. The PMA (8202) block is also tightly coupled with the PMD (8201) and responsible for bit and word alignment and recovery in accordance to the running protocol. The PCS (8203) block is generally based on digital logic and significantly differs from one standard to the next. In many designs, a common PMA plus PCS is developed, and the PCS is designed for each required standard. For-example, a serdes can be designed to support physical connectivity for Fiber Channel, PCI express, Gbit Ethernet, 10G, and more, with each interface supporting multiple sub-standard (PClexpress Gen1 vs PCI express Gen2, Gbit and 10 Gbit Ethernet MAC/Link Layer). As a result, a design requiring multi-standard interface would need to account for all the digital logic associated with each protocol/standard, even though not all protocols are supported with each design implementation.

Si-Face HPLA, on the contrary, can design a serdes interface so that the programming overhead with the implementation of the PCS does not have the impact the FPGA or standard product introduction. A common serdes front end (PMD plus PMA) can leverage the configurability of a HPLA (8208) for many or all the above standard, without the penalty of overhead associated with either duplicating the functions in a standard product case, or inefficiencies of FPGA with area and power. The PCS logic may be implemented inside the CoreStack (8207), to address multiple protocols for each flavor or version of the device. For example, the BaseStack (8208) would support protocol templates for 4 channels of SGMII Gbit Ethernet, or one channel of XAUI 10 Gbit Ethernet or 4-channel PClexpress Gen-2. The PCS layer for this example can be configured inside the CoreStack (8207). (For example, for Gbit operation, IEEE 802.3 GE MAC protocol, for 10 Gbit operation, IEEE XGE MAC protocol plus XAUI, and for PClexpress, the transaction layer and pipe.) An interface protocol can further be hardened by replacing the CoreStack (8207) with RDL Layers.

Figure 48:
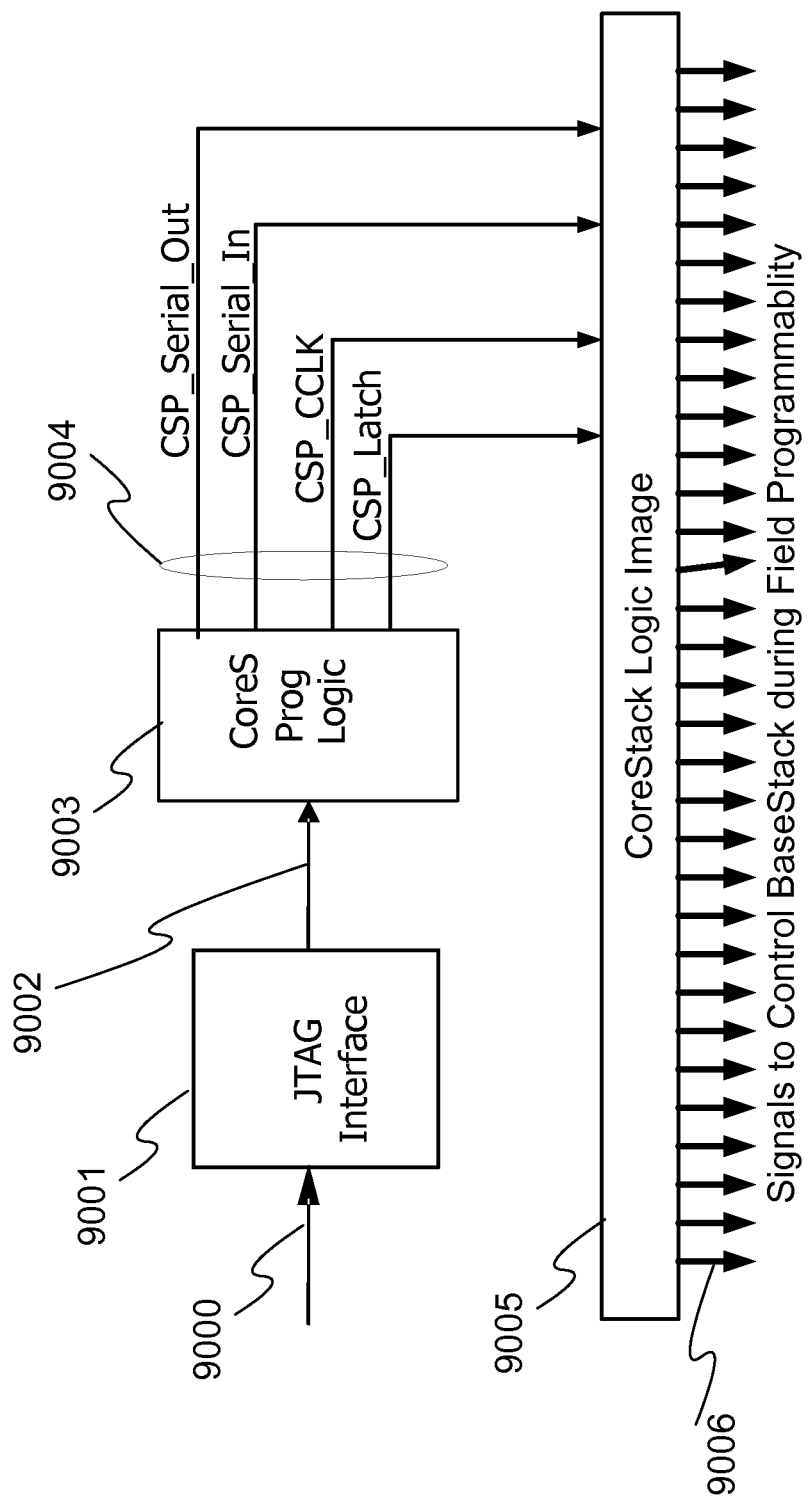
FIG. 48 shows a CoreStack programming interface block diagram, controlling the BaseStack.

FIG. 48 illustrates the CoreStack Programming interface. A HPLA can be configured to logically behave differently, based on the bit stream image that is loaded into the CoreStack. The bit stream image (9000) is generally a serial stream representing how the CoreStack is configured to control the logical behavior of BaseStack. The CoreStack Logic Image (9005) bit stream is stored on a volatile or non-volatile storage. The storage element can be a shift register that is daisy-chained inside the CoreStack. The Shift register provides a parallel output (9006) that drives the CoreStack Logic, such as Interconnect Switch Fabric, LUT_Mesh, etc. The programming interface (9004) to the CoreStack Logic Image (9005) may consist of serial data input CSP_Serial_In, serial data output CSP_Serial_Out, shift clock CSP_CCLK, and the latch signal CSP_Latch, to present the bit stream image at the output of CoreStack Logic Image (9005). There are other techniques that can implement configurability at the CoreStack, such as use of Flash or EEPROM technology, as well as anti-fuse.

A common or standard interface for the CoreStack Programming Interface is the IEEE JTAG interface (9001). The JTAG signals (9002) are interfaced to CoreStack Programming Logic, which creates the necessary signals to convert and store the bit stream image inside the CoreStack Logic Image (9005).

Figure 49:
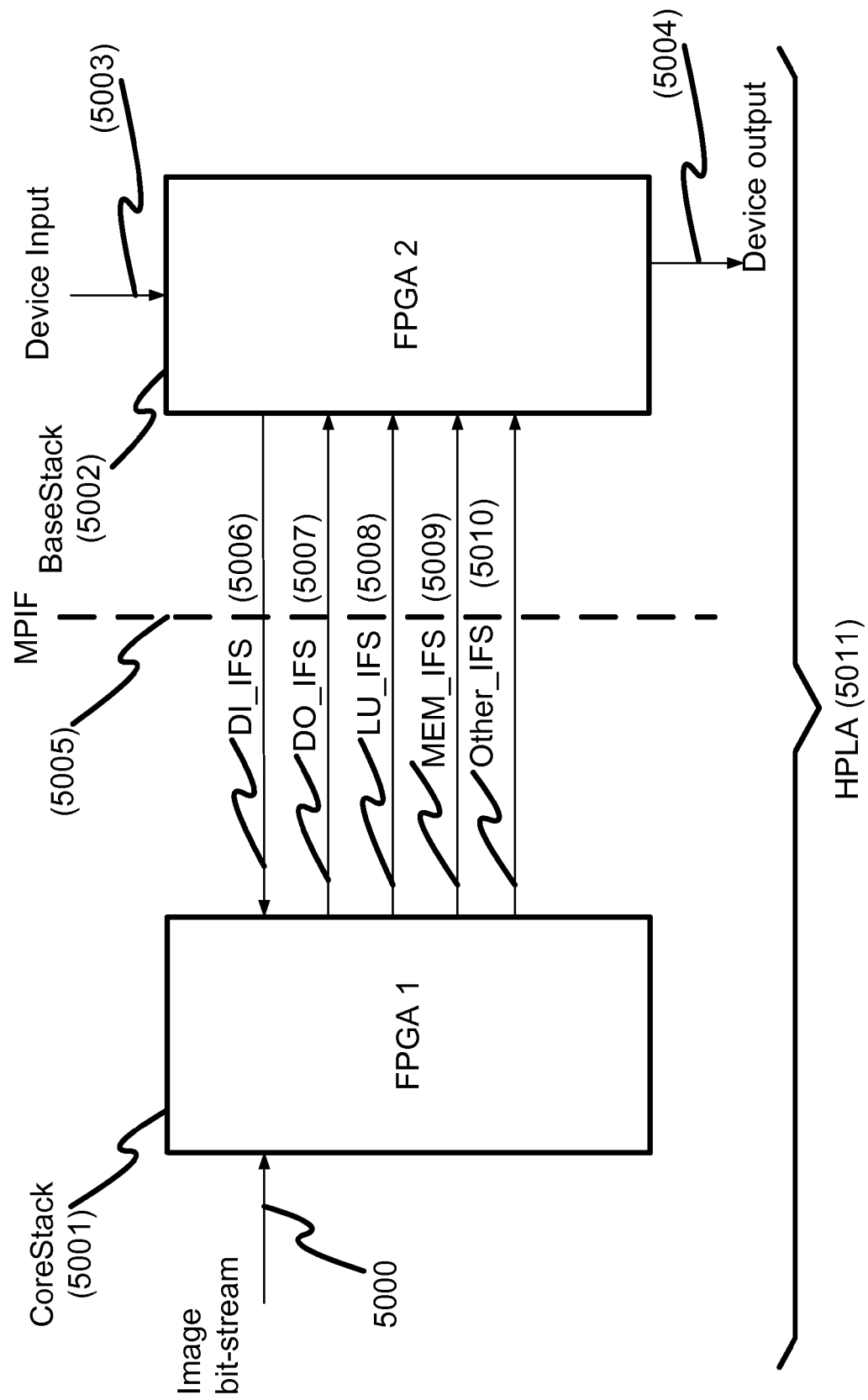
FIG. 49 shows a Basic SI-Face implementation and proof of concept of MPIF and HPLA, utilizing off the shelf FPGA. (FPGA CoreStack and BaseStack Demo)

Appendices A and B also describe some examples of the invention. Let's look at some other examples:

FIG. 49 illustrates a basic approach in demonstrating how an FPGA logic can be segregated into two parts—BaseStack (5002) and CoreStack (5001), leveraging HPLA (5011) MPIF (5000) technique.

For this example, two standard FPGAs are utilized. FPGA-1 (5001) implements the BaseStack, and FPGA-2 (2002) implements the CoreStack of HPLA, where the interface between the two devices (5005) represents the MPIF. The main intention for this example is to illustrate the separation between the storage and routing overhead components of a FPGA from the actual Logic Elements of an FPGA.

The HPLA consists of FPGA1 (5001) and FPGA2 (5002). The inputs to HPLA are via Device Input (5003), and the outputs for HPLA are through the Device Output (5004). The interconnects among the Logic Units, Memory Units and other functional blocks of BaseStack (5002) are implemented at the CoreStack (5001). The MPIF (5005) signals are the means of connecting The BaseStack (5002) to CoreStack (5001). These signals (5005) through (5010) include, and not limited to, control signals for BaseStack Logic Unit and Memory Unit, Device Input and Device Output.

Figure 50:
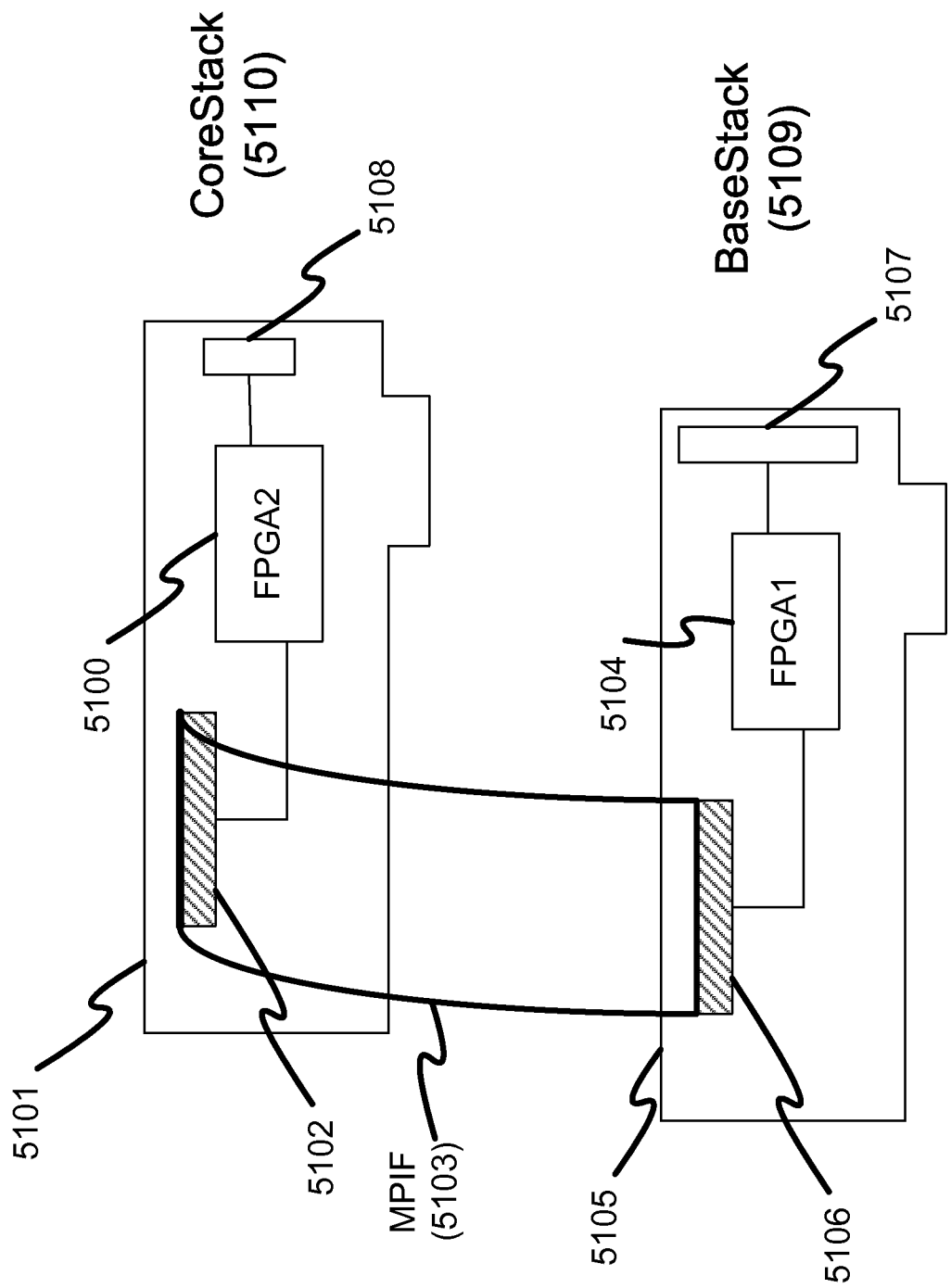
FIG. 50 shows a Utilized off the shelf FPGA development platforms to demonstrate BaseStack separation from CoreStack. (Si-Face Field Programmable Device)

FIG. 50 illustrates how BaseStack (5109) and CoreStack (5110) are implemented utilizing two FPGA development boards (5101) and (5105). The MPIF is emulated via a cable (5103) connecting the two boards. Each board contains a connector (5102) and (5106) that further connects to FPGAs.

The programming interface for BaseStack is via (5108) and the Device Input and Output are via connector (5107). The FPGAs (5100) and (5104) are programmed via standard FPGA tools offered by industry suppliers, such as Xilinx and Altera or other third party EDA suppliers.

The objective is to demonstrate how with an FPGA, the functional overhead associated to the programming of the FPGA, be separated from the actual Logic and memory used for the target application. As an example, to have a FPGA operate as a 4-bit counter and 2 bit decoder, the logical units of FPGA need to be configured with an image downloaded into the FPGA that allocates some logic units for a 4-bit counter function and other logic units for the 2-bit decoder. In addition, the interconnect and routing logic inside the FPGA need to be configured to make the right connection from each logic unit to the next, to exactly represent the behavior described for the counter plus decoder. Such overhead in the form of storage and routing impacts the area and power associated with an FPGA. By relocating the storage and routing logic to another device (CoreStack), the FPGA die size can be reduced. However, the large number of connections between the two die need to be connected via a massively parallel Interconnect Fabric (MPIF). The application can continue configuring the CoreStack, depending on the requirement changes or bug fixes. The final solution consisting of BaseStack and CoreStack can be shipped for production. Also, a final solution can consist of the BaseStack being hardened, where the CoreStack is removed and replaced with fixed routing signal layer(s). Once a device is hardened, the configurability aspect of HPLA is removed in favor of reduced cost and power.

Figure 51:
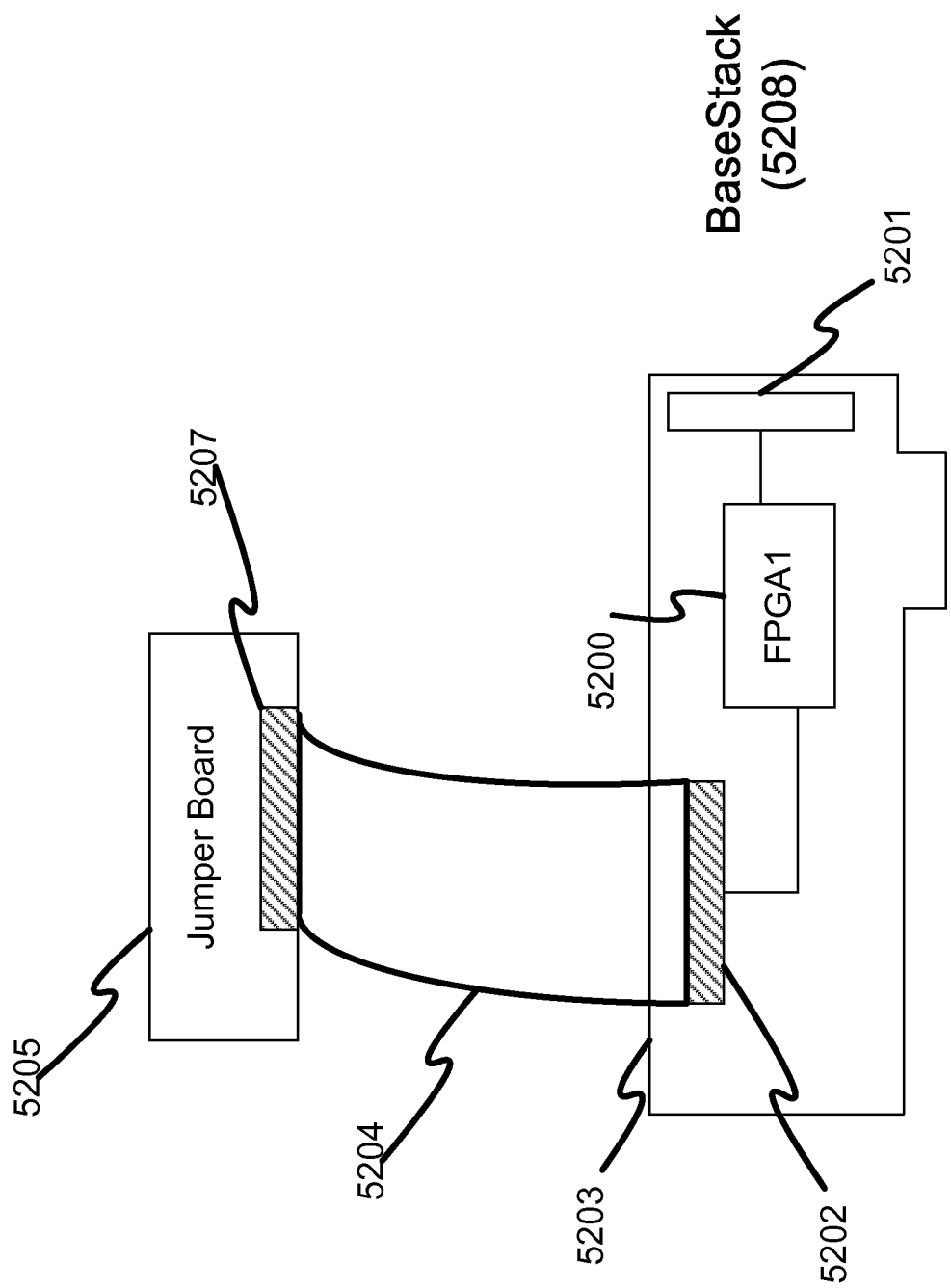
FIG. 51 shows a Hardening emulation of BaseStack by removing the CoreStack.

FIG. 51 illustrates the hardening process of the simple counter and decoder. The BaseStack (5208) is hardened by the process of removing the CoreStack and replacing it with hardening layer (5205). For the example, the routing layers are emulated by a jumper board (5205), providing the interconnects between different BaseStack Logical Blocks, such as the Logic Unit or Memory Unit.

With this setup, different logic implementation can be created and programmed in to the CoreStack, and when it is required to harden the BaseStack, the jumper board (5205) would be wired to logically represent the interconnect configuration.

Figure 52:
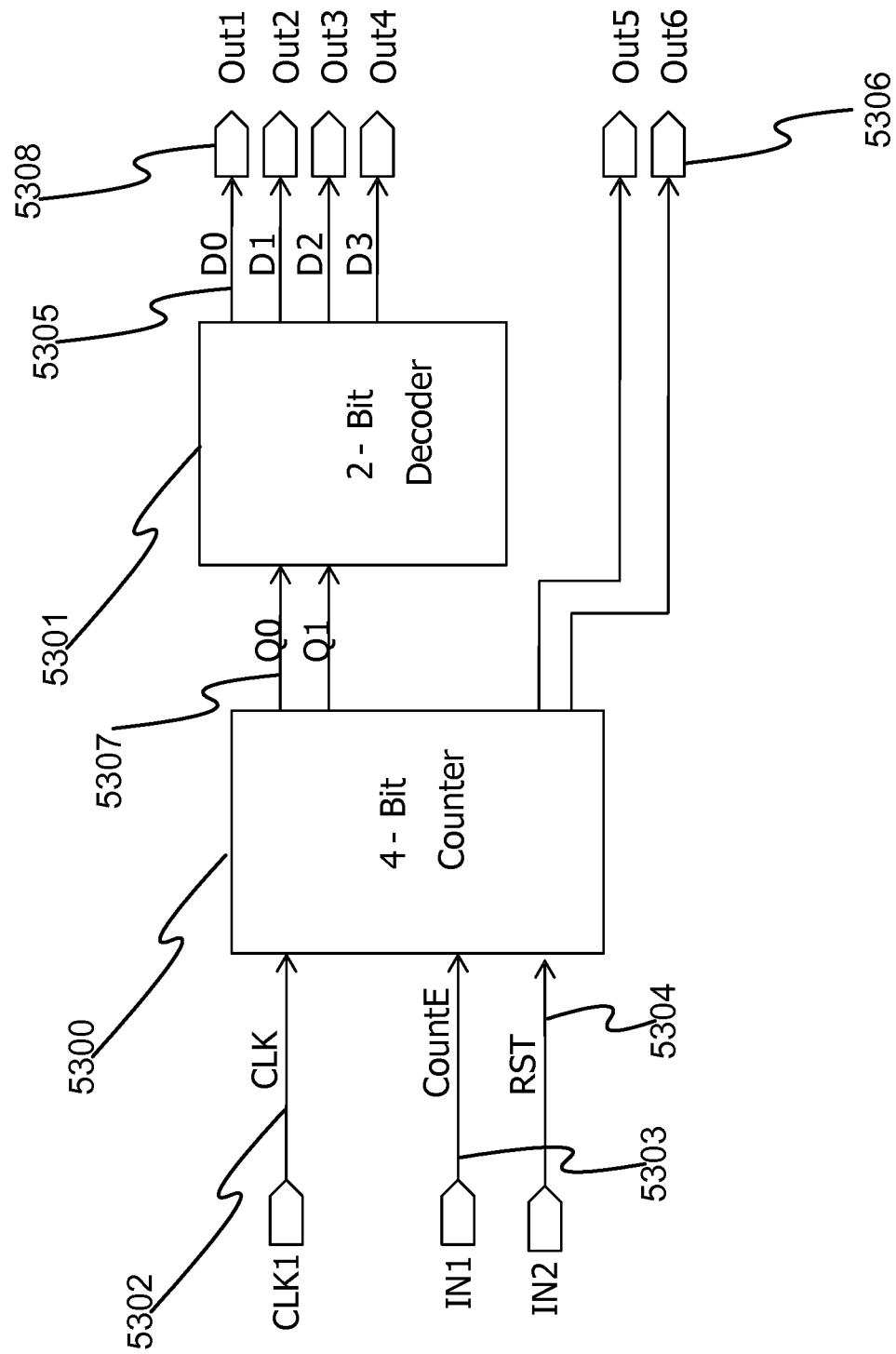
FIG. 52 shows a 4-bit Counter and Decoder implementation. HPLA implementation implemented in BaseStack and CoreStack. (4-bit Counter-Decoder)

FIG. 52 illustrates the logical block representation of the 4 bit Counter and decoder. A binary counter, for example, can be constructed by cascading four flip-flops in to a group (5300). The Counter (5300) increments by value 1 for each positive transition of clock edge (5302), while CountE (5303) or Count Enable is asserted. In the event RST signal (5304) is asserted, the Counter (5303) is reset to binary value 0'b0000 or zero, and stays at this value until deassertion of RST (5304) and clock (5302) positive transition. With a 4 bit Counter (5300), there are generally 4 output signals (5306) and (5307). Two of the 4 bit Counter (5300) signals (5307) are connected to another set of BaseStack Logic Units, grouped as a 2-bit decoder (5301). A 2 bit decoder generally outputs 4 decoded signals (5305). For each decoded signal, a Logic Unit is required to implement the decoding logic. As a result, total of 4 Logic Units are used to create the 2 bit Decoder (5301). The inputs to the 2 bit Decoder (5301) are driven from the 4-bit Counter (5300). However, only 2 of the 4 output bits (5307) of the 4 bit Counter are used to implement the decode logic.

The input (5302), (5303), and (5304) and output (5308) and (5306) signals are pins that are driven from the outside, and are part of the BaseStack. These signals are driven to the CoreStack, via the MPIF interface.

Figure 53:
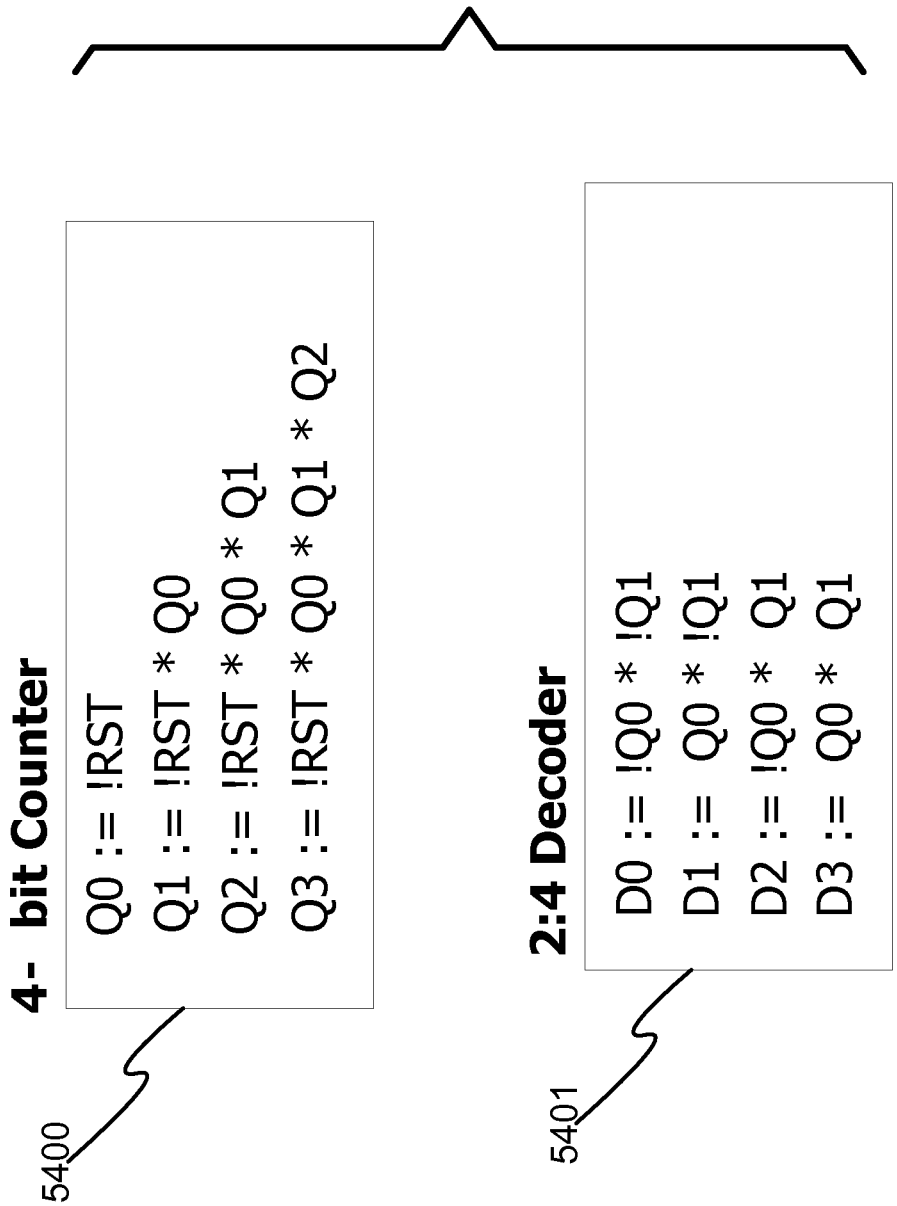
FIG. 53 shows a Logical expression of Counter and Decoder, to be implemented inside HPLA. (4-bit Counter-Decoder Equations)

FIG. 53 illustrates the equations representing the 4 bit Counter (5400) and 2 bit Decoder (5401). The 4 bit counter logic is made of T-Flip-Flops or Toggle Flops. In this case, The RST signal, de-asserted, would hold the counter from incrementing. This signal acts as the CountE signal. The equation for 4 bit Counter (5400) represents the logic inside illustration (5300).

The 2 bit Decoder logic (5401) represents the logical block of (5301). The input to the decoder logic is fed from the 4 bit Counter (5400). The decoder logic is simply a 2 bit to 4 bit decoder.

Figure 54:
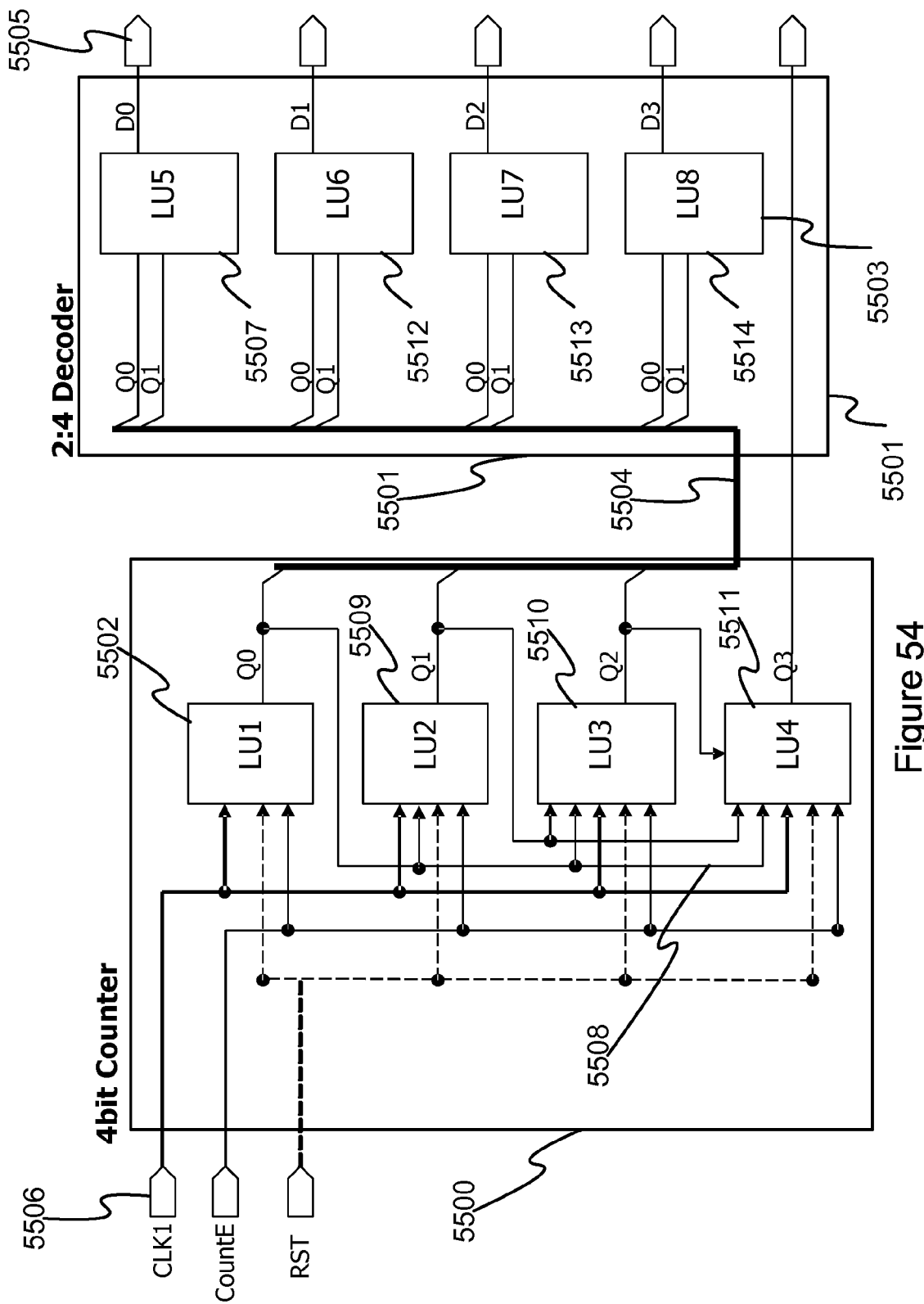
FIG. 54 shows a High Level schematic representation of Counter plus Decoder. (4-bit Counter-Decoder Block Diagram)

FIG. 54 illustrates Logic Unit level construction of 4 bit Counter (5500) and 2 bit Decoder (5501), as part of the BaseStack and all the interconnect, to configure the Logic Units (5502) and (5503) (to behave as a counter and decoder). With HPLA consisting of both BaseStack and CoreStack, The Logic Units such as (5502) reside in BaseStack, and the interconnects such as (5504) and (5508) reside as part of the CoreStack. In this example, The CoreStack needs to provide the connectivity between all the Logic Units of both the 4 bit Counter (5500) and 2 bit Decoder (5501). To create the 4-bit binary counter, four Logic Units are required, such as LU1 (5502). These logic units toggle at the clock transition CK1 (5506). The output of the first Logic Unit LU1 (5508) drives the next Logic Unit(s) (5509), (5510) and (5511), as well as the 2 bit Counter block. Therefore, the CoreStack is configured to make the routing or switching to this specific interconnect feasible.

The output of LU1 (5502) and (5509) drive the 2 bit Counter Logic Units (5507), (5512), (5513) and (5514). The two bits, Q0 and Q1, are each decoded to four possible logical values, such as D0 (5505).

In this example, the following behavior would be configured inside the Logic Units (5507), (5512), (5513) and (5514), by programming the CoreStack:

$D0:=!Q0*!Q1$ $D1:=Q0*!Q1$ $D2:=!Q0*Q1$ $D3:=Q0*Q1$

The truth table would look as follows:

| Q0 | Q1 | D0 | D1 | D2 | D3 |
|----|----|----|----|----|----|
| 0  | 0  | 1  | 0  | 0  | 0  |
| 1  | 0  | 0  | 1  | 0  | 0  |
| 0  | 1  | 0  | 0  | 1  | 0  |
| 1  | 1  | 0  | 0  | 0  | 1  |

Figure 55:
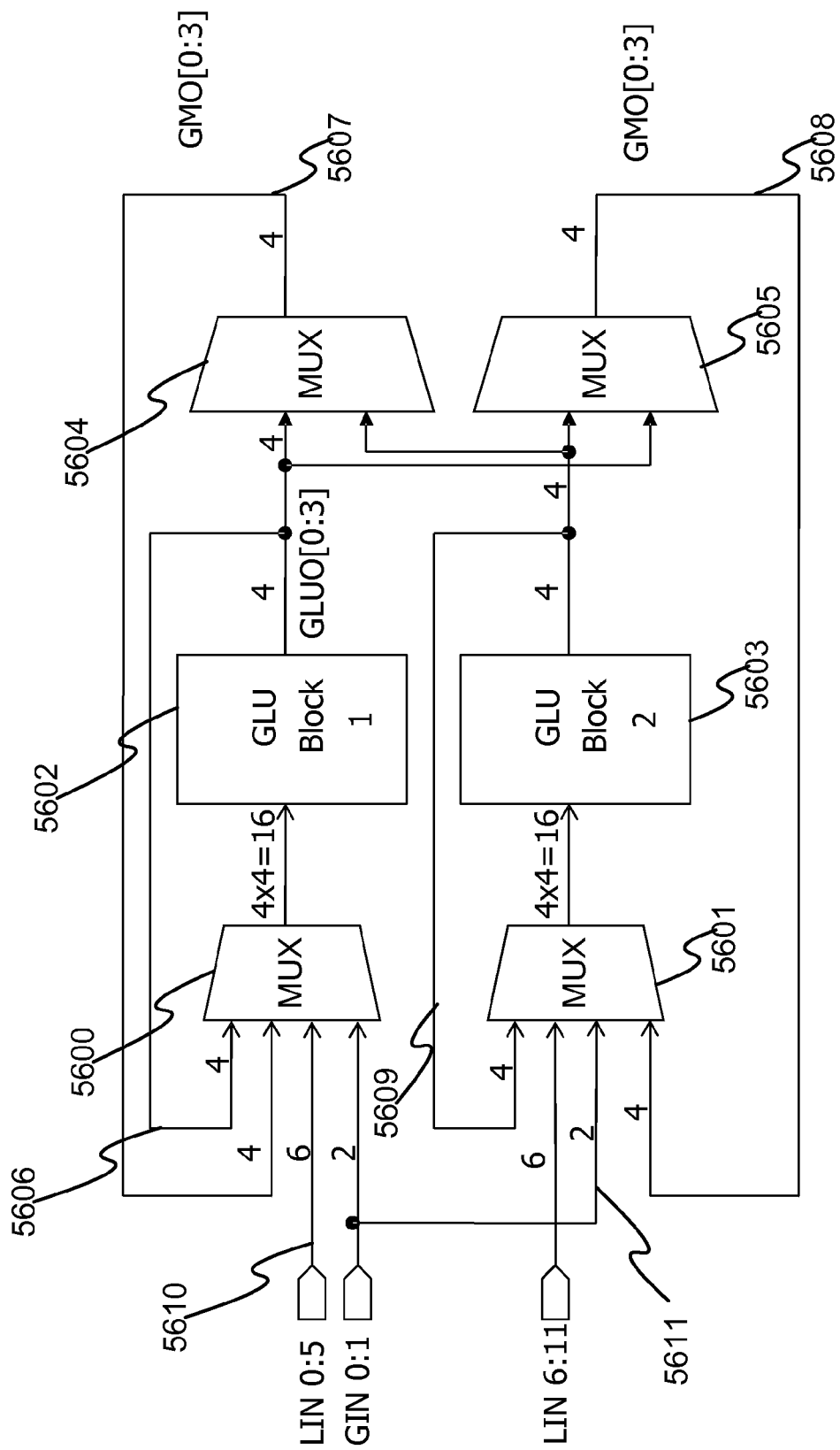
FIG. 55 shows a CoreStack implementation of Fabric interconnecting and routing HPLA device input to other internal interconnect signals. (4-bit Counter-Decoder Fabric Architecture)

FIG. 55 illustrates 4 bit Counter and 2 bit Decoder logical connectivity of BaseStack and CoreStack, combined as they are on a same die. In the context of HPLA, this figure makes up both the BaseStack and CoreStack. GLU Block 1 (5602) and GLU Block 2 (5603) are part of the BaseStack Logic Unit.

The Mux blocks (5600), (5601), (5604) and (5605) provide the interconnect functionality resident in CoreStack. This interconnect routes the input and output of the HPLA device, as well as the internal Logic Unit connectivity. In order to provide state based operation, the output of Logic Unit is fed back into the Logic Unit, via the Mux block, such as (5600).

Figure 56A:
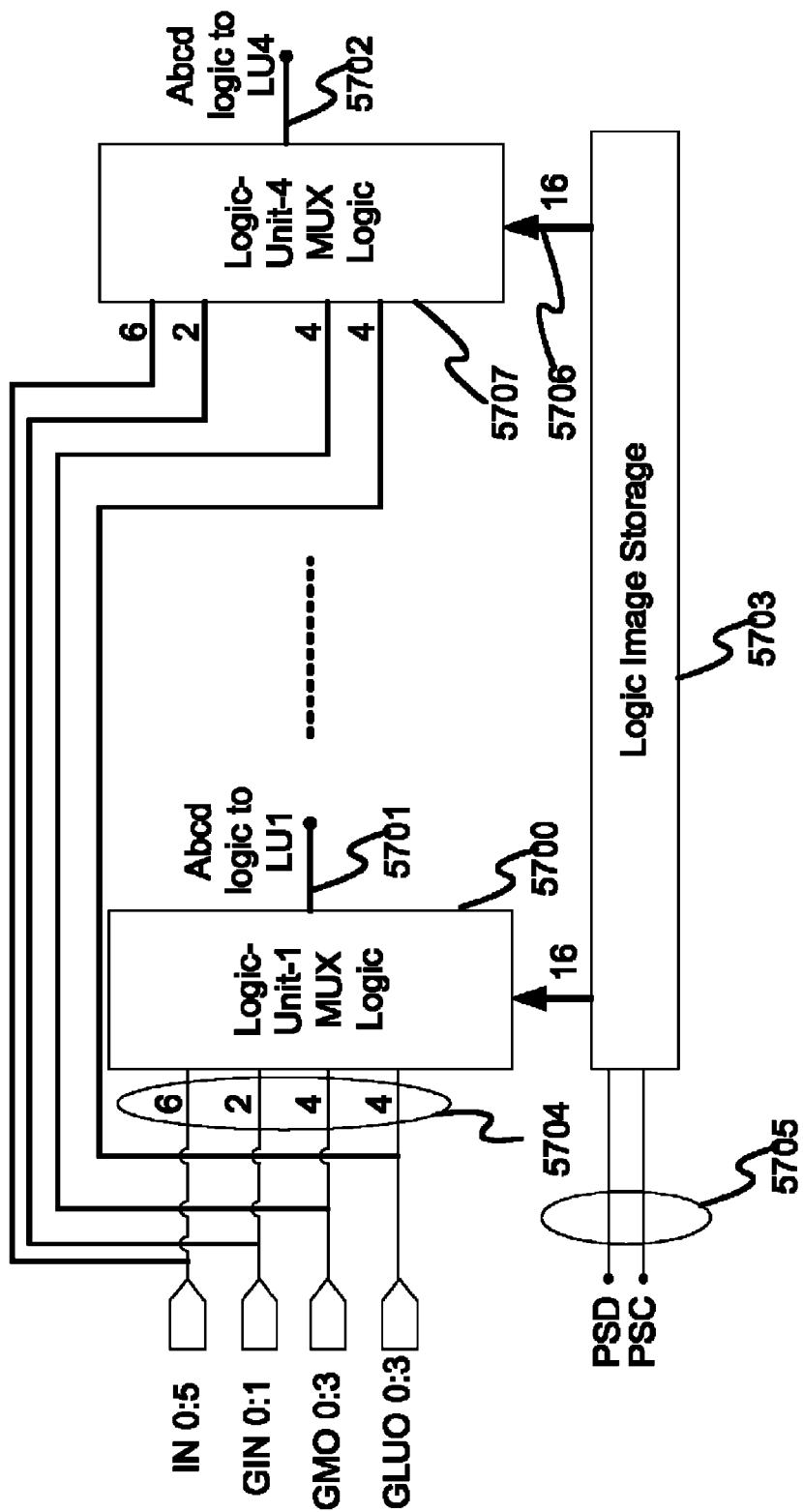
FIG. 56(a) shows a CoreStack LogicUnit Mux block diagram. (4-bit Counter-Decoder Fabric Architecture High Level)

FIG. 56A illustrates the first stage MUX logic of FIG. 55 (5600). This logic resides at the CoreStack Layer. Since, for this example, there are 4 Logic Units constructing a 4 bit counter, there are 4 Logic Unit Mux Logic (7500) through (5707). The function of Mux Logic is to select the signal feeding the Logic Unit of BaseStack.

Each Logic Unit of BaseStack takes four distinct input (5701). Signal a, b, c and d referenced as "abcd". Each signal can be driven from any of the inputs (5704), driving the Logic Unit-1 Mux Logic (5700). For example, signal "a" of (5701) can be connected (or routed or switched) from IN0 of signal (5704). Signal "d" of (5701) can be connected to GLUO3 of (5704). The programming interface to load the image in selecting such connectivity, as described, is via the programming interface (5705). The image holding the configuration for the switch state is held inside the Logic Image Storage (5703). The Logic Image Storage can be constructed with a long chain of shift-latch registers. In the example of 4 bit Counter, 16 select bits (5706) are required for each Logic Unit. Total of 64 bits required to hold the image for this Logic Unit configuration.

Signals IN0:5 and GIN0:1 of (5704) are driven from the HPLA device input. GMO 0:3 and GLU0:3 are signals that are driven from the output of Logic Units and other BaseStack blocks.

FIG. 56B illustrates the construction of Logic Unit-1 MUX Logic (5700). Each MUX Logic would contain 4 muxes (5710). Each MUX Logic output (5712) drives one of the 4 input signals of the BaseStack Logic Unit. The select signals (5715) holding the state of MUX Logic is driven from the Logic Image Storage (5703), such as (5706).

Any variations of the above teaching are also intended to be covered by this patent application.

The invention claimed is:

1. A semiconductor device structure with multiple die assembly comprising:
   a programmable semiconductor die substrate; and
   a context die substrate;
   said programmable semiconductor die substrate comprises multiple logic blocks;
   said context die substrate is flipped on said programmable semiconductor die substrate;
   said multiple logic blocks of said programmable semiconductor die substrate are electrically connected at transistor level or logic gate level, with wirebondless and bumpless electrical connections, via said context die substrate, through pads of a multiple parallel interconnect fabric;
   said context die substrate implements a custom application of said semiconductor device by using said multiple logic blocks via electrical connections through pads of said multiple parallel interconnect fabric to said multiple logic blocks;
   a programming interface;
   wherein said programming interface is located on opposite surface from flipped surface of said context die substrate, so that after connection, said context die substrate is programmed through said programming interface;

wherein said context die substrate comprises programmable switches that electrically connect pads on said context die substrate, causing electrical connection between gates and transistors, in logic blocks, on said programmable semiconductor die substrate;

wherein said programmable semiconductor die substrate comprises a platform fabric input-output;

wherein said platform fabric input-output provides input and output for specific purpose function of serializer and deserializer functional blocks, to convert data between serial data and parallel interfaces in each direction for communications;

wherein said multiple parallel interconnect fabric is located at center of said context die substrate, away from periphery of said context die substrate.

2. The semiconductor device structure as recited in claim 1, wherein said device structure comprises a core stack.

3. The semiconductor device structure as recited in claim 1, wherein said device structure comprises a base stack.

4. The semiconductor device structure as recited in claim 1, wherein said device structure comprises a redistribution or metal layer.

5. The semiconductor device structure as recited in claim 1, wherein a programming is done through an interconnect switch fabric residing on said context die substrate.

6. The semiconductor device structure as recited in claim 1, wherein a programming is done through a programming interface in said context die substrate.

7. The semiconductor device structure as recited in claim 1, wherein an interconnect switch fabric comprises pads, metal layers, vias, MUXes, switches, and redistribution layers.

8. The semiconductor device structure as recited in claim 1, wherein said device structure comprises more than one redistribution or metal layers.

9. The semiconductor device structure as recited in claim 1, wherein said device structure comprises separated fabric.

10. The semiconductor device structure as recited in claim 1, wherein said device structure comprises separated programming memory.

11. The semiconductor device structure as recited in claim 1, wherein said device structure comprises separated logic.

12. The semiconductor device structure as recited in claim 1, further comprising a customizable interconnect switch.

13. The semiconductor device structure as recited in claim 12, wherein said customizable interconnect switch is a MUX.

14. The semiconductor device structure as recited in claim 1, further comprising a field programmable interconnect switch.

15. The semiconductor device structure as recited in claim 14, wherein said field programmable interconnect switch is based on direct-bonding.

16. The semiconductor device structure as recited in claim 1, wherein each of first multiple logic blocks comprises one or more logic elements.

17. The semiconductor device structure as recited in claim 16, wherein said one or more logic elements comprise combinational logic or lookup table.

18. The semiconductor device structure as recited in claim 16, wherein said one or more logic elements comprise a clocked flip-flop.

19. The semiconductor device structure as recited in claim 1, wherein said device structure comprises a hardened redistribution layer.

* * * * *